(12) United States Patent
Yamazaki et al.

(10) Patent No.: US 7,897,483 B2
(45) Date of Patent: Mar. 1, 2011

(54) SEMICONDUCTOR DEVICE AND METHOD OF MANUFACTURING SEMICONDUCTOR DEVICE

(75) Inventors: Shunpei Yamazaki, Tokyo (JP); Hidekazu Takahashi, Tochigi (JP); Daiki Yamada, Gunma (JP); Yohei Monma, Tochigi (JP); Hiroki Adachi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 73 days.

(21) Appl. No.: 12/339,128

(22) Filed: Dec. 19, 2008

(65) Prior Publication Data

US 2009/0166896 A1 Jul. 2, 2009

(30) Foreign Application Priority Data

Dec. 28, 2007 (JP) .............................. 2007-339385

(51) Int. Cl.
*H01L 21/30* (2006.01)
(52) U.S. Cl. ........... 438/459; 257/E21.238; 257/E31.061
(58) Field of Classification Search ........... 257/E21.701, 257/55, 67, 350, 352, 353, 387, 388, 412, 257/E27.111, 458, E21.238, E31.061, 359, 257/59, 72, E29.137, E29.151, E29.278, 257/787, 323.01, E21.001; 156/235; 438/460, 438/462, 612, 613, 464, 22, 114, 455–459
See application file for complete search history.

(56) References Cited

U.S. PATENT DOCUMENTS

| 5,261,156 | A | 11/1993 | Mase et al. |
| 5,401,330 | A | 3/1995 | Saito et al. |
| 5,757,456 | A | 5/1998 | Yamazaki et al. |
| 5,834,327 | A | 11/1998 | Yamazaki et al. |
| 6,118,502 | A | 9/2000 | Yamazaki et al. |
| 6,362,866 | B1 | 3/2002 | Yamazaki et al. |
| 6,855,961 | B2 | 2/2005 | Maruyama et al. |
| 6,882,012 | B2 | 4/2005 | Yamazaki et al. |
| 6,900,873 | B2 | 5/2005 | Yamazaki et al. |

(Continued)

FOREIGN PATENT DOCUMENTS

JP 07-014880 1/1995

(Continued)

OTHER PUBLICATIONS

US 7,359,010, 04/2008, Yamazaki et al. (withdrawn)

*Primary Examiner* — Davienne Monbleau
*Assistant Examiner* — Matthew Reames
(74) *Attorney, Agent, or Firm* — Eric J. Robinson; Robinson Intellectual Property Law Office, P.C.

(57) ABSTRACT

Objects are to reduce damage to a semiconductor integrated circuit by external stress and to increase the manufacturing yield of a thinned semiconductor integrated circuit. A single crystal semiconductor layer separated from a single crystal semiconductor substrate is used for a semiconductor element included in the semiconductor integrated circuit. Moreover, a substrate which is formed into a thin shape and provided with the semiconductor integrated circuit is covered with a resin layer. In a separation step, a groove for separating a semiconductor element layer is formed in the supporting substrate, and a resin layer is provided over the supporting substrate in which the groove is formed. After that, the resin layer and the supporting substrate are cut in the groove so as to be divided into a plurality of semiconductor integrated circuits.

20 Claims, 18 Drawing Sheets

U.S. PATENT DOCUMENTS

| | | |
|---|---|---|
| 7,050,138 B1 | 5/2006 | Yamazaki et al. |
| 7,067,395 B2 | 6/2006 | Maruyama et al. |
| 7,214,555 B2 | 5/2007 | Yamazaki et al. |
| 7,271,858 B2 | 9/2007 | Yamazaki et al. |
| 7,352,044 B2 | 4/2008 | Yamada et al. |
| 7,446,843 B2 | 11/2008 | Yamazaki et al. |
| 2003/0071953 A1 | 4/2003 | Yamazaki et al. |
| 2005/0070038 A1 | 3/2005 | Yamazaki et al. |
| 2005/0121672 A1 | 6/2005 | Yamazaki et al. |
| 2005/0157242 A1 | 7/2005 | Yamazaki et al. |
| 2006/0044300 A1 | 3/2006 | Koyama et al. |
| 2006/0065960 A1 | 3/2006 | Maruyama et al. |
| 2006/0270195 A1 | 11/2006 | Yamada et al. |
| 2007/0026639 A1* | 2/2007 | Noma et al. .................. 438/459 |
| 2007/0115416 A1 | 5/2007 | Yamazaki et al. |
| 2008/0188022 A1 | 8/2008 | Yamazaki et al. |
| 2009/0004764 A1* | 1/2009 | Ohnuma et al. ................. 438/30 |
| 2009/0174023 A1 | 7/2009 | Takahashi et al. |

FOREIGN PATENT DOCUMENTS

| | | |
|---|---|---|
| JP | 08-250745 | 9/1996 |
| JP | 08-264796 | 10/1996 |
| JP | 2001-064029 | 3/2001 |
| JP | 2003-255386 | 9/2003 |

* cited by examiner

SEMICONDUCTOR DEVICE AND METHOD OF MANUFACTURING SEMICONDUCTOR DEVICE

BACKGROUND OF THE INVENTION

1. Field of the Invention

The present invention relates to semiconductor devices on which semiconductor integrated circuits are mounted and methods for manufacturing the semiconductor devices.

2. Description of the Related Art

For semiconductor devices having a matrix display function, a passive matrix structure and an active matrix structure are known. A semiconductor device having a matrix display function usually needs to be provided with a semiconductor integrated circuit for driving a pixel matrix. However, the size of a matrix is large with several hundreds of rows. Accordingly, the area of a peripheral portion is significantly large with respect to a display screen because wirings need to be led for connecting a rectangular IC package or a terminal of a semiconductor integrated circuit which is a semiconductor chip to an electric wiring over a substrate.

As a method for solving this problem, a method for mounting a semiconductor integrated circuit with which the area of a peripheral portion can further be reduced is disclosed (e.g., see Patent Document 1: Japanese Published Patent Application No. H7-14880, Patent Document 2: Japanese Published Patent Application No. H8-250745, and Patent Document 3: Japanese Published Patent Application No. H8-264796). For example, in Patent Document 1, a method is disclosed in which a semiconductor integrated circuit is formed over an elongated substrate (referred to as a "stick" or a "stick crystal") which has almost the same length as one side of a pixel matrix and connected to a terminal portion.

SUMMARY OF THE INVENTION

However, in a process of manufacturing a semiconductor device, external stress such as pressure is applied in some cases when a semiconductor integrated circuit is mounted. The semiconductor integrated circuit might be damaged by such external stress.

In view of the foregoing problems, one object is to reduce external damage to a semiconductor integrated circuit by external stress. Another object is to thin a substrate to be provided with a semiconductor integrated circuit. Another object is to increase the manufacturing yield of a thinned semiconductor integrated circuit. Still another object is to reduce manufacturing costs of a thinned semiconductor integrated circuit.

In the present invention, a semiconductor integrated circuit including a semiconductor element layer which is separately formed over a supporting substrate is mounted as a driver circuit (a driver) on a substrate having an insulating surface. The semiconductor integrated circuit is electrically connected to a pixel portion formed over the substrate having the insulating surface and functions as the driver circuit. A single crystal semiconductor layer separated from a single crystal semiconductor substrate is used for a semiconductor element included in the semiconductor integrated circuit.

In the present invention, by separating the supporting substrate, a plurality of semiconductor integrated circuits with chip shapes (or elongated stick shapes) are taken out. In a separation method of the present invention, first, the supporting substrate is processed to be thin; thus, the process time for the separation is reduced, and abrasion of a processing means such as a dicer used for the separation is reduced. Moreover, a separation step is not performed at one time. First, a groove for separating a semiconductor element layer is formed in the supporting substrate, and a resin layer is provided over the supporting substrate in which the groove is formed. After that, the resin layer and the supporting substrate are cut in the groove so as to be divided (cut) into a plurality of semiconductor integrated circuits. In the present invention, a groove also refers to a groove portion including a recessed portion around the groove.

The width of a cut surface where the resin layer and the supporting substrate are cut is made narrower than the width of the groove, whereby the resin layer formed in the groove can be left on a side surface of the supporting substrate. Accordingly, in the semiconductor integrated circuit, a surface where the semiconductor element layer is not provided and part of the side surface are covered with the resin layer.

Accordingly, in the semiconductor integrated circuit included in a semiconductor device of the present invention, the side surface of the supporting substrate has a step and the width of the substrate in a portion below the step is smaller than that in a portion above the step. Such a shape of the substrate can be referred to as an upside-down T shape. Moreover, a cross-sectional shape of the supporting substrate is a trapezoid with a stepped side surface. In the trapezoid with the stepped side surface, an upper portion is thicker than a lower portion. The upper portion of the trapezoid is curved toward the lower portion depending on the shape of the groove. The side surface of the supporting substrate, with which the resin layer is in contact, has a curved surface which spreads toward the bottom. Further, a bottom surface and a top surface of the substrate are quadrangular, and the area of the bottom surface is larger than the area of the top surface.

As described above, the semiconductor device of the present invention has a complicated shape, whereby top and bottom sides of the semiconductor device can be easily distinguished, and mistakes also in automatic operation by a machine can be reduced.

The semiconductor integrated circuit can be mounted on the substrate having the insulating surface, which is provided with the pixel portion, by a COG (chip on glass) method or a TAB (tape automated bonding) method.

Since the substrate which is formed into a thin shape and provided with the semiconductor integrated circuit is covered with the resin layer, the substrate is easily treated in a manufacturing process, and defects such as breakage hardly occur. Accordingly, a thinner and higher-performance semiconductor device can be manufactured with high yield.

In the present invention, a semiconductor device having a display function, on which the semiconductor integrated circuit is mounted as a driver circuit (a driver), may be a passive matrix device or an active matrix device. Moreover, the semiconductor driver circuit may be mounted as a driver circuit of a memory element, so that a semiconductor device having a memory function can be manufactured.

One aspect of the present invention is a semiconductor device including a semiconductor integrated circuit provided with a semiconductor element layer including a single crystal semiconductor layer provided over a supporting substrate. A surface of the supporting substrate, which is opposite to a surface on which the semiconductor element layer is formed, and part of a side surface of the supporting substrate are covered with a resin layer.

Another aspect of the present invention is a semiconductor device including a pixel portion over a substrate having an insulating surface; and a semiconductor integrated circuit which is electrically connected to the pixel portion and mounted on the substrate having the insulating surface. The semiconductor integrated circuit includes a semiconductor element layer provided over a supporting substrate. A surface of the supporting substrate, which is opposite to a surface on which the semiconductor element layer is formed, and part of a side surface of the supporting substrate are covered with a resin layer. The supporting substrate is made thinner by grinding treatment and polishing treatment, whereby the supporting substrate can be made thinner than the substrate having the insulating surface.

Another aspect of the present invention is a method for manufacturing a semiconductor device, including the steps of adding an ion from a surface of a single crystal semiconductor substrate to form an embrittlement layer at a predetermined depth from the surface of the single crystal semiconductor substrate, forming an insulating layer over one of the surface of the single crystal semiconductor substrate and a supporting substrate, performing heat treatment for generating a crack in the embrittlement layer and separating the single crystal semiconductor substrate at the embrittlement layer in a state where the single crystal semiconductor substrate and the supporting substrate overlap with each other with the insulating layer interposed therebetween so as to form a single crystal semiconductor layer over the supporting substrate from the single crystal semiconductor substrate, forming a plurality of semiconductor element layers including the single crystal semiconductor layer over the supporting substrate, reducing a thickness of the supporting substrate, forming a groove between the plurality of semiconductor element layers of the supporting substrate, forming a resin layer over the supporting substrate in which the groove is formed, and cutting the groove of the supporting substrate and the resin layer to form a plurality of semiconductor integrated circuits. Then, for example, the semiconductor integrated circuit is mounted on a substrate which has an insulating surface and is provided with a pixel portion (e.g., a glass substrate).

When the supporting substrate in which the groove is formed and the resin layer are cut, they can be cut from the supporting substrate side or the resin layer side. In the case where an alignment marker is formed on the supporting substrate, precision of a place to be cut can be improved when the supporting substrate and the resin layer are cut from the supporting substrate side by a cutting means such as a dicer.

According to the present invention, a thin and high-performance semiconductor device can be manufactured with high yield.

Further, a semiconductor device which is easily treated and has high reliability even it is thin can be provided.

DETAILED DESCRIPTION OF THE INVENTION

Figure 1A:
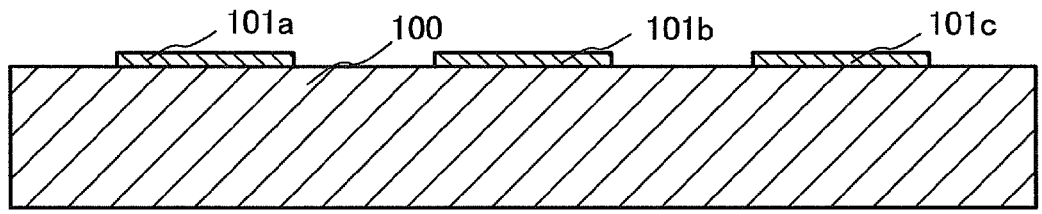
FIGS. 1A to 1F illustrate a method for manufacturing a semiconductor integrated circuit of the present invention.
Figure 1B:
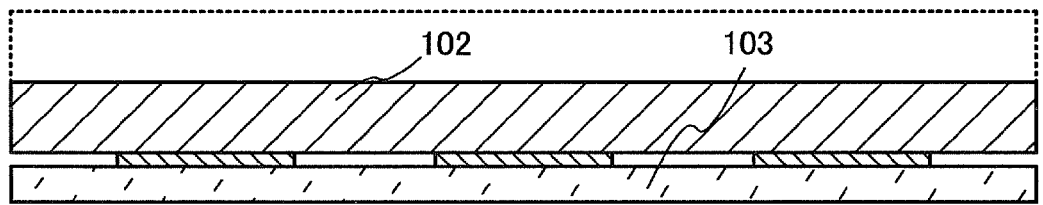
Figure 1C:
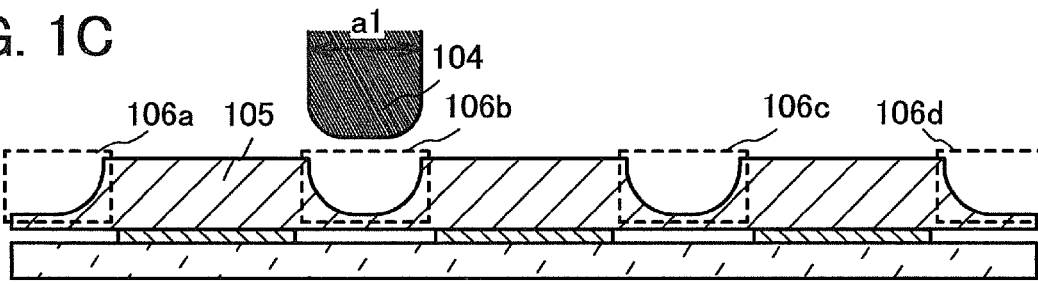

Embodiment modes of the present invention will be described in detail with reference to the accompanying drawings. However, the present invention is not limited to the following description, and it is easily understood by those skilled in the art that modes and details can be variously changed without departing from the spirit and the scope of the present invention. Therefore, the present invention is not construed as being limited to the description of the embodiment modes. Note that in structures of the present invention described below, the same portions or portions having similar functions are denoted by the same reference numerals in different drawings, and the description is not repeated.

Embodiment Mode 1

In this embodiment mode, a semiconductor device for realizing reduction in thickness and size and a method for manufacturing the semiconductor device with high yield are described in detail with reference to FIGS. 1A to 1F, FIG. 2, FIGS. 3A to 3C, FIGS. 4A to 4D, and FIGS. 5A to 5C.

In this embodiment mode, a semiconductor integrated circuit including a semiconductor element layer which is separately formed over a supporting substrate is mounted as a driver circuit (a driver) on a substrate having an insulating surface. The semiconductor integrated circuit is electrically connected to a pixel portion formed over the substrate having the insulating surface and functions as the driver circuit. A single crystal semiconductor layer separated from a single crystal semiconductor substrate is used for a semiconductor element included in the semiconductor integrated circuit.

FIG. 1A illustrates semiconductor element layers 101a, 101b, and 101c which are provided over a supporting substrate 100 and includes a single crystal semiconductor layer. The single crystal semiconductor layer included in the semiconductor element layers 101a, 101b, and 101c is separated from a single crystal semiconductor substrate.

Next, a step of reducing the thickness of the supporting substrate 100 by grinding treatment and polishing treatment is performed. The side where the semiconductor element layers 101a, 101b, and 101c are formed is made to face a fixing tape 103 for fixing the supporting substrate 100 in the step so that the supporting substrate 100 is fixed, and the supporting substrate 100 is processed into a thinner supporting substrate 102 (see FIG. 1B). When the supporting substrate 100 is a glass substrate with a thickness of 0.5 mm, the supporting substrate 102 is preferably thinned to approximately 0.25 mm to 0.3 mm, which is half the thickness of the supporting substrate 100. By reducing the thickness of the supporting substrate, the process time for separating the supporting substrate can be reduced, and abrasion of a processing means such as a dicer used for the separation can be reduced. Grinding treatment and polishing treatment can be preferably used in combination. In this embodiment mode, a substrate is ground by a grinder and after that, a surface is planarized with polishing treatment by a polisher. As the polishing treatment, chemical mechanical polishing may be performed.

In the present invention, by separating the supporting substrate, a plurality of semiconductor integrated circuits with chip shapes (or elongated stick shapes) are taken out. A separation step is not performed at one time. First, grooves 106a, 106b, 106c, and 106d for separating the semiconductor element layers 101a, 101b, and 101c are formed in the supporting substrate 102 by a dicing blade of a dicer 104 (see FIG. 1C). When forming the grooves 106a, 106b, and 106c in a supporting substrate 105, the supporting substrate 105 is intentionally left. The thickness of the supporting substrate 105 which is left is approximately 30 μm to 50 μm.

Figure 1D:
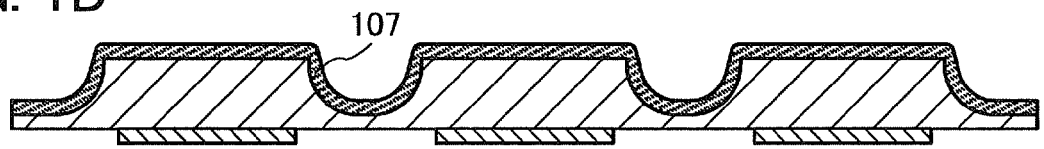

Next, a resin layer 107 is formed over the supporting substrate 105 in which the grooves 106a, 106b, 106c, and 106d are formed (see FIG. 1D). The resin layer 107 has a thickness of 1 μm to 20 μm. As a material for the resin layer, a resin material which can withstand heat temperature when heating treatment is used in a step after the resin layer is formed (e.g., at the time of mounting a semiconductor integrated circuit) is used.

By forming the resin layer functioning as a shock absorber, a semiconductor integrated circuit can better withstand stress. For example, even when a pressure of approximately 20 N is applied, a semiconductor integrated circuit provided with the resin layer of the present invention can withstand the pressure without damage.

For the resin layer, a resin material such as a vinyl resin, an epoxy resin, a phenol resin, a novolac resin, an acrylic resin, a melamine resin, a urethane resin, or a siloxane resin can be used. As a method for forming the resin layer, an application method such as a spin coating method can be used. Alternatively, a droplet discharging method, a printing method, a dipping method, a dispenser method, a brush coating method, a spraying method, a flow coating method, or the like can be used.

After that, the resin layer 107 and the supporting substrate 105 are cut in the grooves 106a, 106b, 106c, and 106d so as to be divided (cut) into a plurality of semiconductor integrated circuits. In this embodiment mode, the supporting substrate 105 and the resin layer 107 are fixed to a fixing tape 111, and the supporting substrate 105 which are left under the grooves 106a, 106b, 106c, and 106d and the resin layer 107 are cut from the supporting substrate 105 side by a dicer 108. By the dicer 108, the supporting substrate 105 and the resin layer 107 are cut to be supporting substrates 109a, 109b, and 109c and resin layers 110a, 110b, and 110c (see FIG. 1E). In this embodiment mode, a dicing tape is used as the fixing tapes 103 and 111.

When the supporting substrate 105 in which the grooves are formed and the resin layer 107 are cut, they can be cut from the supporting substrate 105 side or the resin layer 107 side. In the case where an alignment marker is formed on the supporting substrate 105, precision of a place to be cut can be improved when the supporting substrate 105 and the resin layer 107 are cut from the supporting substrate 105 side by a cutting means such as a dicer.

Figure 1E:
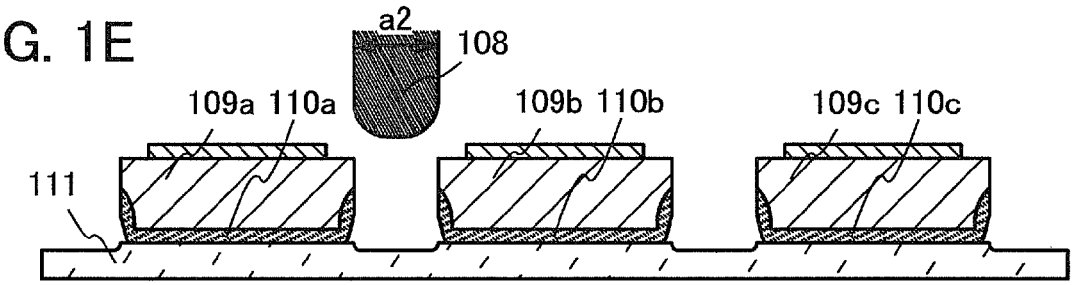
Figure 1F:
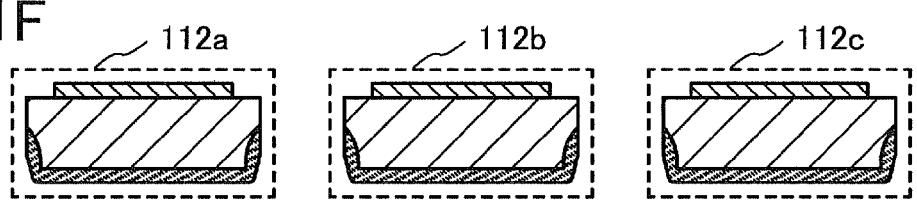

Through the above steps, semiconductor integrated circuits 112a, 112b, and 112c can be formed (see FIG. 1F). The width of a cut surface where the resin layer 107 and the supporting substrate 105 are cut is made narrower than the width of the groove, whereby the resin layer formed in the groove can be left on a side surface of the supporting substrate. In this embodiment mode, the width of the dicer 104 and the width of the dicer 108 each correspond to the thickness of a dicing blade by which a region to be processed (by the dicer) is determined.

The width of the groove can be controlled by the width a1 of the dicing blade of the dicer 104, and the width of the cut surface can be controlled by the width a2 of the dicing blade of the dicer 108. Accordingly, the width a2 of the dicing blade of the dicer 108 may be made narrower than the width a1 of the dicing blade of the dicer 104. For example, in this embodiment mode, the width a1 of the dicing blade of the dicer 104 is 0.16 mm, and the width a2 of the dicing blade of the dicer 108 is 0.1 mm.

Accordingly, in the semiconductor integrated circuits 112a, 112b, and 112c, surfaces where the semiconductor element layers 101a, 101b, and 101c are not provided and part of side surfaces are covered with the resin layers 110a, 110b, and 110c, respectively.

The shape of the groove formed in the supporting substrate depends on a processing means. In this embodiment mode, the shape of the slightly rounded dicing blade of the dicer 104 reflects the shape of the grooves so that the grooves 106a, 106b, and 106c also have a rounded shape (a shape with a curvature) in the cross section of FIG. 1C. When the shape of the dicing blade is rectangular, the shape of the groove is also rectangular, whereby an edge portion of the supporting substrate in the semiconductor integrated circuit after the separation can also have a rectangular shape.

Figure 18A:
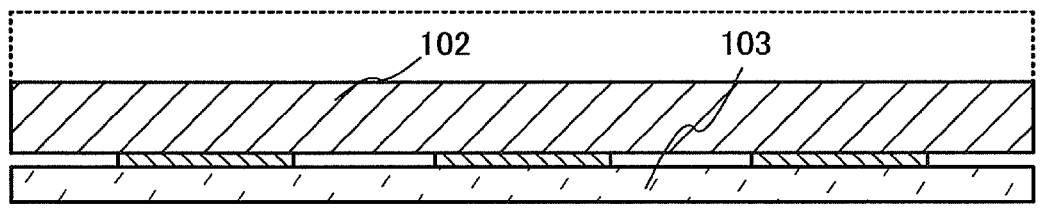
FIGS. 18A to 18E illustrate a method for manufacturing a semiconductor integrated circuit of the present invention.

FIGS. 18A to 18E illustrate an example of processing with a rectangular dicing blade. FIG. 18A corresponds to FIG. 1B. The supporting substrate 102 provided with the semiconductor element layers 101a, 101b, and 101c is ground and polished over the fixing tape 103.

Figure 18B:
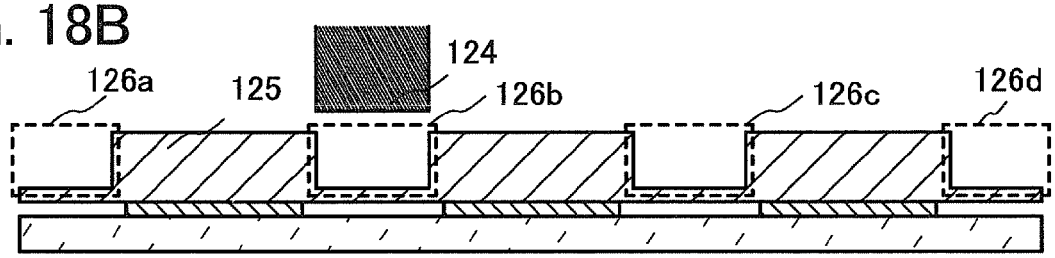

Grooves 126a, 126b, 126c, and 126d for separating the semiconductor element layers 101a, 101b, and 101c are formed in the supporting substrate 102 by a dicer 124 (see FIG. 18B). A rectangular dicing blade is used for the dicer 124, so that the grooves 126a, 126b, 126c, and 126d in a supporting substrate 125 are rectangular in the cross-sectional view.

Figure 18C:
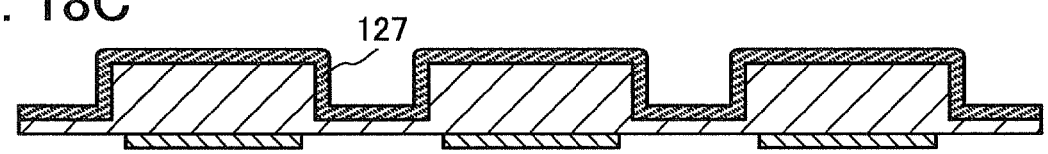
Figure 18D:
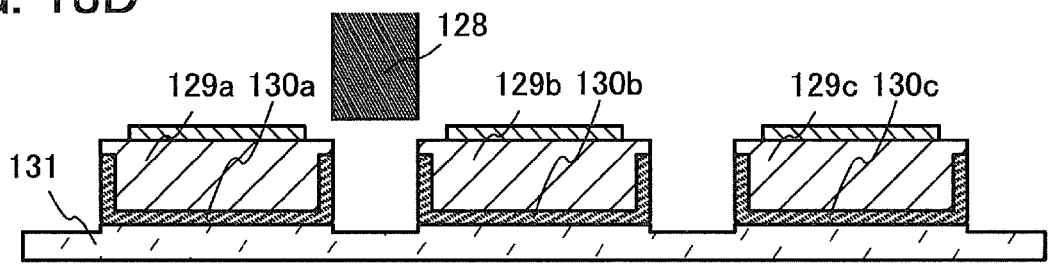

Next, a resin layer 127 is formed over the supporting substrate 125 in which the grooves 126a, 126b, 126c, and 126d are formed (see FIG. 18C).

After that, the resin layer 127 and the supporting substrate 125 are cut in the grooves 126a, 126b, 126c, and 126d so as to be divided (cut) into a plurality of semiconductor integrated circuits. In this embodiment mode, the supporting substrate 125 and the resin layer 127 are fixed to a fixing tape 131, and the supporting substrate 125 which are left under the grooves 126a, 126b, 126c, and 126d and the resin layer 127 are cut from the supporting substrate 125 side by a dicer 128. By the dicer 128, the supporting substrate 125 and the resin layer 127 are cut to be supporting substrates 129a, 129b, and 129c and resin layers 130a, 130b, and 130c (see FIG. 18D).

Figure 18E:
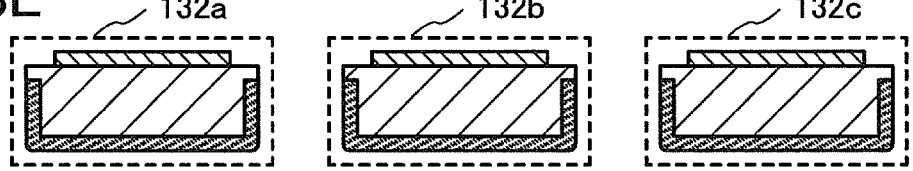

Through the above steps, semiconductor integrated circuits 132a, 132b, and 132c can be formed (see FIG. 18E). The shapes of the supporting substrate in the semiconductor integrated circuits 132a, 132b, and 132c are reflected by the shapes of the rectangular grooves 126a, 126b, 126c, and 126d, so that the semiconductor integrated circuits 132a, 132b, and 132c have a step on a side surface in the cross-sectional view.

Further, in order to increase the coverage at an edge portion of the substrate which is thicker than the resin layer, the resin layer is preferably made thicker. The resin layer may have a stacked-layer structure so as to be thick. The shape of a semiconductor integrated circuit to be completed can be freely changed (vary) depending on the structure and the thickness of the resin layer or a place to be cut. FIGS. 17A to 17D illustrate an example where resin layers are stacked.

Figure 17A:
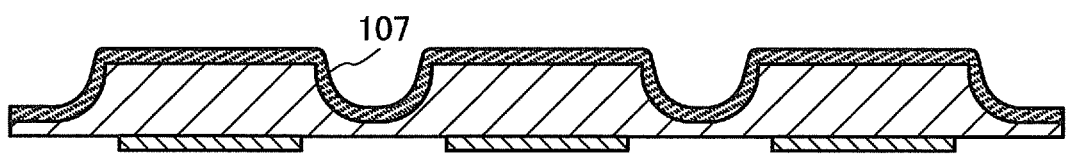
FIGS. 17A to 17D illustrate a method for manufacturing a semiconductor integrated circuit of the present invention.
Figure 17B:
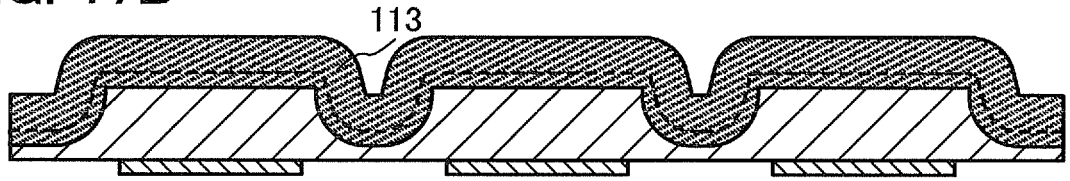
Figure 17C:
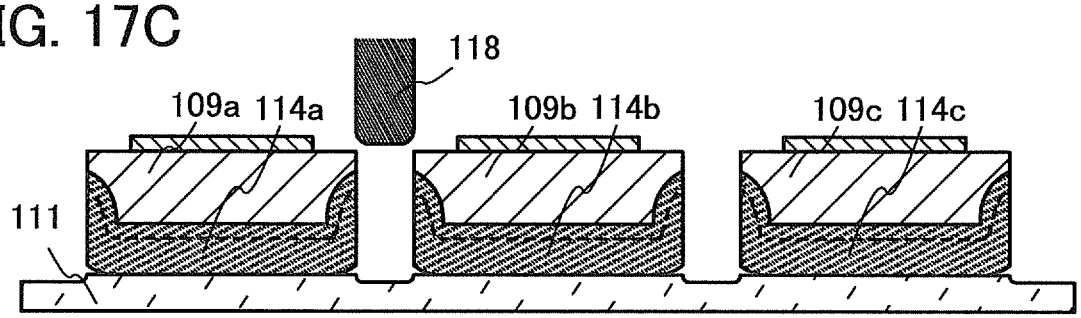
Figure 17D:
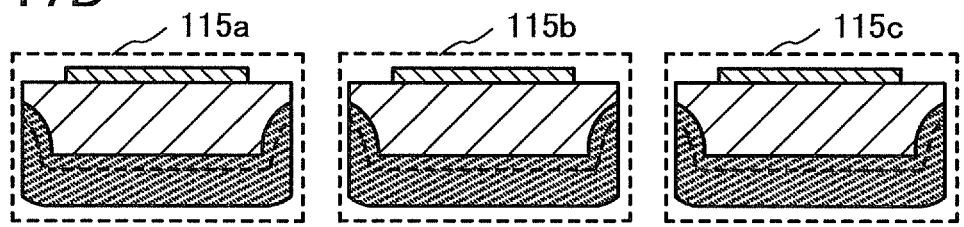

FIG. 17A corresponds to FIG. 1D. The resin layer 107 is formed on a surface of the supporting substrate 105, which is opposite to a surface where the semiconductor element layers 101a, 101b, and 101c are provided. Next, another resin layer is formed over the resin layer 107 so that a resin layer 113 is formed. In this embodiment mode, a resin layer of the same material as the resin layer 107 is stacked (see FIG. 17B). The resin layer 113 and the supporting substrate 105 which are fixed by the fixing tape 111 as in FIG. 1E are cut by a dicer 118 so as to be supporting substrates 109a, 109b, and 109c and resin layers 114a, 114b, and 114c (see FIG. 17C). The resin layers in semiconductor integrated circuits 115a, 115b, and 115c which are formed through the above steps are formed thicker than the resin layers in FIG. 1F, whereby edge portions of the supporting substrates 109a, 109b, and 109c and edge portions of the resin layers 114a, 114b, and 114c are aligned with each other in the semiconductor integrated circuits 115a, 115b, and 115c, respectively (see FIG. 17D).

When semiconductor integrated circuits are divided by a dicer with a narrow dicing blade, more resin can be left in groove regions in a supporting substrate for the completed semiconductor integrated circuit. By stacking a resin layer functioning as a shock absorber, a semiconductor integrated circuit can better withstand stress.

In addition, in the present invention, a groove is formed and a resin layer is formed over the groove, so that the resin layer can be formed thick on a bottom surface of the groove. Further, after the resin layer is formed, the resin layer and a supporting substrate are stacked and cut, so that an edge portion of the resin layer and an edge portion of the supporting substrate are aligned with each other on a side surface. Since the edge portion on the side of the supporting substrate, which is opposite to a surface where the semiconductor element layers are provided, on the side surface is not exposed, damage or chipping of the edge portion of the supporting substrate can be prevented. Moreover, when the resin layer is formed thick by stacking layers, a distance between the edge portion of the supporting substrate and the edge portion of the resin layer can be increased on a side surface of the semiconductor integrated circuit, whereby damage given to the edge portion of the supporting substrate can further be reduced.

A semiconductor integrated circuit can be mounted on a substrate having an insulating surface, which is provided with a pixel portion, by a COG (chip on glass) method or a TAB (tape automated bonding) method. The semiconductor integrated circuit can withstand heat in heat treatment which is performed when the semiconductor integrated circuit is mounted with solder or an anisotropic conductive film because the resin layer is not exposed to the semiconductor element layer side as described in this embodiment mode.

Figure 2:
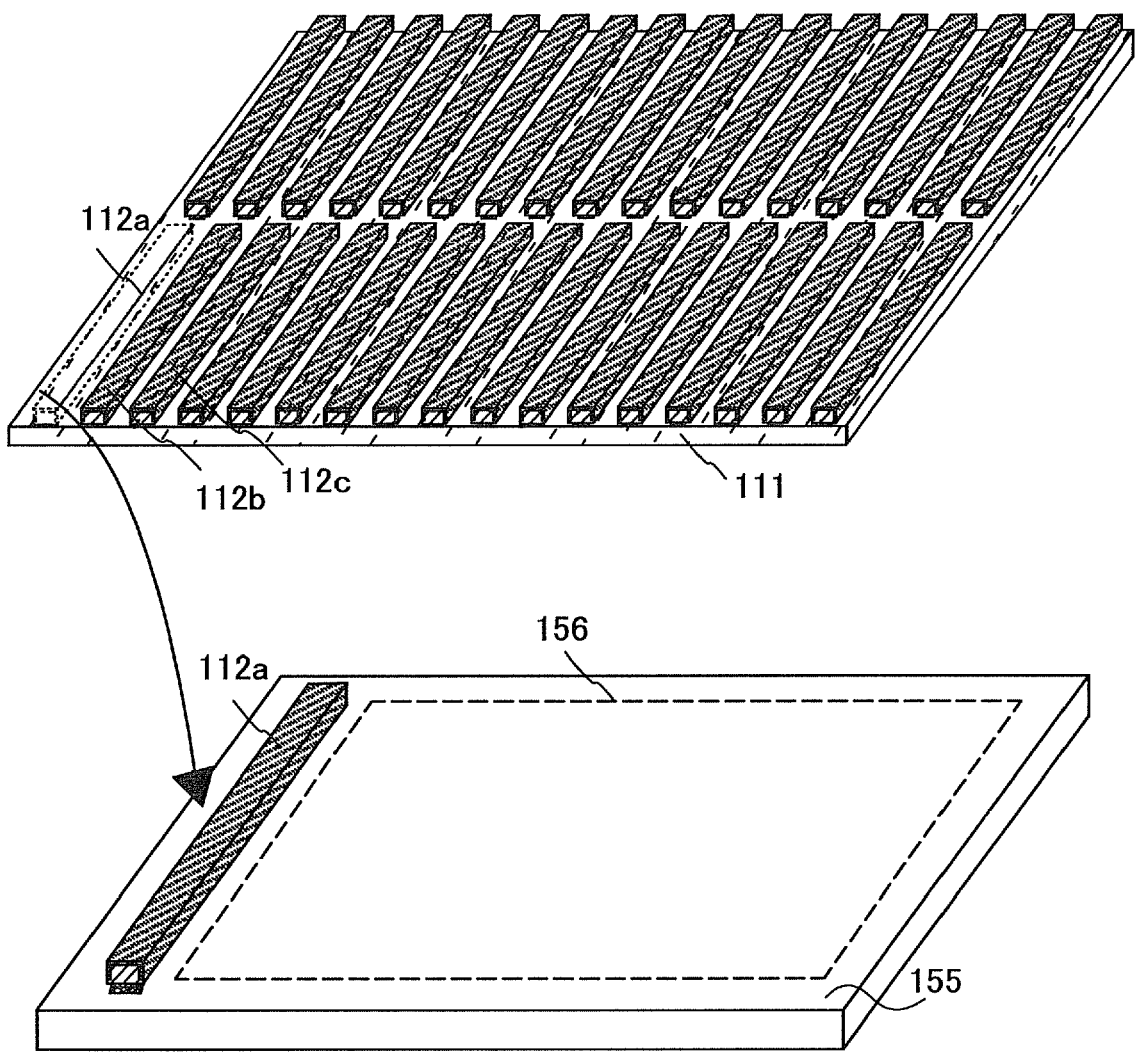
FIG. 2 illustrates a method for manufacturing a semiconductor device of the present invention.

FIG. 2 illustrates an example where the semiconductor integrated circuit 112a formed over the fixing tape 111 is mounted on a substrate 155 having an insulating surface, which is provided with a pixel portion 156, by a COG method.

In the semiconductor integrated circuit 112a, 112b, and 112c, the supporting substrates 109a, 109b, and 109c which are formed into a thin shape are covered with the resin layers 110a, 110b, and 110c, whereby the supporting substrates are easily treated in a manufacturing process, and defects such as breakage hardly occur. Accordingly, a thinner and higher-performance semiconductor device can be manufactured with high yield.

In the semiconductor integrated circuit 112a, 112b, and 112c, a conductive layer is provided on a surface of the semiconductor element layer as a terminal for performing electrical connection when the semiconductor integrated circuit is mounted on the substrate.

For example, when the conductive layer is formed by a screen printing method, the conductive layer can be provided by selectively printing a conductive paste in which conductive particles having a particle size of several nanometers to several tens of micrometers are dissolved or dispersed in an organic resin. As the conductive particle, at least one of metal particles of silver (Ag), gold (Au), copper (Cu), nickel (Ni), platinum (Pt), palladium (Pd), tantalum (Ta), molybdenum (Mo), titanium (Ti), and the like or fine particles of silver halide can be used. Moreover, as the organic resin included in the conductive paste, one or more selected from organic resins functioning as a binder of metal particles, a solvent, a dispersant, or a coating material can be used. Typically, an organic resin such as an epoxy resin and a silicone resin can be employed. Further, when the conductive layer is formed, baking is preferably performed after the conductive paste is applied. Alternatively, fine particles containing solder or lead-free solder as its main component may be used.

In addition, as a structure of a connection portion of a semiconductor integrated circuit and a wiring which is electrically connected to an element provided in a pixel portion, the wiring over a substrate and a bump which is a conductive projection provided for an electrode in the semiconductor integrated circuit may be made in contact with each other, and the substrate and the semiconductor integrated circuit may be fixed with a resin. Alternatively, it is possible that a resin in which conductive particles are dispersed is provided between the wiring over the substrate and an electrode terminal of the semiconductor integrated circuit; and the semiconductor integrated circuit and the wiring over the substrate are connected to each other with the conductive particles and are bonded and fixed to each other with an organic resin in which conductive particles are dispersed. As the resin used for bonding, a light curable resin, a thermosetting resin, a resin which is naturally cured, or the like can be used.

In a conventional semiconductor device, six to ten driver ICs are necessary for scan drivers and signal drivers. Accordingly, many wirings are complicatedly formed around the semiconductor device. However, by mounting a stick-shaped driver illustrated in this embodiment mode on a semiconductor device, the area of an outer edge portion of the semiconductor device can be extremely reduced, and the design is refined.

In addition, the same material can be used for a substrate having an insulating surface, which is provided with a pixel portion, and a supporting substrate of a semiconductor integrated circuit, whereby defects such as separation caused due to difference in thermal expansion coefficients in subsequent heat treatment can be prevented. Further, a conventional driver IC is opaque, and the size is limited. In contrast, a semiconductor integrated circuit using a light-transmitting glass substrate is substantially transparent (although a circuit portion is opaque, it cannot be distinguished with the naked eye), and the size can be set relatively freely.

Figure 3A:
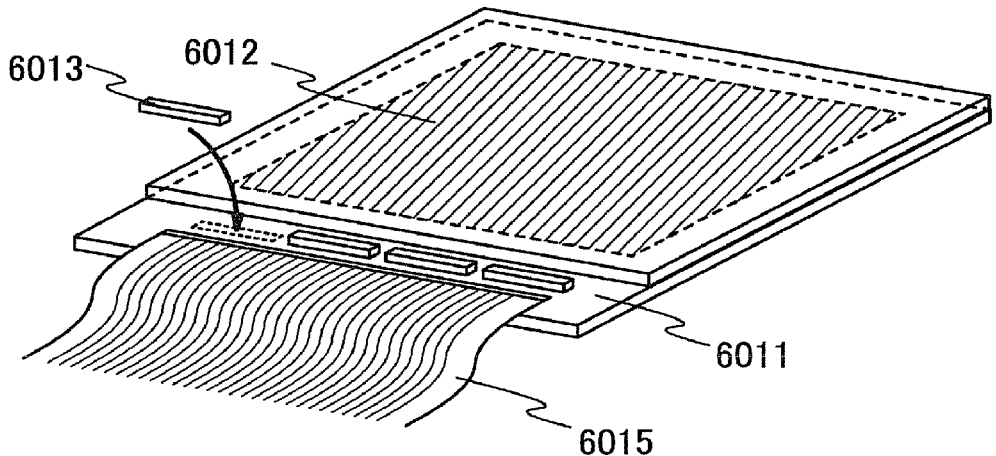
FIGS. 3A to 3C each illustrate a semiconductor device of the present invention.
Figure 3B:
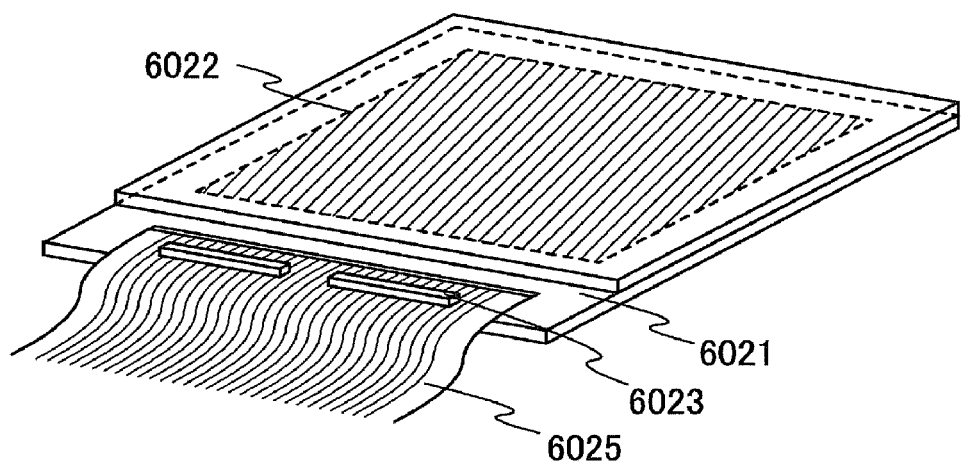
Figure 3C:
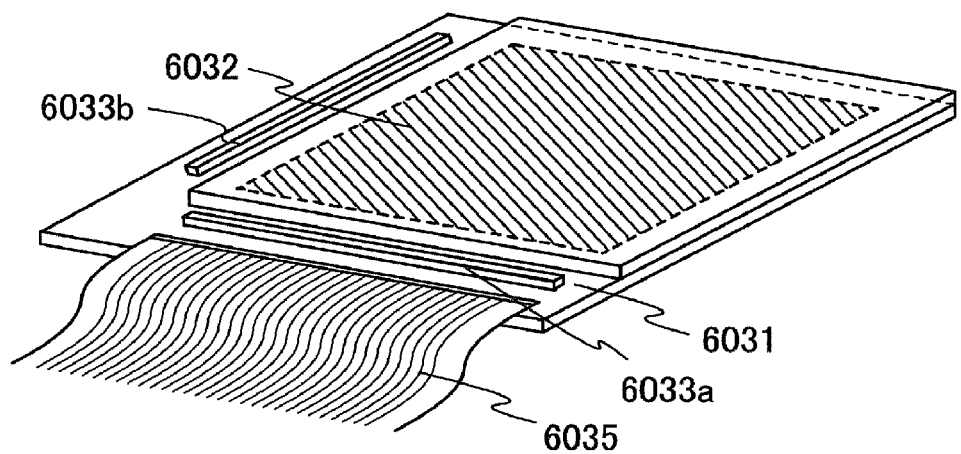

FIGS. 3A to 3C illustrate other examples of mounting a semiconductor integrated circuit in a semiconductor device of the present invention.

As illustrated in FIG. 3A, separately formed semiconductor integrated circuits 6013 which are driver ICs may be mounted on a substrate 6011 provided with a pixel portion 6012 by a COG (chip on glass) method. Alternatively, a semiconductor integrated circuit 6023 may be mounted so as to be electrically connected to a pixel portion 6022 formed over a substrate 6021 by a TAB (tape automated bonding) method. In FIGS. 3A to 3C, the semiconductor integrated circuits 6013 and 6023 are connected to FPCs (flexible printed circuits) 6015 and 6025, respectively; and semiconductor integrated circuit 6033a is connected to an FPC 6035. Note that semiconductor integrated circuits 6033a and 6033b are electrically connected, although not shown in FIG. 3C.

The shape and the position of a semiconductor integrated circuit of the present invention can be freely set. Accordingly, a plurality of short semiconductor integrated circuits 6013 may be provided so as to be adjacent to one side of the substrate 6011 as illustrated in FIG. 3A. Alternatively, the long semiconductor integrated circuits 6033a and 6033b may be provided on two respective sides as illustrated in FIG. 3C.

Further, part of a peripheral driver circuit may be formed directly on a substrate. For example, a scan line side driver circuit can be formed over a substrate and a signal line side driver circuit can be separately mounted as a semiconductor integrated circuit.

For a semiconductor element included in the semiconductor integrated circuit, a single crystal semiconductor layer separated from a single crystal semiconductor substrate is used. Further, a substrate which is formed into a thin shape and provided with the semiconductor integrated circuit is covered with a resin layer, whereby the substrate is easily treated in a manufacturing process, and defects such as breakage hardly occur. Accordingly, a thinner and higher-performance semiconductor device can be manufactured with high yield.

Note that there is no particular limitation on a connection method of a substrate which is separately formed, and a COG method, a wire bonding method, a TAB method, or the like can be used. Further, a connection position is not limited to the position illustrated in FIGS. 3A to 3C as long as electrical connection is possible. Moreover, a controller, a CPU, a memory, or the like may be separately formed and connected to the substrate.

Note that a circuit included in a semiconductor integrated circuit used in the present invention is not limited to including only a shift register and an analog switch. In addition to the shift register and the analog switch, another circuit such as a buffer, a level shifter, or a source follower may be included. Further, the shift register and the analog switch are not necessarily provided. For example, a different circuit such as a decoder circuit by which a signal line can be selected may be used instead of the shift register, or a latch or the like may be used instead of the analog switch.

In the present invention, a semiconductor device having a display function, on which the semiconductor integrated circuit is mounted as a driver circuit (a driver), may be a passive matrix device or an active matrix device. Moreover, the semiconductor driver circuit may be mounted as a driver circuit of a memory element, so that a semiconductor device having a memory function can be manufactured.

Further, in the present invention, an amorphous semiconductor, a microcrystalline semiconductor, a polycrystalline semiconductor, or the like can be used for a semiconductor layer included in a transistor which is formed directly on a substrate provided with a pixel portion.

A method where a single crystal semiconductor layer made from a single crystal semiconductor substrate is provided over a supporting substrate which is a substrate having an insulating surface and a semiconductor element included in a semiconductor integrated circuit is formed is described below with reference to FIGS. 4A to 4D and FIGS. 5A to 5C.

Figure 4A:
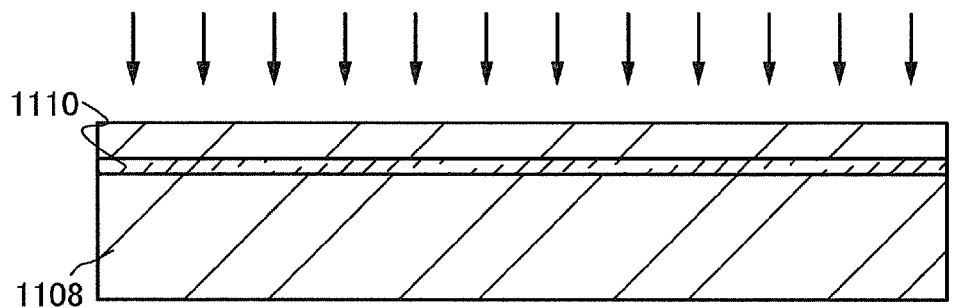
FIGS. 4A to 4D illustrate a method for manufacturing a semiconductor integrated circuit of the present invention.

A single crystal semiconductor substrate 1108 illustrated in FIG. 4A is cleaned, and ions accelerated by an electric field are added to reach a predetermined depth from the surface to form an embrittlement layer 1110. Ion addition is performed in consideration of the thickness of a single crystal semiconductor layer which is to be transferred to a supporting substrate. Accelerating voltage in adding the ions is set in consideration of such a thickness, so that the ions are added to the single crystal semiconductor substrate 1108. In the present invention, a region which is embrittled by adding ions to a single crystal semiconductor substrate so that the region includes microvoids due to the ions is referred to as an embrittlement layer.

As the single crystal semiconductor substrate 1108, a commercial single crystal semiconductor substrate can be used. For example, a single crystal semiconductor substrate formed of a group IV element, such as a single crystal silicon substrate, a single crystal germanium substrate, or a single crystal silicon germanium substrate can be used. Alternatively, a compound semiconductor substrate formed of gallium arsenide, indium phosphide, or the like can be used. As the semiconductor substrate, a polycrystalline semiconductor substrate may be used. It is needless to say that the single crystal semiconductor substrate is not limited to a circular wafer, and single crystal semiconductor substrates with various shapes can be used. For example, a polygonal substrate such as a rectangular substrate, a pentagonal substrate, or a hexagonal substrate can be used. Needless to say, a commercial circular single crystal semiconductor wafer can be used for the single crystal semiconductor substrate. As the circular single crystal semiconductor wafer, a semiconductor wafer of silicon, germanium, or the like; a compound semiconductor wafer of gallium arsenide, indium phosphide, or the like; or the like can be used. Typical examples of the single crystal semiconductor wafer are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter. Moreover, a rectangular single crystal semiconductor substrate can be formed by cutting a commercial circular single crystal semiconductor wafer. The substrate can be cut with a cutting device such as a dicer or a wire saw, laser cutting, plasma cutting, electron beam cutting, or any other appropriate cutting means. Alternatively, a rectangular single crystal semiconductor substrate can be formed in such a way that an ingot for manufacturing a semiconductor substrate before being sliced into a substrate is processed into a rectangular solid so as to have a rectangular cross section and the rectangular solid ingot is sliced. In addition, although there is no particular limitation on the thickness of the single crystal semiconductor substrate, a thick single crystal semiconductor substrate is preferable because many single crystal semiconductor layers can be formed from one piece of material wafer, in consideration of reuse of the single crystal semiconductor substrate. The thickness of single crystal silicon wafers circulating in the market conforms to SEMI standards, which specify that, for example, a wafer with a diameter of 6 inches has a thickness of 625 µm, a wafer with a diameter of 8 inches has a thickness of 725 µm, and a wafer with a diameter of 12 inches has a thickness of 775 μm. Note that the thickness of a wafer conforming to SEMI standards has a tolerance of ±25 μm. It is needless to say that the thickness of the single crystal semiconductor substrate to be a material is not limited to those of SEMI standards, and the thickness can be adjusted as appropriate when an ingot is sliced. Naturally, when a single crystal semiconductor substrate 1108 which has been used is used again, the thickness of the substrate is thinner than that of SEMI standards. A single crystal semiconductor layer formed over a supporting substrate can be determined by selecting a semiconductor substrate to be used as a base.

Further, the crystal surface orientation of the single crystal semiconductor substrate 1108 may be selected depending on a semiconductor element to be manufactured (a field effect transistor in this embodiment mode). For example, a single crystal semiconductor substrate having a {100} plane, a {110} plane, or the like can be used.

In this embodiment mode, an ion addition separation method is used in which hydrogen, helium, or fluorine ions are added to reach a predetermined depth of the single crystal semiconductor substrate, and then, heat treatment is performed to separate a single crystal semiconductor layer, which is an outer layer. Alternatively, a method may be employed in which single crystal silicon is epitaxially grown on porous silicon and the porous silicon layer is separated to obtain a single crystal silicon layer by cleavage with water jetting.

A single crystal silicon substrate is used as the single crystal semiconductor substrate 1108, and the surface thereof is processed with dilute hydrofluoric acid. Accordingly, a native oxide film is removed and contaminant such as dust which is attached to the surface is also removed, whereby the surface of the single crystal semiconductor substrate 1108 is cleaned.

Ions are added to (introduced into) the embrittlement layer 1110 by an ion doping method (abbreviated as an ID method) or an ion implantation method (abbreviated as an II method). The embrittlement layer 1110 is formed by adding ions of hydrogen, helium, or a halogen typified by fluorine. When fluorine ions are added as a halogen element, $BF_3$ may be used as a source gas. Note that ion implantation is a method in which an ionized gas is mass-separated and added to a semiconductor.

For example, an ionized hydrogen gas is mass-separated by an ion implantation method and only $H^+$ ions (or only $H_2^+$ ions) can be selectively accelerated and added.

In an ion doping method, without mass separation of an ionized gas, plural kinds of ion species are generated in plasma and accelerated, and then a single crystal semiconductor substrate is doped with the accelerated ion species. For example, when the single crystal semiconductor substrate is doped with hydrogen ions including $H^+$ ions, $H_2^+$ ions, and $H_3^+$ ions, the proportion of $H_3^+$ ions is typically 50% or more, for example, in general, the proportion of $H_3^+$ ions is 80% and the proportion of other ions ($H^+$ ions and $H_2^+$ ions) is 20%. Here, ion doping also refers to addition of only $H_3^+$ ions as ion species.

Alternatively, ions formed of one or plural of ions of the same atom, which have different masses, may be added. For example, when hydrogen ions are added, it is preferable that $H^+$ ions, $H_2^+$ ions, and $H_3^+$ ions be contained and the proportion of $H_3^+$ ions be high. Accordingly, addition efficiency can be increased, and addition time can be shortened. With such a proportion, separation can be easily performed.

An ion doping method and an ion implantation method are described below in detail. In an ion doping apparatus (also referred to as an ID apparatus) used in an ion doping method, a plasma space is large, so that a large amount of ions can be added to the single crystal semiconductor substrate. On the other hand, an ion implantation apparatus (also referred to as an II apparatus) used in an ion implantation method has a characteristic that mass separation is performed on ions extracted from plasma and only specific ion species can be introduced into a semiconductor substrate. In the ion implantation method, processing is usually performed by scanning with a point beam.

As for a plasma generation method, both of the apparatuses create a plasma state by thermoelectrons which are emitted by heating a filament, for example. However, an ion doping method and an ion implantation method differ greatly in the proportion of the hydrogen ion species in adding (introducing) hydrogen ions ($H^+$, $H_2^+$, and $H_3^+$), which are generated, to the semiconductor substrate.

In view of introduction of a larger amount of $H_3^+$, the ion doping apparatus is preferable to the ion implantation apparatus.

When hydrogen ions or halogen ions such as fluorine ions are added to the single crystal silicon substrate, fluorine and so on which is added knocks out (expels) silicon atoms in a silicon crystal lattice, so that blank portions are created effectively and microvoids are made in the embrittlement layer. In this case, the volume of the microvoids formed in the embrittlement layer is changed by heat treatment at relatively low temperature, and a thin single crystal semiconductor layer can be formed by cleavage along the embrittlement layer. After the addition of fluorine ions, hydrogen ions may be added so that hydrogen is contained in the voids. Since the embrittlement layer which is formed to separate the thin single crystal semiconductor layer from the single crystal semiconductor substrate is cleaved using the volume change of the microvoids formed in the embrittlement layer, it is preferable to make effective use of fluorine ion action or hydrogen ion action in such a manner.

In addition, a protective layer may be formed between the single crystal semiconductor substrate and an insulating layer which is to be bonded to the single crystal semiconductor layer. The protective layer can be formed of a single layer selected from a silicon nitride layer, a silicon oxide layer, a silicon nitride oxide layer, or a silicon oxynitride layer or can have a stacked-layer structure of a plurality of layers. These layers can be formed over the single crystal semiconductor substrate before the embrittlement layer is formed in the single crystal semiconductor substrate. Alternatively, these layers may be formed over the single crystal semiconductor substrate after the embrittlement layer is formed in the semiconductor substrate.

It is necessary to add ions under high dose conditions in the formation of the embrittlement layer, and the surface of the single crystal semiconductor substrate 1108 becomes rough in some cases. Accordingly, a protective layer against the ion addition, such as a silicon nitride film, a silicon nitride oxide film, or a silicon oxide film may be provided with a thickness of 50 nm to 200 nm on the surface through which ions are added.

For example, a stacked layer of a silicon oxynitride film (a thickness of 5 nm to 300 nm, preferably 30 nm to 150 nm (e.g., 50 nm)) and a silicon nitride oxide film (a thickness of 5 nm to 150 nm, preferably 10 to 100 nm (e.g., 50 nm)) is formed as the protective layer over the single crystal semiconductor substrate 1108 by a plasma CVD method. As an example, a silicon oxynitride film is formed with a thickness of 50 nm over the single crystal semiconductor substrate 1108, and a silicon nitride oxide film is formed with a thickness of 50 nm over the silicon oxynitride film to be stacked. A silicon oxynitride film may be a silicon oxide film formed by a chemical vapor deposition method using an organosilane gas.

Alternatively, the single crystal semiconductor substrate 1108 may be degreased and cleaned to remove an oxide film on the surface, and thermal oxidation may be performed. As thermal oxidation, general dry oxidation may be performed, and preferably, oxidation in an oxidizing atmosphere to which halogen is added is performed. For example, heat treatment is performed at a temperature of equal to or greater than 700° C. in an atmosphere containing HCl at 0.5 to 10 volume % (preferably 3 volume %) with respect to oxygen. Thermal oxidation is preferably performed at a temperature of 950° C. to 1100° C. The processing time may be 0.1 to 6 hours, preferably 0.5 to 3.5 hours. The thickness of the oxide film to be formed is 10 nm to 1000 nm (preferably 50 nm to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by effect of chlorine and removed. The heat treatment has an advantageous effect on the case where the surface of the single crystal semiconductor substrate 1108 is subjected to chemical mechanical polishing (CMP). Hydrogen has an effect of compensating a defect at the interface between the single crystal semiconductor substrate 1108 and an insulating layer to be formed so as to reduce local level density at the interface, and the interface between the single crystal semiconductor substrate 1108 and the insulating layer is inactivated to stabilize electric characteristics.

Halogen can be contained in the oxide film formed by this heat treatment. A halogen element is contained at a concentration of $1\times10^{17}$ atoms/cm$^3$ to $5\times10^{20}$ atoms/cm$^3$, whereby the oxide film can function as a protective layer which captures impurities such as metal to prevent contamination of the single crystal semiconductor substrate 1108.

When the embrittlement layer 1110 is formed, the accelerating voltage and the total number of ions can be adjusted by the thickness of films deposited over the single crystal semiconductor substrate, the thickness of the targeted single crystal semiconductor layer which is to be separated from the single crystal semiconductor substrate and transferred to a supporting substrate, and ion species to be added.

For example, a hydrogen gas is used for a raw material, and ions are added at an accelerating voltage of 40 kV with the total ion number of $2\times10^{16}$ ions/cm$^2$ by an ion doping method, so that the embrittlement layer can be formed. If the protective layer is made to be thick and ions are added under the same conditions to form the embrittlement layer, a thin single crystal semiconductor layer can be formed as a targeted single crystal semiconductor layer which is separated from the single crystal semiconductor substrate and transferred (transposed) to the supporting substrate. For example, although it depends on the proportion of ion species (H$^+$ ions, H$_2^+$ ions, and H$_3^+$ ions), when the embrittlement layer is formed under the above conditions and a silicon oxynitride film (with a thickness of 50 nm) and a silicon nitride oxide film (with a thickness of 50 nm) are stacked as a protective layer over the single crystal semiconductor substrate, the thickness of the single crystal semiconductor layer to be transferred to the supporting substrate is approximately 120 nm. Alternatively, when a silicon oxynitride film (with a thickness of 100 nm) and a silicon nitride oxide film (with a thickness of 50 nm) are stacked as a protective layer over the single crystal semiconductor substrate, the thickness of the single crystal semiconductor layer to be transferred to the supporting substrate is approximately 70 nm.

When helium (He) or hydrogen is used for a source gas, addition is performed with an accelerating voltage of 10 kV to 200 kV with a dose of $1\times10^{16}$ ions/cm$^2$ to $6\times10^{16}$ ions/cm$^2$, so that the embrittlement layer can be formed. When helium is used as the source gas, He$^+$ ions can be added as main ions without mass separation. Further, when hydrogen is used as the source gas, H$_3^+$ ions and H$_2^+$ ions can be added as main ions. Ion species are changed depending on a plasma generation method, pressure, the supply quantity of a source gas, or accelerating voltage.

As an example of forming the embrittlement layer, a silicon oxynitride film (with a thickness of 50 nm), a silicon nitride oxide film (with a thickness of 50 mm), and a silicon oxide film (with a thickness of 50 nm) are stacked as a protective layer over the single crystal semiconductor substrate, and hydrogen is added at an accelerating voltage of 40 kV with a dose of $2\times10^{16}$ ions/cm$^2$, so that the embrittlement layer is formed in the single crystal semiconductor substrate. After that, a silicon oxide film (with a thickness of 50 nm) is formed as an insulating layer having a bonding surface over the silicon oxide film, which is a top layer of the protective layer. As another example of forming the embrittlement layer, a silicon oxide film (with a thickness of 100 nm) and a silicon nitride oxide film (with a thickness of 50 nm) are stacked as a protective layer over the single crystal semiconductor substrate, and hydrogen is added at an accelerating voltage of 40 kV with a dose of $2\times10^{16}$ ions/cm$^2$, so that the embrittlement layer is formed in the single crystal semiconductor substrate. After that, a silicon oxide film (with a thickness of 50 nm) is formed as an insulating layer having a bonding surface over the silicon nitride oxide film, which is a top layer of the protective layer. Note that the silicon oxynitride film and the silicon nitride oxide film may be formed by a plasma CVD method, and the silicon oxide film may be formed by a CVD method using an organosilane gas.

In addition, an insulating layer may be formed between the supporting substrate and the single crystal semiconductor substrate. The insulating layer may be formed on either the supporting substrate side or the single crystal semiconductor substrate side, or both of the sides. An insulating layer formed on a surface which is to be bonded has a smooth surface and forms a hydrophilic surface. A silicon oxide film can be used as the insulating film. As the silicon oxide film, a silicon oxide film formed by a chemical vapor deposition method using an organosilane gas is preferably used. Alternatively, a silicon oxide film formed by a chemical vapor deposition method using a silane gas can be used.

Examples of organosilane gas which can be used are silicon-containing compounds such as tetraethoxysilane (TEOS: Si(OC$_2$H$_5$)$_4$), trimethylsilane (TMS: (CH$_3$)$_3$SiH), tetramethylsilane (Si(CH$_3$)$_4$), tetramethylcyclotetrasiloxane (TMCTS), octamethylcyclotetrasiloxane (OMCTS), hexamethyldisilazane (HMDS), triethoxysilane (SiH(OC$_2$H$_5$)$_3$), and trisdimethylaminosilane (SiH(N(CH$_3$)$_2$)$_3$). Note that when a silicon oxide layer is formed by a chemical vapor deposition method using organosilane as a source gas, it is preferable to mix a gas which provides oxygen. Oxygen, dinitrogen monoxide, nitrogen dioxide, or the like can be used as the gas which provides oxygen. Further, an inert gas such as argon, helium, nitrogen, or hydrogen may be mixed.

Alternatively, as the insulating layer formed on the surface which is to be bonded, a silicon oxide film formed by a chemical vapor deposition method using silane such as monosilane, disilane, or trisilane as a source gas can be used. In this case also, it is preferable to mix an inert gas, a gas which provides oxygen, or the like. Moreover, the silicon oxide film to serve as an insulating layer bonded to the single crystal semiconductor layer may contain chlorine. Note that in this specification, a chemical vapor deposition method includes a plasma CVD method, a thermal CVD method, and a photo-CVD method in its category.

Alternatively, as the insulating layer formed on the surface which is to be bonded, silicon oxide formed by heat treatment in an oxidizing atmosphere, silicon oxide which grows by reaction of oxygen radicals, chemical oxide formed with an oxidizing chemical solution, or the like can be used. As the insulating layer, an insulating layer having a siloxane (Si—O—Si) bond may be used. Further, the insulating layer may be formed by reaction between the organosilane gas and oxygen radicals or nitrogen radicals.

The surface of the insulating layer, which is to be bonded, is preferably set as follows: arithmetic mean roughness Ra is less than 0.8 nm and root-mean-square roughness Rms is less than 0.9 nm; more preferably, Ra is equal to or less than 0.4 nm and Rms is equal to or less than 0.5 nm; still preferably, Ra is equal to or less than 0.3 nm and Rms is equal to or less than 0.4 nm. For example, Ra is 0.27 nm and Rms is 0.34 nm. In this specification, Ra is arithmetic mean roughness; Rms is root-mean-square roughness; and the measurement range is 2 µm$^2$ or 10 µm$^2$.

When the supporting substrate and the single crystal semiconductor substrate are bonded to each other, a strong bond can be formed by providing an insulating layer which is formed of a silicon oxide film preferably using organosilane as a material on one or both of surfaces which are to be bonded to each other.

Figure 4B:
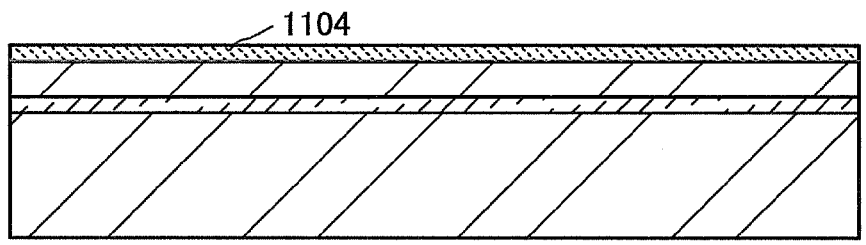

In this embodiment mode, as illustrated in FIG. 4B, a silicon oxide film is formed as an insulating layer 1104 on the surface which is bonded to the supporting substrate. As the silicon oxide film, a silicon oxide film formed by a chemical vapor deposition method using an organosilane gas is preferably used. Alternatively, a silicon oxide film formed by a chemical vapor deposition method using a silane gas can be used. In film formation by a chemical vapor deposition method, a film formation temperature of, for example, equal to or less than 350° C. (300° C. as a specific example) is applied as the temperature at which degasification does not occur from the embrittlement layer 1110, which is formed in the single crystal semiconductor substrate. Moreover, heat treatment temperature which is higher than the film formation temperature is applied for heat treatment by which the single crystal semiconductor layer is separated from the single crystal semiconductor substrate.

The supporting substrate may be provided with a silicon nitride film or a silicon nitride oxide film which prevents diffusion of an impurity element as a blocking layer (also referred to as a barrier layer). Further, a silicon oxynitride film may be combined as an insulating film having a function of relieving stress.

Figure 4C:
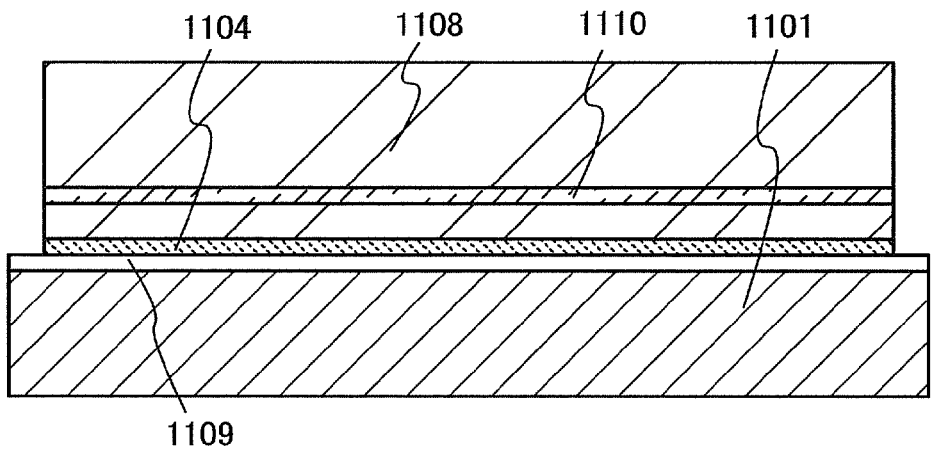

FIG. 4C illustrates a mode in which a blocking layer 1109 provided over a supporting substrate 1101 and a surface of the single crystal semiconductor substrate 1108, on which the insulating layer 1104 is formed, are disposed in close contact with each other and bonded to each other. The surfaces which are to be bonded to each other are cleaned sufficiently. The surface of the blocking layer 1109 provided over the supporting substrate 1101 and the surface of the single crystal semiconductor substrate 1108, on which the insulating layer 1104 is formed, may be cleaned by megasonic cleaning or the like. Further, the surfaces may be cleaned with ozone water after megasonic cleaning, so that an organic substance can be removed and the hydrophilicity of the surfaces can be improved.

By making the blocking layer 1109 over the supporting substrate 1101 and the insulating layer 1104 face each other and pressing one part thereof from the outside, the blocking layer 1109 and the insulating layer 1104 attract each other by increase in van der Waals forces or influence of hydrogen bonding due to local reduction in distance between the bonding surfaces. Further, since the distance between the blocking layer 1109 over the supporting substrate 1101 and the insulating layer 1104 which also face each other in an adjacent region is reduced, a region in which van der Waals forces strongly act or a region which is influenced by hydrogen bonding is widened. Accordingly, bonding proceeds and spreads to the entire bonding surfaces. For example, a pressure of approximately 100 kPa to 5000 kPa may be applied. Further, the supporting substrate and the semiconductor substrate can be disposed so as to overlap with each other, so that bonding can spread by the weight of the overlapping substrate.

In order to form a favorable bond, the surface may be activated. For example, the surface which is to be bonded is irradiated with an atomic beam or an ion beam. When an atomic beam or an ion beam is used, an inert gas neutral atom beam or an inert gas ion beam of argon or the like can be used. Alternatively, plasma irradiation or radical treatment is performed. Such surface treatment makes it easier to form a bond between different kinds of materials even at a temperature of 200° C. to 400° C.

In addition, in order to increase bonding strength of a bonding interface between the supporting substrate and the insulating layer, heat treatment is preferably performed. For example, heat treatment is performed under a temperature condition of 70° C. to 350° C. (e.g., at 200° C. for 2 hours) in an oven, a furnace, or the like.

Figure 4D:
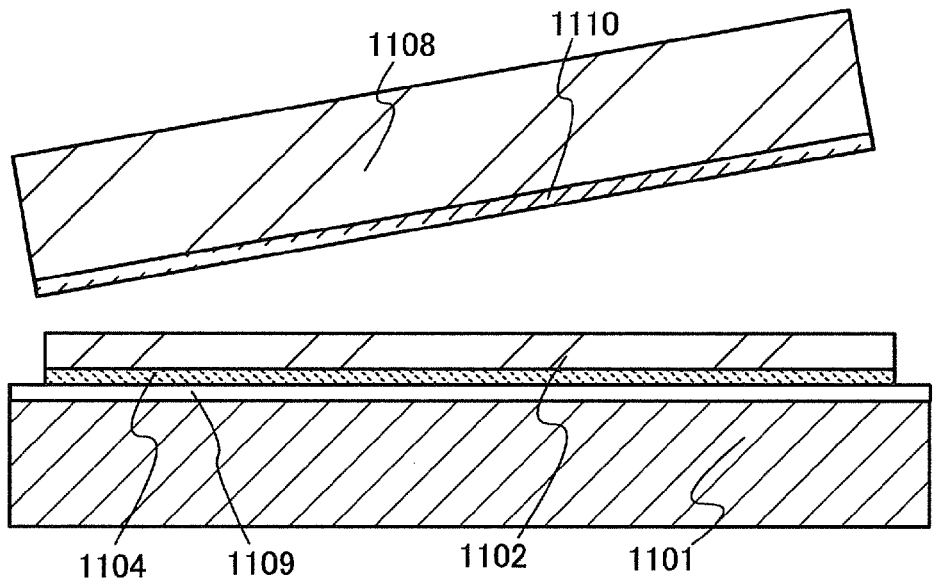

In FIG. 4D, after the supporting substrate 1101 and the single crystal semiconductor substrate 1108 are attached to each other, heat treatment is performed, and the single crystal semiconductor substrate 1108 is separated from the supporting substrate 1101 using the embrittlement layer 1110 as a cleavage plane. When heat treatment is performed at, for example, 400° C. to 700° C., the volume of the microvoids formed in the embrittlement layer 1110 is changed, which enables cleavage along the embrittlement layer 1110. Since the insulating layer 1104 is bonded to the supporting substrate 1101 with the blocking layer 1109 interposed therebetween, a single crystal semiconductor layer 1102 having the same crystallinity as the single crystal semiconductor substrate 1108 remains over the supporting substrate 1101.

Heat treatment in a temperature range of 400° C. to 700° C. may be continuously performed with the same device as the above heat treatment for increasing bonding strength or with another device. For example, after heat treatment in a furnace at 200° C. for 2 hours, the temperature is increased to near 600° C. and held for 2 hours; the temperature is decreased to a temperature ranging from 400° C. to room temperature; and then the substrate is taken out of the furnace. Alternatively, heat treatment may be performed with the temperature increasing from room temperature. Further, after heat treatment is performed in a furnace at 200° C. for 2 hours, heat treatment may be performed in a temperature range of 600° C. to 700° C. with a rapid thermal annealing (RTA) device for 1 minute to 30 minutes (e.g., at 600° C. for 7 minutes or at 650° C. for 7 minutes).

By heat treatment in a temperature range of 400° C. to 700° C., bonding between the insulating layer and the supporting substrate shifts from hydrogen bonding to covalent bonding, and an element added to the embrittlement layer is expanded and the pressure rises, whereby the single crystal semiconductor layer can be separated from the single crystal semiconductor substrate. After the heat treatment, the supporting substrate and the single crystal semiconductor substrate are in a state where one of the supporting substrate and the single crystal semiconductor substrate is provided over the other, and the supporting substrate and the single crystal semiconductor substrate can be separated from each other without application of large force. For example, one substrate located over the other substrate is lifted by a vacuum chuck, so that the substrate can be easily separated. At this time, if the substrate on a lower side is fixed with a vacuum chuck or a mechanical chuck, the supporting substrate and the single crystal semiconductor substrate can be separated from each other without horizontal misalignment.

Note that FIGS. 4A to 4D and FIGS. 5A to 5C illustrate an example in which the single crystal semiconductor substrate 1108 is smaller than the supporting substrate 1101; however, the present invention is not limited thereto, and the single crystal semiconductor substrate 1108 and the supporting substrate 1101 may have the same size or the single crystal semiconductor substrate 1108 may be larger than the supporting substrate 1101.

Figure 5A:
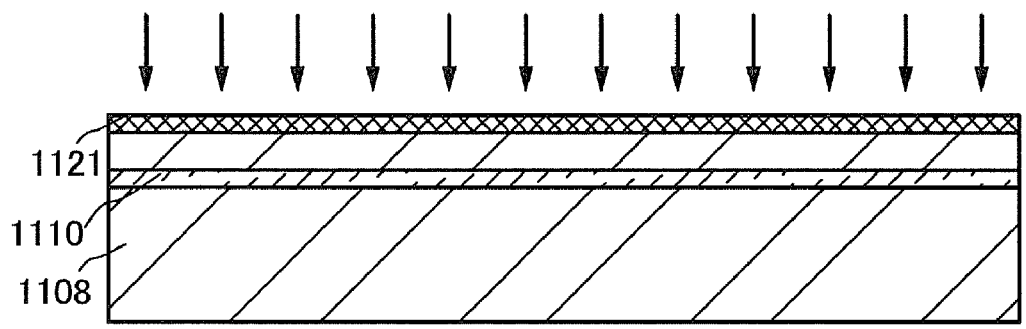
FIGS. 5A to 5C illustrate a method for manufacturing a semiconductor integrated circuit of the present invention.
Figure 5B:
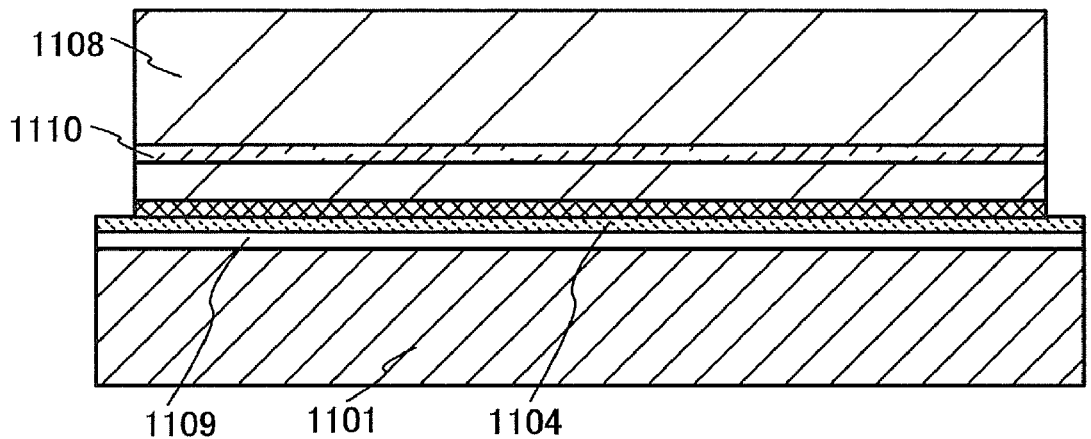
Figure 5C:
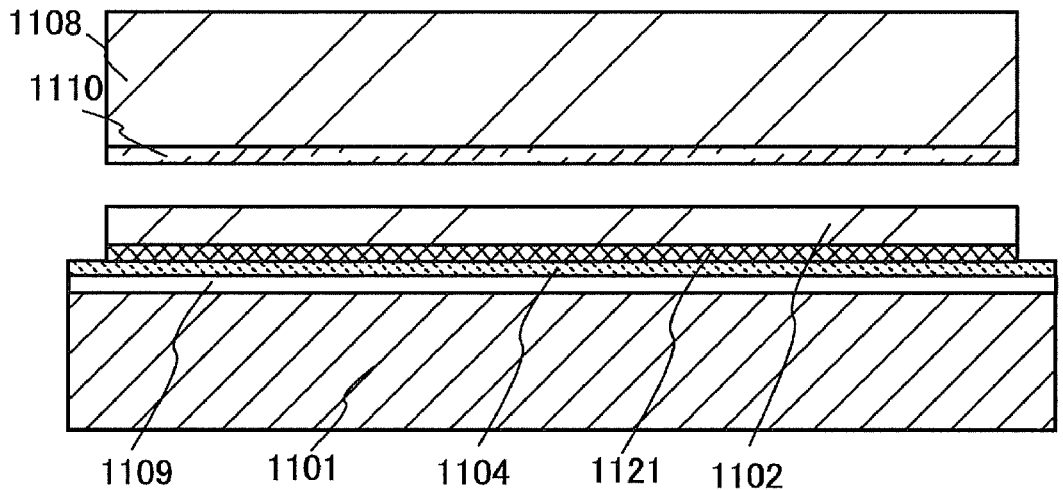

FIGS. 5A to 5C illustrate steps in which an insulating layer is provided on the supporting substrate side and a single crystal semiconductor layer is formed. FIG. 5A illustrates a step in which ions accelerated by an electric field are added to reach a predetermined depth of the single crystal semiconductor substrate 1108 provided with a silicon oxide film as a protective layer 1121 to form the embrittlement layer 1110. Ion addition is performed in a manner similar to that in the case of FIG. 4A. By forming the protective layer 1121 on the surface of the single crystal semiconductor substrate 1108, the surface can be prevented from being damaged by ion addition and losing the planarity. Moreover, the protective layer 1121 has an advantageous effect of preventing diffusion of impurities into the single crystal semiconductor layer 1102 formed from the single crystal semiconductor substrate 1108.

FIG. 5B illustrates a step in which the supporting substrate 1101 provided with the blocking layer 1109 and the insulating layer 1104 is disposed in close contact with the surface of the single crystal semiconductor substrate 1108, on which the protective layer 1121 is formed, to form a bond. The bond is formed by disposing the insulating layer 1104 over the supporting substrate 1101 in close contact with the protective layer 1121 of the single crystal semiconductor substrate 1108.

After that, the single crystal semiconductor substrate 1108 is separated as illustrated in FIG. 5C. Heat treatment for separating a single crystal semiconductor layer is performed in a manner similar to that in the case of FIG. 4D. In such a manner, a semiconductor substrate having an SOI structure of the present invention, which includes the single crystal semiconductor layer with the insulating layer interposed therebetween as illustrated in FIG. 5C, can be obtained.

In some cases, the single crystal semiconductor layer which is separated from the semiconductor substrate and transferred to the supporting substrate has crystal defects due to the separation step and the ion implantation step, loses surface planarity, and has unevenness. When a transistor is formed as a semiconductor element using the single crystal semiconductor layer, it is difficult to form a thin gate insulating layer with high withstand voltage on the surface of the single crystal semiconductor layer having such unevenness.

Moreover, if the single crystal semiconductor layer has crystal defects, performance and reliability of the transistor are adversely affected; for example, a localized interface state density with the gate insulating layer is increased.

Accordingly, the single crystal semiconductor layer is preferably irradiated with electromagnetic waves such as laser light to reduce crystal defects. At least part of the single crystal semiconductor layer is melted by irradiation with electromagnetic waves, whereby crystal defects in the single crystal semiconductor layer can be reduced. Note that an oxide film (a native oxide film or a chemical oxide film) formed on the surface of the single crystal semiconductor layer may be removed by dilute hydrofluoric acid before irradiation with the electromagnetic waves.

Any electromagnetic wave may be used as long as it provides high energy to the single crystal semiconductor layer, and laser light can be preferably used.

Alternatively, the energy can be supplied mainly by heat conduction which is caused by colliding the particles having high energy with the single crystal semiconductor layer by irradiation or the like. As a heat source for supplying the particles having high energy, plasma such as atmospheric-pressure plasma, high-pressure plasma, or a thermal plasma jet, a flame of a gas burner, or the like can be used. Alternatively, an electron beam or the like can be used.

A wavelength of the electromagnetic wave is set so that it is absorbed by the single crystal semiconductor layer. The wavelength can be determined by considering the skin depth of the electromagnetic wave or the like. For example, the wavelength of the electromagnetic wave can be 190 nm to 600 nm. Moreover, the electromagnetic wave energy can be determined by considering the wavelength of the electromagnetic wave, the skin depth of the electromagnetic wave, the thickness of the single crystal semiconductor layer to be irradiated, or the like.

A laser emitting laser light can be a continuous wave laser, a pseudo continuous wave laser, or a pulsed laser. A pulsed laser is preferably used for partial melting. For example, an excimer laser such as a KrF laser, or a gas laser such as an Ar laser or a Kr laser can be used. Further, a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, and the like can be used. Note that an excimer laser is a pulsed laser, and some solid-state lasers such as a YAG laser can be used as a continuous laser, a pseudo continuous laser, and a pulsed laser. In addition, in a solid-state laser, the second to fifth harmonics of a fundamental wave can be preferably used. Moreover, a semiconductor laser such as GaN, GaAs, GaAlAs, or InGaAsP can be used.

If the single crystal semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high-pressure sodium lamp, or a high-pressure mercury lamp may be used. A flash annealing with the use of the above lamp light may be used. Since flash annealing which is performed by preferably using a halogen lamp, a xenon lamp, or the like takes very short treatment time, heating up of the supporting substrate can be suppressed.

A shutter, a reflector such as a mirror or a half mirror, an optical system including a cylindrical lens, a convex lens, or the like may be provided in order to adjust the shape or the path of electromagnetic waves.

Note that for irradiation with electromagnetic waves, an electromagnetic wave may be selectively emitted, or light (an electromagnetic wave) can be emitted by scanning the light (the electromagnetic wave) in the X-Y directions. In this case, a polygon mirror or a galvanometer mirror is preferably used in the optical system.

Irradiation with electromagnetic waves can be performed in an atmosphere which contains oxygen, such as an atmospheric atmosphere, or in an inert atmosphere such as a nitrogen atmosphere. In order to perform irradiation with electromagnetic waves in an inert atmosphere, irradiation with electromagnetic waves may be performed in an airtight chamber, and an atmosphere in this chamber may be controlled. When a chamber is not used, a nitrogen atmosphere can be formed by spraying an inert gas such as a nitrogen gas on a surface to be irradiated with electromagnetic waves.

Further, polishing treatment may be performed on the surface of the single crystal semiconductor layer to which high energy is supplied by electromagnetic wave irradiation or the like to reduce crystal defects. Polishing treatment can enhance the planarity of the surface of the single crystal semiconductor layer.

For the polishing treatment, a chemical mechanical polishing (CMP) method or a liquid jet polishing method can be used. Note that the surface of the single crystal semiconductor layer is cleaned and purified before the polishing treatment. The cleaning may be performed by megasonic cleaning, two-fluid jet cleaning, or the like; and dust or the like on the surface of the single crystal semiconductor layer is removed by the cleaning. Moreover, it is preferable to remove a native oxide film or the like on the surface of the single crystal semiconductor layer by using a dilute hydrofluoric acid to expose the single crystal semiconductor layer.

In addition, polishing treatment (or etching treatment) may be performed on the surface of the single crystal semiconductor layer before irradiation with electromagnetic waves.

In this embodiment mode, when a single crystal silicon substrate is used as the single crystal semiconductor substrate 1108, a single crystal silicon layer can be obtained as the single crystal semiconductor layer 1102. Further, since a method for manufacturing a semiconductor device in this embodiment mode allows the process temperature to be 700° C. or lower, a glass substrate can be used as the supporting substrate 1101. That is, a transistor can be formed over a glass substrate in a manner similar to that of a conventional thin film transistor, and a single crystal silicon layer can be used for the semiconductor layer. Accordingly, it is possible to form a transistor with high performance and high reliability, which can operate at high speed, has a low subthreshold value and high field effect mobility, and can be driven with low voltage consumption, over a supporting substrate such as a glass substrate.

Note that in the present invention, a semiconductor device refers to devices which can function using semiconductor properties. According to the present invention, a device which has a circuit including a semiconductor element (such as a transistor, a memory element, or a diode) and a semiconductor device such as a chip including a processor circuit can be manufactured.

In addition, the semiconductor integrated circuit of the present invention can include a CPU, a buffer circuit, a power supply circuit, an amplifier circuit, a photoelectric conversion element, or the like. Moreover, by using the semiconductor integrated circuit of the present invention, a microprocessor and a semiconductor device which can transmit and receive data without contact and has and an arithmetic function can be manufactured. In the semiconductor device which can transmit and receive data without contact and has and an arithmetic function, the semiconductor integrated circuit of the present invention can be used as a resonant circuit including a resonant capacitor, a rectifier circuit, a constant voltage circuit, a reset circuit, an oscillator circuit, a demodulation circuit, a modulation circuit, an interface, a register, or a memory, for example.

The present invention can also be applied to a semiconductor device having a display function (also referred to as a display device). The semiconductor device using the present invention includes a semiconductor device (a light-emitting display device) in which a light-emitting element which includes a layer containing an organic material, an inorganic material, or a mixture of an organic material and an inorganic material, which exhibit light emission called electroluminescence (hereinafter also referred to as EL), between electrodes is connected to a transistor; and a semiconductor device (a liquid crystal display device) in which a liquid crystal element (a liquid crystal display element) including a liquid crystal material is used as a display element in its category. In this specification, a display device refers to a device including a display element. A display device also includes a display panel itself in which a plurality of pixels including a display element and a peripheral driver circuit for driving the pixels are formed over a substrate. The display device may also include a flexible printed circuit (FPC) or a printed wiring board (PWB) to which an IC, a resistor, a capacitor, an inductor, or a transistor is attached. Further, the display device may include an optical sheet such as a polarizer and a retardation plate. Moreover, the display device may include a backlight (which may include a light guiding plate, a prism sheet, a diffusion sheet, a reflection sheet, or a light source (such as an LED or a cold cathode tube)).

Note that for a display element and a semiconductor device, various modes and various elements can be used. For example, a display medium whose contrast is changed by an electromagnetic effect, such as an EL element (an organic EL element, an inorganic EL element, or an EL element containing an organic compound and an inorganic compound), an electron emission element, a liquid crystal element, electronic ink, a grating light valve (GLV), a plasma display (PDP), a digital micromirror device (DMD), a piezoelectric ceramic display, or a carbon nanotube can be used. Note that semiconductor devices using an EL element include an EL display; semiconductor devices using an electron emission element include a field-emission display (FED), an SED (surface-conduction electron-emitter display) flat panel display, and the like; semiconductor devices using a liquid crystal element include a liquid crystal display (a transmissive liquid crystal display, a transflective liquid crystal display, and a reflective liquid crystal display); and semiconductor devices using electronic ink include electronic paper in their respective categories.

In such a manner, a semiconductor device which is thin and have high-performance can be manufactured with high yield.

Embodiment Mode 2

This embodiment mode describes an example of steps of bonding a single crystal semiconductor layer from a single crystal semiconductor substrate to a supporting substrate, which are different from those in Embodiment Mode 1. Accordingly, description of the same portion or a portion having a similar function to the portions in Embodiment Mode 1 is not repeated.

First, processing on the single crystal substrate side is described. In this embodiment mode, a single crystal semiconductor substrate is degreased and cleaned to remove an oxide film on the surface, and thermal oxidation is performed. As thermal oxidation, oxidation in an oxidizing atmosphere to which halogen is added is preferably performed. For example, heat treatment is performed at a temperature of equal to or greater than 700° C. in an atmosphere containing HCl at 0.5 to 10 volume % (preferably 3 volume %) with respect to oxygen. Thermal oxidation is preferably performed at a temperature of 950° C. to 1100° C. The processing time may be 0.1 to 6 hours, preferably 0.5 to 3.5 hours. The thickness of the oxide film to be formed is 10 nm to 1000 nm (preferably 50 nm to 200 nm), and for example, the thickness is 100 nm.

As a substance containing halogen, other than HCl, one or more of HF, $NF_3$, HBr, $Cl_2$, $ClF_3$, $BCl_3$, $F_2$, $Br_2$, and the like can be used.

Heat treatment is performed in such a temperature range, so that a gettering effect by a halogen element can be obtained. Gettering particularly has an effect of removing metal impurities. That is, impurities such as metal change into volatile chloride and are released into air by operation of chlorine and removed. The heat treatment has an advantageous effect on the case where the surface of the single crystal semiconductor substrate is subjected to chemical mechanical polishing (CMP). Hydrogen has an effect of compensating a defect at the interface between the single crystal semiconductor substrate and an insulating layer to be formed over a supporting substrate so as to reduce local level density at the interface, and the interface between the single crystal semiconductor substrate and the insulating layer is inactivated to stabilize electric characteristics.

Halogen can be contained in the oxide film formed by this heat treatment. A halogen element is contained at a concentration of $1 \times 10^{17}$ atoms/cm$^3$ to $5 \times 10^{20}$ atoms/cm$^3$, whereby the oxide film can function as a protective layer which captures impurities such as metal to prevent contamination of the single crystal semiconductor substrate.

Ions are introduced into the single crystal semiconductor substrate to form an embrittlement layer. The depth of a region where the embrittlement layer is formed can be adjusted by the acceleration energy of the ions to be introduced and the angle at which the ions enter. The acceleration energy can be adjusted by acceleration voltage, or the like.

As a gas used in ion introduction, a hydrogen gas, a rare gas, or the like is used. In this embodiment mode, a hydrogen gas is preferably used. When a hydrogen gas is used in an ion doping method, generated ion species are $H^+$, $H_2^+$, and $H_3^+$, and it is preferable that $H_3^+$ be the largest number of ions introduced to the single crystal semiconductor substrate. $H_3^+$ has higher introduction efficiency than $H^+$ or $H_2^+$, so that introduction time can be reduced. Moreover, a crack is easily generated in the embrittlement layer in a later step.

Next, processing on the supporting substrate side is described. First, a surface of the supporting substrate is cleaned. For cleaning, ultrasonic cleaning may be performed with a hydrochloric acid/hydrogen peroxide mixture (HPM), a sulfuric acid/hydrogen peroxide mixture (SPM), an ammonia peroxide mixture (APM), diluted hydrogen fluoride (DHF), or the like. In this embodiment mode, ultrasonic cleaning is performed with a hydrochloric acid/hydrogen peroxide mixture.

Then, planarization treatment by plasma treatment is performed on the supporting substrate from which impurities such as dust on the surface are removed by cleaning. In this embodiment mode, plasma treatment is performed in such a manner that an inert gas such as an argon (Ar) gas is used in a vacuum chamber and bias voltage is applied to the supporting substrate to be processed to generate plasma. An oxygen ($O_2$) gas or a nitrogen ($N_2$) gas may be introduced together with the inert gas.

The supporting substrate is set to be in the cathode direction, and positive ions of Ar in the plasma are accelerated to the cathode direction to collide with the supporting substrate. By collision of the Ar positive ions, the surface of the supporting substrate is sputter-etched. Accordingly, a projection on the surface of the supporting substrate is etched, so that the surface of the supporting substrate can be planarized. A reactive gas has an advantageous effect of reducing defects caused by sputter etching of the surface of the supporting substrate.

Next, an insulating layer is formed over the supporting substrate. In this embodiment mode, an oxide film containing aluminum oxide as its main component, which is different from a silicon-based insulating layer, is used. The oxide film containing aluminum oxide as its main component refers to an oxide film in which aluminum oxide is contained at least 10 wt. % where the total amount of all components in the oxide film is 100 wt. %. Alternatively, as the insulating layer, a film which contains aluminum oxide as its main component and also contains one or both of magnesium oxide and strontium oxide can be used. Moreover, aluminum oxide containing nitrogen may be used.

The insulating layer can be formed by a sputtering method. As a target used in a sputtering method, metal including aluminum or metal oxide such as aluminum oxide can be used, for example. Note that a material of the target may be selected as appropriate depending on the film to be formed.

When metal is used as the target, the insulating layer is formed in such a manner that sputtering is performed while a reactive gas (e.g., oxygen) is introduced (by a reactive sputtering method). As the metal, magnesium (Mg); an alloy containing aluminum and magnesium; an alloy containing aluminum and strontium (Sr); or an alloy containing aluminum, magnesium, and strontium can be used other than aluminum. In this case, sputtering may be performed using a direct-current (DC) power supply or a radio frequency (RF) power supply.

When metal oxide is used as the target, the insulating layer is formed by sputtering with a radio frequency (RF) power supply (by an RF sputtering method). As the metal oxide, magnesium oxide; strontium oxide; oxide containing aluminum and magnesium; oxide containing aluminum and strontium; or oxide containing aluminum, magnesium, and strontium can be used other than aluminum oxide.

Alternatively, the insulating layer may be formed by a bias sputtering method. When a bias sputtering method is used, the film can be deposited and a surface of the film can be planarized.

The oxide film containing aluminum as its main component can prevent impurities such as moisture and mobile ions included in the supporting substrate from diffusing into a single crystal semiconductor layer to be formed over the supporting substrate later.

Next, the surface of the single crystal semiconductor substrate and the surface of the supporting substrate are made to face each other, and the single crystal semiconductor substrate and the insulating layer are bonded to each other. The single crystal semiconductor substrate and a surface of the insulating layer formed over the supporting substrate are disposed in close contact with each other, so that a bond is formed.

Note that before the single crystal semiconductor substrate and the supporting substrate are bonded to each other, surface treatment is preferably performed on the insulating layer formed over the supporting substrate.

Then, as in Embodiment Mode 1, heat treatment is performed to carry out separation (cleavage) at the embrittlement layer, whereby a single crystal semiconductor layer can be formed over the supporting substrate with the insulating layer interposed therebetween.

A semiconductor element layer can be formed using the single crystal semiconductor layer provided over the supporting substrate.

Next, steps of repeatedly using a separated single crystal semiconductor substrate (process for reprocessing a semiconductor substrate) are described.

First, a separated single crystal semiconductor substrate is taken out. In some cases, an edge portion of the single crystal semiconductor substrate is not sufficiently bonded to the supporting substrate due to edge roll-off. Thus, in some cases, the edge portion of the single crystal semiconductor substrate is not separated at the embrittlement layer, and the insulating layer or the like remains.

A residue on the edge portion of the single crystal semiconductor substrate is removed. The residue can be removed by wet etching treatment. Specifically, wet etching is performed using a mixture solution containing hydrofluoric acid, ammonium fluoride, and surfactant (e.g., product name: LAL500, manufactured by Stella Chemifa Corporation) as an etchant.

Moreover, the embrittlement layer into which hydrogen ions are introduced can be removed by wet etching using an organic alkaline aqueous solution typified by tetramethylammonium hydroxide (TMAH). By performing such treatment, a step due to the residue on the edge portion of the single crystal semiconductor substrate is reduced.

Next, the single crystal semiconductor substrate is oxidized in a halogen atmosphere to form an oxide film, and after that, the oxide film is removed. Hydrogen chloride (HCl) can be used as the halogen. Accordingly, a gettering effect by a halogen element can be obtained. Gettering particularly has an effect of removing metal impurities. That is, impurities such as metal change into volatile chloride and are released into air by operation of chlorine and removed.

Then, CMP process is performed on the single crystal semiconductor substrate as polishing treatment. Thus, the step in the edge portion of the single crystal semiconductor substrate is removed, and the surface of the single crystal semiconductor substrate can be planarized. After that, the obtained single crystal semiconductor substrate is used again as a base wafer.

As described in this embodiment mode, by repeatedly using a single crystal semiconductor substrate through the steps of reprocessing a single crystal semiconductor substrate, reduction in cost can be realized. Moreover, by using the steps of reprocessing a single crystal semiconductor substrate described in this embodiment mode, a surface of the single crystal semiconductor substrate can be sufficiently planarized even when the single crystal semiconductor substrate is repeatedly used. Accordingly, the adhesion between the single crystal semiconductor substrate and the supporting substrate can be increased, and bonding defects can be reduced.

This embodiment mode can be combined with Embodiment Mode 1 as appropriate.

Embodiment Mode 3

This embodiment mode describes another example of steps of bonding a single crystal semiconductor layer from a single crystal semiconductor substrate to a supporting substrate, which are different from those in Embodiment Mode 1. Accordingly, description of the same portion or a portion having a similar function to the portions in Embodiment Mode 1 is not repeated.

In this embodiment mode, when a single crystal semiconductor layer is transferred from a single crystal semiconductor substrate, the single crystal semiconductor substrate is selectively etched, and a plurality of single crystal semiconductor layers whose shapes are processed are transferred to a supporting substrate. Thus, a plurality of island-shaped single crystal semiconductor layers can be formed over the supporting substrate. Since the single crystal semiconductor layers whose shapes are processed in advance are transferred, there is no limitation on the size and the shape of the single crystal semiconductor substrate. Accordingly, the single crystal semiconductor layers can be more efficiently transferred to a large supporting substrate.

Further, the semiconductor layer formed over the supporting substrate is etched so that the shape is processed, modified, and controlled precisely. Accordingly, the shape of the semiconductor layer can be processed into a shape of the single crystal semiconductor layer in a semiconductor element, and errors in formation position and shape defects of the single crystal semiconductor layer due to pattern misalignment caused by light exposure going around a resist mask or the like during resist mask formation, positional misalignment caused by a bonding step in transferring the single crystal semiconductor layer, or the like can be corrected.

Accordingly, a plurality of single crystal semiconductor layers each having a desired shape can be formed over the supporting substrate with high yield. Thus, a semiconductor device including a semiconductor element and an integrated circuit which have more precision and high performance can be manufactured over a large substrate with high throughput and high productivity.

Figure 15A:
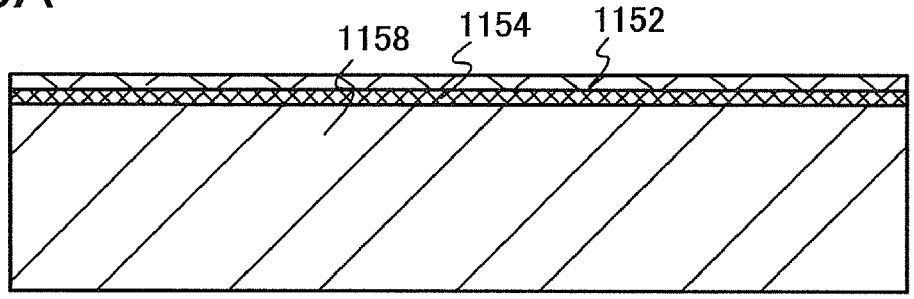
FIGS. 15A to 15E illustrate a method for manufacturing a semiconductor integrated circuit of the present invention.

FIG. 15A illustrates a state in which a protective layer 1154 and a silicon nitride film 1152 are formed over a single crystal semiconductor substrate 1158. The silicon nitride film 1152 is used as a hard mask when the single crystal semiconductor substrate 1158 is processed by etching. The silicon nitride film 1152 may be formed by deposition using silane and ammonia by a vapor deposition method.

Figure 15B:
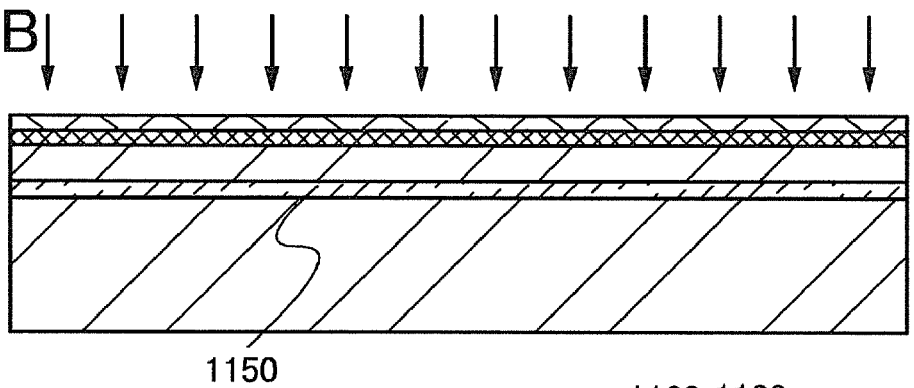

Next, ions are added to the entire surface of the single crystal semiconductor substrate 1158 to form an embrittlement layer 1150 (see FIG. 15B). The ions are added in consideration of the thickness of a single crystal semiconductor layer to be transferred to a supporting substrate. Accelerating voltage in adding the ions is set in consideration of such a thickness so that the ions are added to reach a deep part of the single crystal semiconductor substrate 1158. With this treatment, the embrittlement layer 1150 is formed in a region at a predetermined depth from the surface of the single crystal semiconductor substrate 1158.

Etching treatment is performed in consideration of the shape of the single crystal semiconductor layer in a semiconductor element. That is, in order to transfer the single crystal semiconductor layer of the semiconductor element to the supporting substrate, etching treatment is performed on the single crystal semiconductor substrate 1158 so that a portion which is transferred as the single crystal semiconductor layer remains as a projection portion.

Figure 15C:
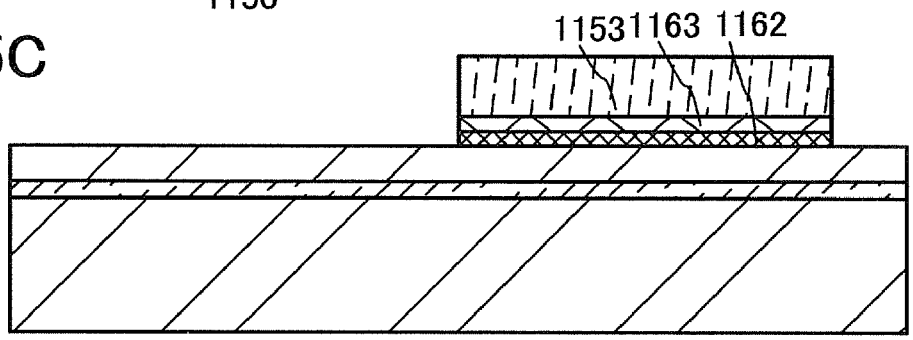

A mask 1153 is formed of photoresist. The silicon nitride film 1152 and the protective layer 1154 are etched using the mask 1153 to form a protective layer 1162 and a silicon nitride layer 1163 (see FIG. 15C).

Figure 15D:
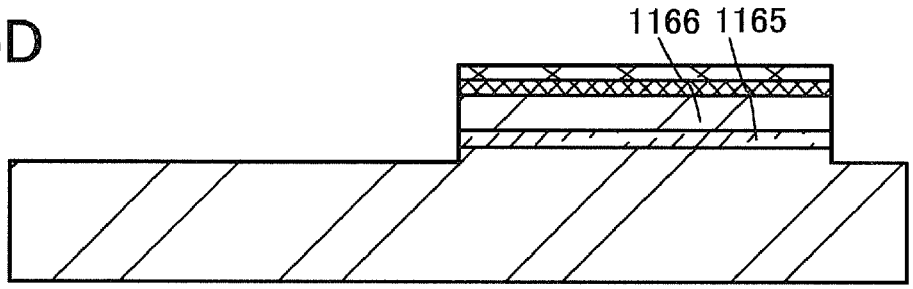

Then, the single crystal semiconductor substrate 1158 is etched using the silicon nitride layer 1163 as a hard mask to form the single crystal semiconductor substrate 1158 including an embrittlement layer 1165 and a single crystal semiconductor layer 1166 (see FIG. 15D). In the present invention, a semiconductor region above the embrittlement layer, which is part of the single crystal semiconductor substrate processed into an upside-down T shape by etching treatment, is referred to as the single crystal semiconductor layer 1166 as in FIG. 15D.

The depth of etching the single crystal semiconductor substrate 1158 is set as appropriate in consideration of the thickness of the single crystal semiconductor layer which is transferred to the supporting substrate. The thickness of the single crystal semiconductor layer can be set in accordance with the depth at which hydrogen ions are added. The depth of a recessed portion formed in the single crystal semiconductor substrate 1158 is preferably greater than the depth of the embrittlement layer. In this etching treatment, by making the depth of the recessed portion greater than the depth of the embrittlement layer, the embrittlement layer can be left only in a region of the single crystal semiconductor layer which is to be separated.

Figure 15E:
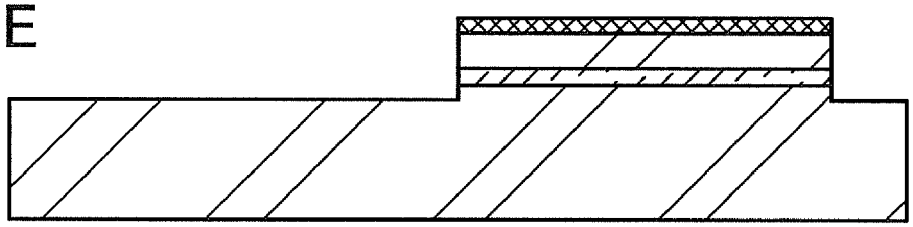
Figure 16A:
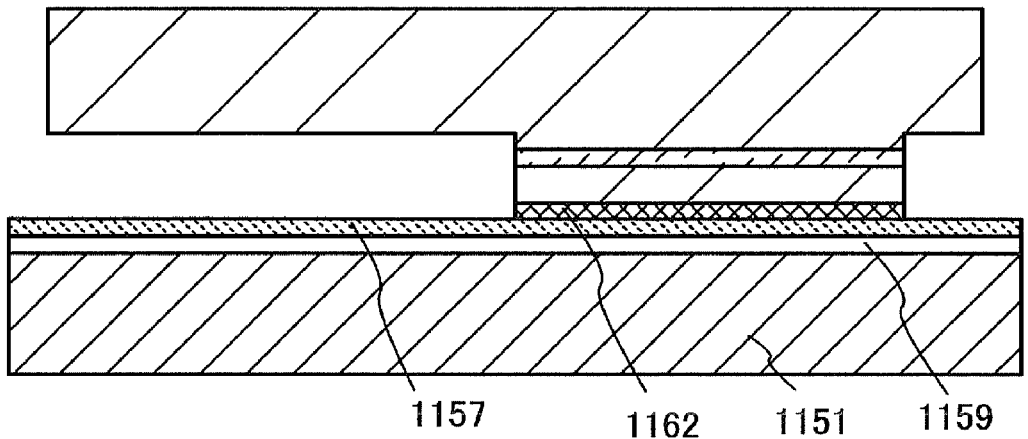
FIGS. 16A to 16D illustrate the method for manufacturing the semiconductor integrated circuit of the present invention.

The silicon nitride layer 1163 on the surface is removed (see FIG. 15E). Then, the surface of the protective layer 1162 of the single crystal semiconductor substrate 1158 and the supporting substrate 1151 are bonded to each other (see FIG. 16A).

A blocking layer 1159 and an insulating layer 1157 are formed on a surface of the supporting substrate 1151. The blocking layer 1159 is provided so as to prevent impurities such as sodium ions from diffusing from the supporting substrate 1151 and contaminating the single crystal semiconductor layer. Note that when there is no concern that impurities which adversely affects the single crystal semiconductor layer are diffused from the supporting substrate 1151, the blocking layer 1159 can be omitted. The insulating layer 1157 is provided so as to be bonded to the protective layer 1162.

The bond is formed by disposing the protective layer 1162 having a cleaned surface on the single crystal semiconductor substrate 1158 side and the insulating layer 1157 on the supporting substrate side in close contact with each other. The bond can be formed at room temperature. This bond is carried out at the atomic level, and a strong bond is formed at room temperature by van der Waals forces. Since the single crystal semiconductor substrate 1158 is processed by etching, a projection portion where the single crystal semiconductor layer is formed is in contact with the insulating layer 1157 over the supporting substrate 1151.

Figure 16B:
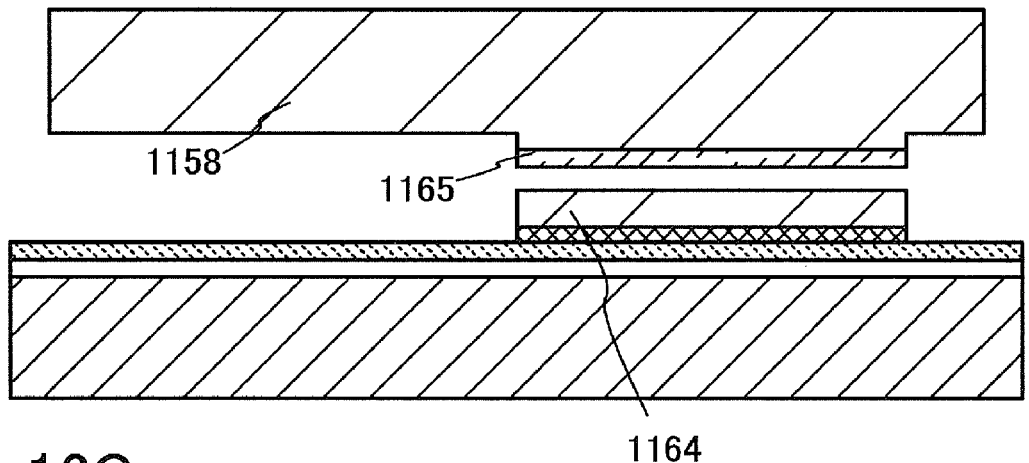

After the bond between the single crystal semiconductor substrate 1158 and the supporting substrate 1151 is formed, heat treatment is performed, whereby a single crystal semiconductor layer 1164 can be separated from the single crystal semiconductor substrate 1158 and fixed to the supporting substrate 1151 as illustrated in FIG. 16B. The volume of microvoids formed in the embrittlement layer 1165 is changed and a crack is generated along the embrittlement layer 1165, whereby the single crystal semiconductor layer is separated. After that, in order to further strengthen the bond, heat treatment is preferably performed. In such a manner, the single crystal semiconductor layer is formed over the insulating surface. FIG. 16B illustrates a state in which the single crystal semiconductor layer 1164 is bonded to the supporting substrate 1151.

In this embodiment mode, since the single crystal semiconductor layers whose shapes are processed in advance are transferred, there is no limitation on the size and the shape of the single crystal semiconductor substrate. Accordingly, single crystal semiconductor layers having various shapes can be formed over the substrate. For example, single crystal semiconductor layers can be freely formed depending on each mask of a light-exposure apparatus at the time of etching, each stepper of the light-exposure apparatus for forming the mask patterns, or each panel or chip size of a semiconductor device which is cut from a large substrate.

Figure 16C:
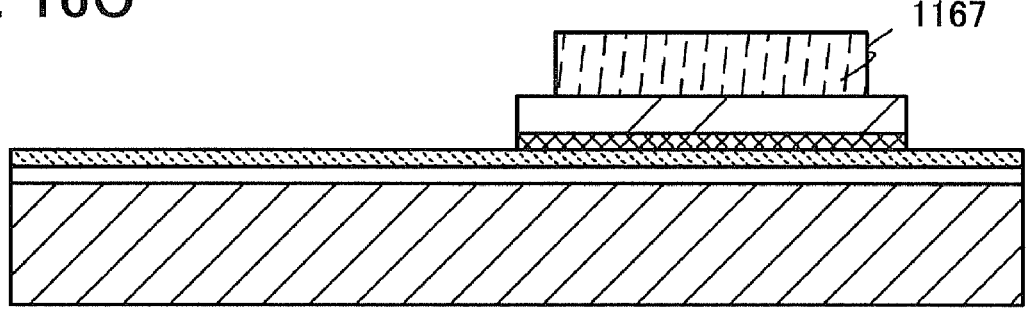

A mask 1167 is selectively formed over the single crystal semiconductor layer 1164 in accordance with a semiconductor element to be manufactured (see FIG. 16C).

Figure 16D:
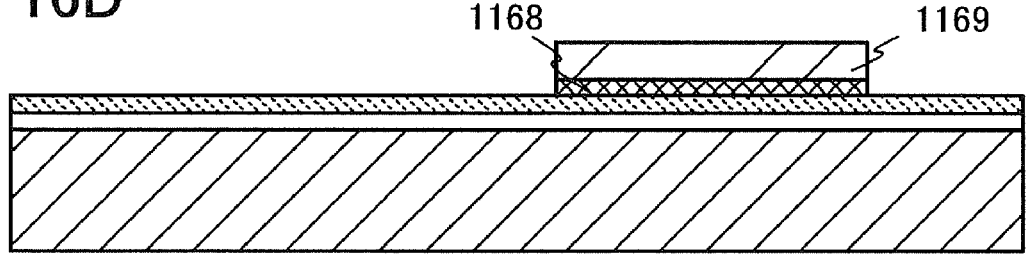

The single crystal semiconductor layer 1164 is etched using the mask 1167 to form a single crystal semiconductor layer 1169. In this embodiment mode, the protective layer 1162 which is below the single crystal semiconductor layer is also etched together with the single crystal semiconductor layer to form a protective layer 1168 (see FIG. 16D). The single crystal semiconductor layer is transferred to the supporting substrate and then the shape of the single crystal semiconductor layer is processed in such a manner, whereby the single crystal semiconductor layer of the semiconductor element can be manufactured using only the single crystal semiconductor layer which has high crystallinity and high planarity. Moreover, misalignment of a formation region and shape defects of the single crystal semiconductor layer, and the like which are caused in the manufacturing steps can be corrected.

A semiconductor element such as a transistor is formed using the single crystal semiconductor layer 1169 provided over the supporting substrate, whereby a semiconductor substrate and a semiconductor device which are thin and have high-performance can be manufactured with high yield.

This embodiment mode can be combined with Embodiment Modes 1 and 2 as appropriate.

Embodiment Mode 4

This embodiment mode describes another example of steps of bonding a single crystal semiconductor layer from a single crystal semiconductor substrate to a supporting substrate, which are different from those in Embodiment Mode 1. Accordingly, description of the same portion or a portion having a similar function to the portions in Embodiment Mode 1 is not repeated.

In this embodiment mode, an example is described in which a single crystal semiconductor layer is separated from a single crystal semiconductor substrate and then bonded to a supporting substrate.

Figure 12A:
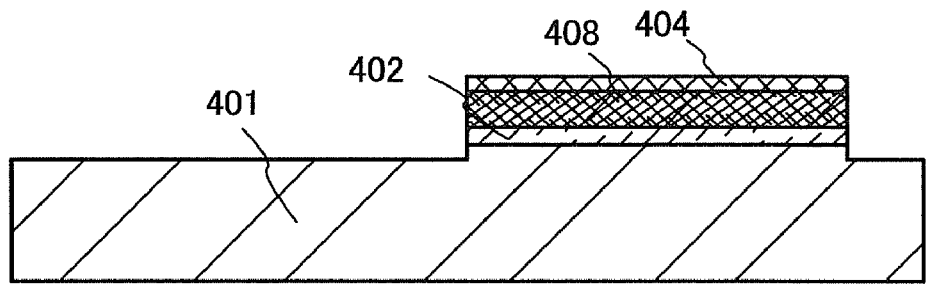
FIGS. 12A to 12D illustrate a method for manufacturing a semiconductor integrated circuit of the present invention.

As illustrated in FIGS. 15A to 15E in Embodiment Mode 3, an embrittlement layer is formed in a single crystal semiconductor substrate, and a projection portion is formed. This etching treatment is performed in consideration of the shape of a single crystal semiconductor layer in a semiconductor element. That is, in order to transfer the single crystal semiconductor layer of the semiconductor element to the supporting substrate, etching treatment is performed on a single crystal semiconductor substrate 401 so that a portion which is transferred as the single crystal semiconductor layer remains as a projection portion. In FIG. 12A, the single crystal semiconductor substrate 401, an embrittlement layer 402, a single crystal semiconductor layer 408 which is part of the single crystal semiconductor substrate, and an insulating film 404 are formed. In this embodiment mode, silicon oxide is used for the insulating film 404.

Next, heat treatment is performed, whereby adjacent microvoids in the embrittlement layer 402 are coupled and the volume of the microvoids is increased. Thus, the single crystal semiconductor substrate 401 is cleaved at the embrittlement layer 402, and the single crystal semiconductor layer 408 and the insulating film 404 are separated from the single crystal semiconductor substrate 401. The heat treatment may be performed, for example, at a temperature ranging from 400° C. to 600° C.

Note that the heat treatment may be performed by dielectric heating with high frequency waves such as microwaves. The heat treatment by dielectric heating can be performed by irradiating the single crystal semiconductor substrate 401 with a high frequency wave in the range of 300 MHz to 3 THz generated by a high-frequency wave generator. Specifically, for example, irradiation is performed with a microwave of 2.45 GHz at 900 W for 14 minutes, whereby adjacent microvoids are coupled in the embrittlement layer, and the single crystal semiconductor substrate 401 can be finally cleaved.

Figure 12B:
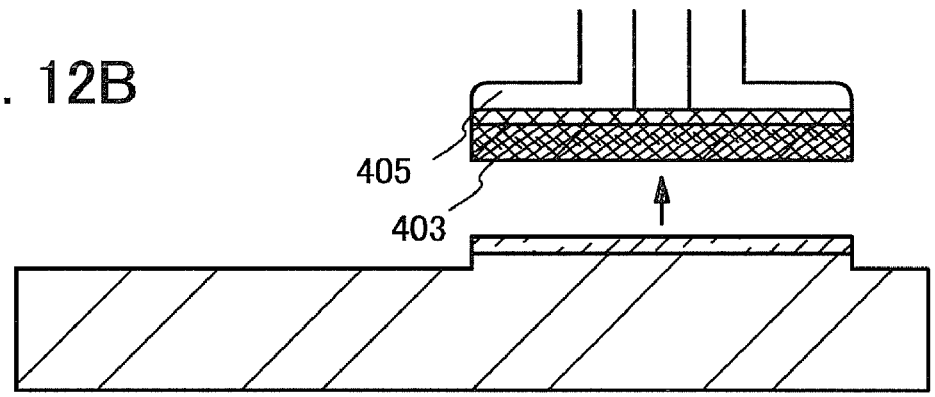

Then, as illustrated in FIG. 12B, a collet 405 is firmly fixed to the insulating film 404 formed over the single crystal semiconductor layer 408, and the single crystal semiconductor layer 408 is separated from the single crystal semiconductor substrate 401. Even when the single crystal semiconductor substrate 401 is not sufficiently cleaved by the above heat treatment, application of force with the collet 405 makes it possible to completely separate the single crystal semiconductor layer 408 from the single crystal semiconductor substrate 401 and obtain a single crystal semiconductor layer 403. As the collet 405, a means which can be firmly fixed to a selected one of the single crystal semiconductor layers 408, for example, a chuck such as a vacuum chuck or a mechanical chuck, a microneedle with a tip to which an adhesive is attached, or the like is used. FIG. 12B illustrates the case where a vacuum chuck is used as the collet 405.

Moreover, as the adhesive to be attached to the microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. MW-1 has a freezing point of 17° C. MW-1 exhibits an adhesive effect at a temperature of 17° C. or lower (preferably 10° C. or lower) and does not exhibit an adhesive effect at a temperature of 17° C. or higher (preferably approximately 25° C.).

Note that before the single crystal semiconductor substrate 401 is cleaved, hydrogenation treatment may be performed on the single crystal semiconductor substrate 401. The hydrogenation treatment is performed, for example, at 350° C. in a hydrogen atmosphere for approximately 2 hours.

Figure 12C:
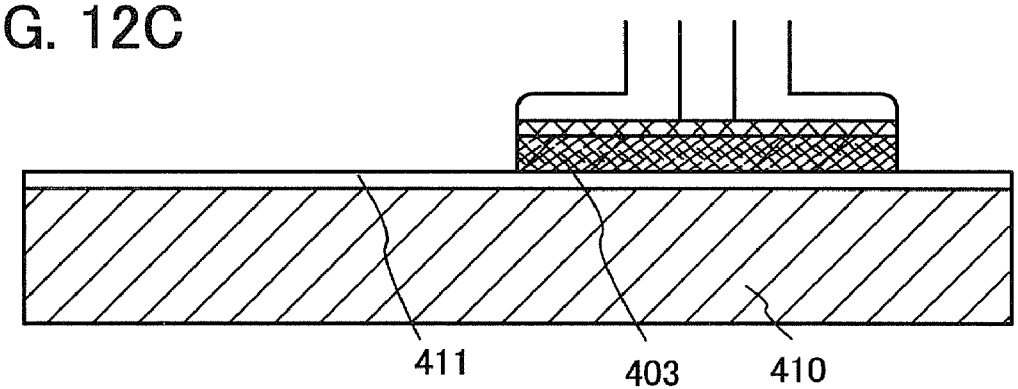

Next, as illustrated in FIG. 12C, the single crystal semiconductor layer 403 and a supporting substrate 410 are attached to each other so that a surface of the semiconductor layer 403, which is exposed by separation, faces the supporting substrate 410. In this embodiment mode, an insulating film 411 is formed over the supporting substrate 410. By bonding the insulating film 411 and the single crystal semiconductor layer 403, the single crystal semiconductor layer 403 and the supporting substrate 410 can be attached to each other. After the single crystal semiconductor layer 403 and the insulating film 411 are bonded to each other, heat treatment at 400° C. to 600° C. is preferably performed to further strengthen the bond.

Since the bond is formed by van der Waals forces, a strong bond is formed even at room temperature. Note that since the above bonding can be performed at low temperature, a variety of substrates can be used as the supporting substrate 410. For example, as the supporting substrate 410, a glass substrate made of aluminosilicate glass, barium borosilicate glass, aluminoborosilicate glass, or the like; a quartz substrate; or the like can be used.

Note that another insulating layer may be provided between the insulating film 411 and the single crystal semiconductor layer 403.

In addition, before or after the single crystal semiconductor layer 403 is attached to the supporting substrate 410, the surface of the semiconductor layer 403, which is exposed by separation, may be subjected to thermal annealing by laser light irradiation. When thermal annealing is performed before the single crystal semiconductor layer 403 is attached to the supporting substrate 410, the surface exposed by separation is planarized, so that bonding strength can be further increased. Alternatively, when thermal annealing is performed after the single crystal semiconductor layer 403 is attached to the supporting substrate 410, the single crystal semiconductor layer 403 is partially melted, so that bonding strength can be further increased.

Alternatively, the single crystal semiconductor layer 403 may be attached to the supporting substrate 410 not only by bonding but also by applying a high frequency of approximately 10 MHz to 1 THz to the single crystal semiconductor layer 403 to generate frictional heat between the single crystal semiconductor layer 403 and the supporting substrate 410 so that the single crystal semiconductor layer 403 is partially melted by the heat.

When MW-1 is used as the low-temperature coagulant, first, the low-temperature coagulant attached to a tip of a microneedle is made to be in contact with the insulating film 404 under such a temperature that the low-temperature coagulant does not exhibit an adhesive effect (e.g., approximately 25° C.). Next, the temperature is decreased to such a temperature that the low-temperature coagulant exhibits an adhesive effect (e.g., approximately 5° C.) to coagulate the low-temperature coagulant, whereby the microneedle and the insulating film 404 are firmly fixed to each other. After the single crystal semiconductor layer 403 separated from the single crystal semiconductor substrate 401 is attached to the supporting substrate 410, the temperature of the low-temperature coagulant is increased to such a temperature that the low-temperature coagulant does not exhibit an adhesive effect (e.g., approximately 25° C.), whereby the microneedle can be separated from the single crystal semiconductor layer 403.

Figure 12D:
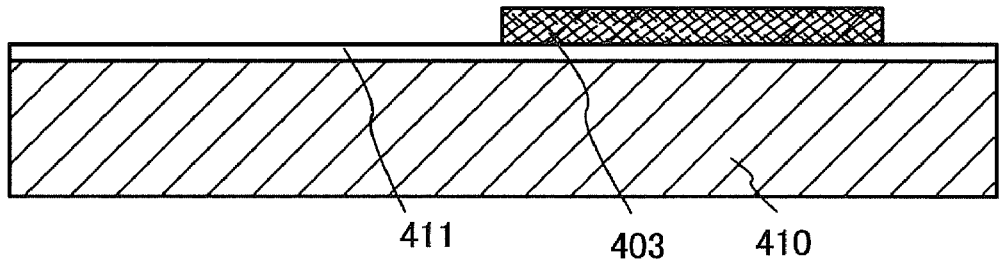

The insulating film 404 over the single crystal semiconductor layer 403 is removed, so that the island-shaped semiconductor layer 403 is formed over the supporting substrate 410 and the insulating film 411 (see FIG. 12D). The single crystal semiconductor layer 403 may be further etched so that the shape is processed.

When the surface of the single crystal semiconductor layer, which is exposed by cleavage, is made to face the supporting substrate as illustrated in FIG. 12C, a surface with higher planarity is in contact with a gate insulating film. Thus, the interface state density between the single crystal semiconductor layer and the gate insulating film can be low and uniform. Accordingly, polishing for planarizing the surface of the single crystal semiconductor layer which is in contact with the gate insulating film can be omitted, or polishing time can be shortened, whereby costs can be reduced and throughput can be improved.

Alternatively, the single crystal semiconductor layer can be attached to the supporting substrate so that the surface of the semiconductor layer, which is exposed by cleavage, is in contact with the gate insulating film. This example is described with reference to FIGS. 13A to 13D and FIGS. 14A to 14C.

Figure 13A:
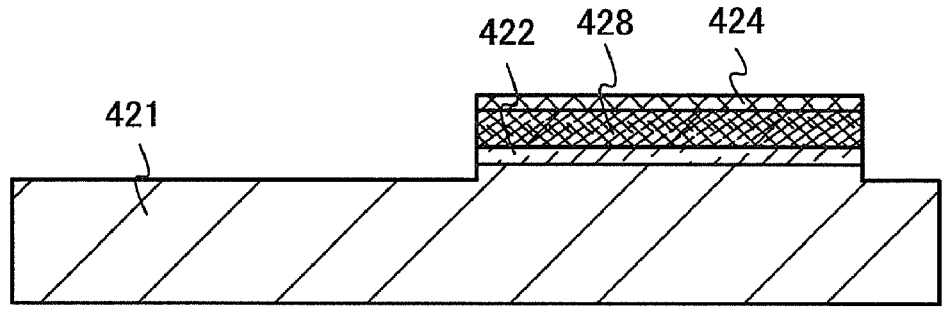
FIGS. 13A to 13D illustrate a method for manufacturing a semiconductor integrated circuit of the present invention.

In FIG. 13A, a single crystal semiconductor substrate 421, an embrittlement layer 422, a single crystal semiconductor layer 428 which is part of the single crystal semiconductor substrate, and an insulating film 424 are formed as in FIG. 12A. In this embodiment mode, silicon oxide is used for the insulating film 424.

Figure 13B:
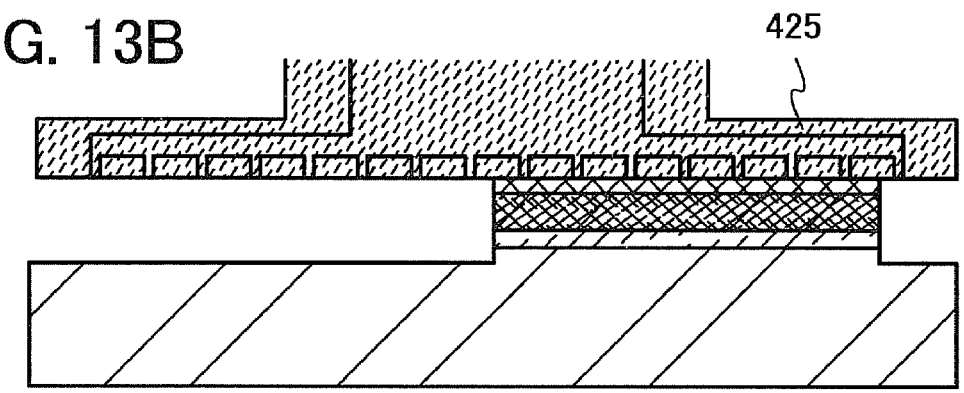

Next, as illustrated in FIG. 13B, the single crystal semiconductor substrate 421 is firmly fixed to a holding means 425. The single crystal semiconductor substrate 421 is firmly fixed so that the single crystal semiconductor layer 428 faces the holding means 425. As the holding means 425, a large-sized vacuum chuck or mechanical chuck which can withstand heat treatment in a later step and can be firmly fixed so as to overlap with a plurality of semiconductor layers (in FIGS. 13A to 13D, the single crystal semiconductor layer 428), specifically, a porous vacuum chuck, a noncontact vacuum chuck, or the like can be used. In this embodiment mode, an example in which a vacuum chuck is used as the holding means 425 is described.

Figure 13C:
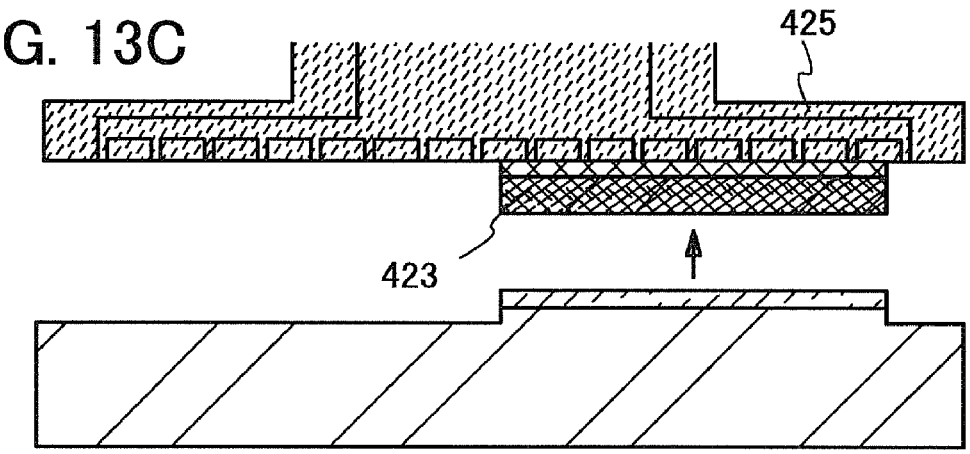

Then, heat treatment is performed, so that adjacent microvoids in the embrittlement layer 422 are coupled, and the volume of the microvoids is increased. Thus, as illustrated in FIG. 13C, the single crystal semiconductor substrate 421 is cleaved at the embrittlement layer 422; a single crystal semiconductor layer 423 is formed from the single crystal semiconductor layer 428 which is part of the single crystal semiconductor substrate 421; and the single crystal semiconductor layer 423 and the insulating film 424 are separated from the single crystal semiconductor substrate 421. The heat treatment may be performed, for example, at a temperature ranging from 400° C. to 600° C.

Note that the heat treatment may be performed by dielectric heating with high frequency waves such as microwaves.

Further, before the single crystal semiconductor substrate 421 is cleaved, hydrogenation treatment may be performed on the single crystal semiconductor substrate 421.

Figure 13D:
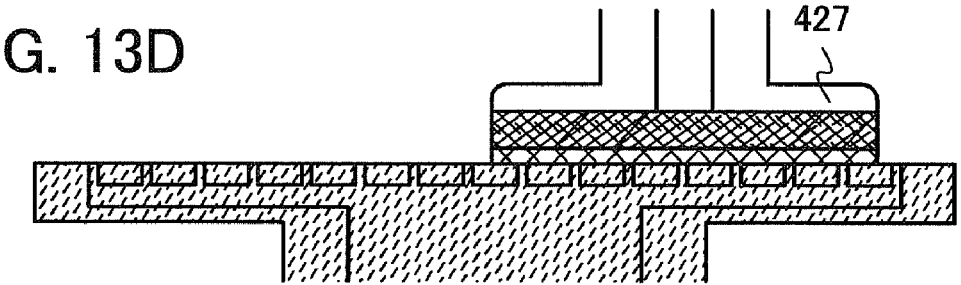
Figure 14A:
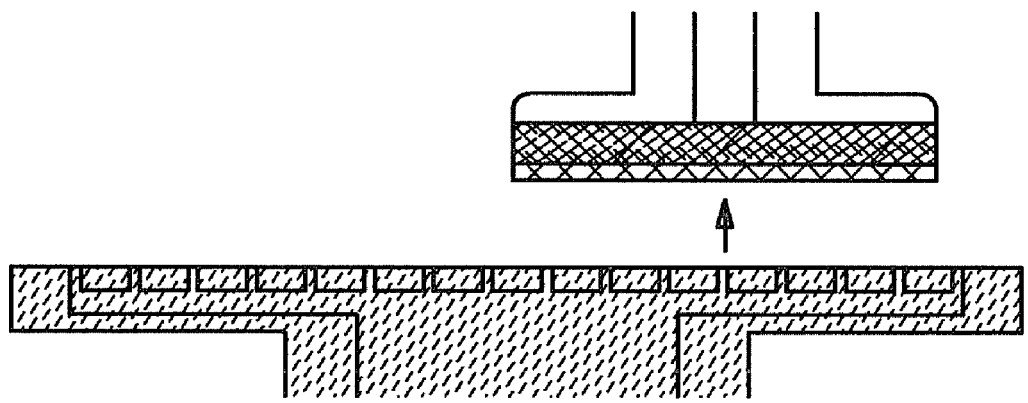
FIGS. 14A to 14C illustrate the method for manufacturing the semiconductor integrated circuit of the present invention.

Then, as illustrated in FIG. 13D and FIG. 14A, a collet 427 is firmly fixed to the surface of the single crystal semiconductor layer 423, which is exposed by cleavage, and the single crystal semiconductor layer 423 is separated from the holding means 425. As the collet 427, a means which can be firmly and selectively fixed to the single crystal semiconductor layer 423, for example, a chuck such as a vacuum chuck or a mechanical chuck, a microneedle with a tip to which an adhesive is attached, or the like is used. FIG. 13D and FIG. 14A illustrate the case where a vacuum chuck is used as the collet 427.

This embodiment mode describes an example where the collet 427 is firmly fixed to the surface of the single crystal semiconductor layer 423, which is exposed by cleavage; however, a protective film such as an insulating film may be formed to prevent damage by the collet 427. Note that the protective film is removed after the single crystal semiconductor layer 423 is attached to a supporting substrate 430.

Moreover, as the adhesive to be attached to the microneedle, an epoxy-based adhesive, a ceramic-based adhesive, a silicone-based adhesive, a low-temperature coagulant, or the like can be used.

Figure 14B:
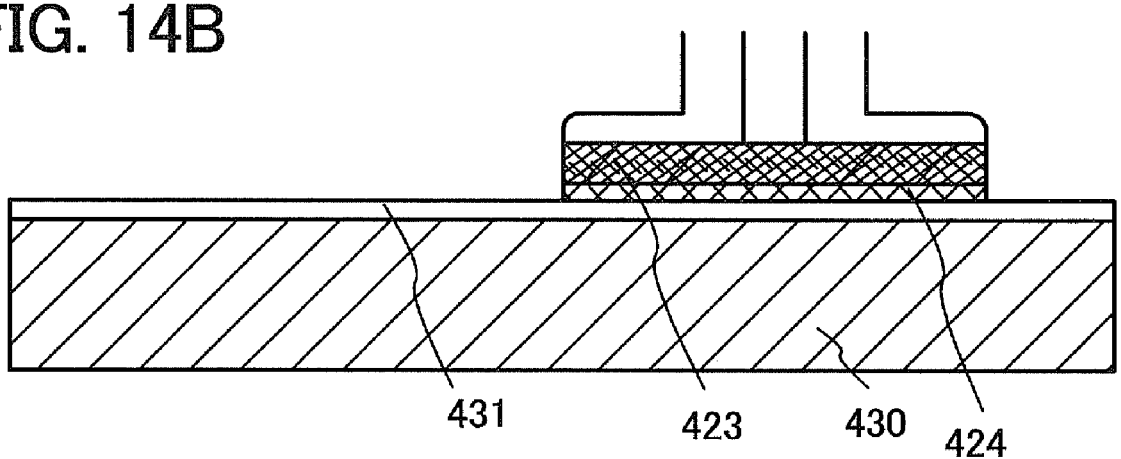
Figure 14C:
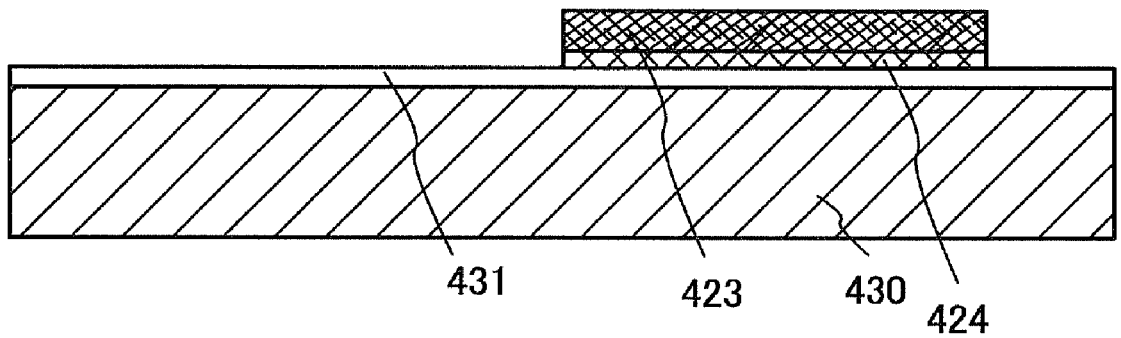

Next, as illustrated in FIG. 14B, the single crystal semiconductor layer 423 and the supporting substrate 430 are attached to each other so that the insulating film 424 faces the supporting substrate 430, that is, so that the surface opposite to the surface exposed by cleavage faces the supporting substrate 430. In this embodiment mode, an insulating film 431 is formed over the supporting substrate 430, and the insulating film 424 and the insulating film 431 are bonded to each other, whereby the single crystal semiconductor layer 423 and the supporting substrate 430 can be attached to each other (see FIG. 14C). After the insulating film 424 and the insulating film 431 are bonded to each other, heat treatment at a temperature ranging from 400° C. to 600° C. is preferably performed in order to further strengthen the bond.

Since the bond is formed by van der Waals forces, a strong bond is formed even at room temperature. Note that since the above bonding can be performed at low temperature, a variety of substrates can be used as the supporting substrate 430.

Note that the single crystal semiconductor substrate warps, bends, or has a slightly rounded edge in some cases. Moreover, when hydrogen or a rare gas, or hydrogen ions or rare gas ions is/are added in order to separate a single crystal semiconductor layer from the single crystal semiconductor substrate, the gas or the ions cannot be added sufficiently to an edge portion of the single crystal semiconductor substrate in some cases. Accordingly, it is difficult to separate part of the single crystal semiconductor layer, which is located at the edge portion of the single crystal semiconductor substrate. When the single crystal semiconductor layers are formed by cleavage of single crystal semiconductor substrates after the single crystal semiconductor substrate are attached to a supporting substrate, the distance between single crystal semiconductor layers is several millimeters to several centimeters. However, in this embodiment mode, the single crystal semiconductor substrate is cleaved to form the single crystal semiconductor layer before the single crystal semiconductor substrate is attached to the supporting substrate. Thus, when the single crystal semiconductor layers are attached to the supporting substrate, the distance between the single crystal semiconductor layers can be reduced to approximately several tens of micrometers, so that it is easy to manufacture a semiconductor device without the influence of a space between the single crystal semiconductor layers.

In a method for manufacturing a semiconductor device of this embodiment mode, a plurality of single crystal semiconductor layers can be attached to one supporting substrate using a plurality of single crystal semiconductor substrates, whereby processing can be performed with high throughput. Further, the crystal orientation of the single crystal semiconductor layer can be selected as appropriate in accordance with the polarity of a semiconductor element. Accordingly, the mobility of the semiconductor element can be increased, and a semiconductor device which can operate at high speed can be provided.

In addition, a plurality of single crystal semiconductor layers can be formed by cleaving a single crystal semiconductor substrate at a plurality of locations, and the plurality of single crystal semiconductor layers can be attached to a supporting substrate. Accordingly, the position to which each of the plurality of single crystal semiconductor layers is attached can be selected in accordance with the polarity and layout of the semiconductor element in the semiconductor device.

This embodiment mode can be implemented in combination with Embodiment Modes 1 and 2 as appropriate.

Embodiment Mode 5

In this embodiment mode, a method for manufacturing a CMOS (complementary metal oxide semiconductor) is described as an example of a method for manufacturing a semiconductor device on which a semiconductor integrated circuit including a thin and high-performance semiconductor element is mounted with high yield, with reference to FIGS. 6A to 6E and FIGS. 7A to 7D. Note that description of the same portion or a portion having a similar function to the portions in Embodiment Mode 1 is not repeated.

Figure 6A:
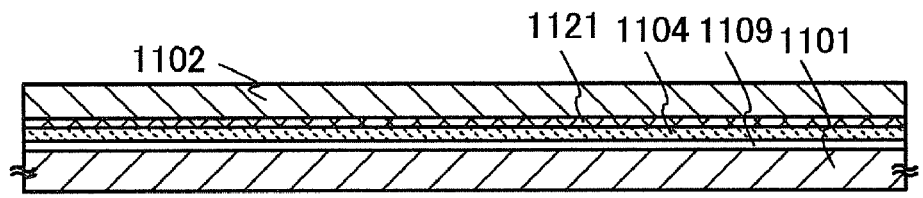
FIGS. 6A to 6E illustrate a method for manufacturing a semiconductor integrated circuit of the present invention.

In FIG. 6A, the blocking layer 1109, the insulating layer 1104, the protective layer 1121, and the single crystal semiconductor layer 1102 are formed over the supporting substrate 1101. The single crystal semiconductor layer 1102, the blocking layer 1109, the insulating layer 1104, and the protective layer 1121 correspond to those in FIG. 5C. Note that here, although an example is shown in which a semiconductor substrate having a structure illustrated in FIG. 6A is used, a semiconductor substrate having another structure described in this specification can also be used. In addition, the blocking layer 1109, the insulating layer 1104, and the protective layer 1121 can be referred to as a buffer layer provided between the supporting substrate 1101 and the single crystal semiconductor layer 1102. The structure of the buffer layer is not limited to the above structure.

A p-type impurity element such as boron, aluminum, or gallium or an n-type impurity element such as phosphorus or arsenic may be added to the single crystal semiconductor layer 1102 in accordance with formation regions of an n-channel field effect transistor and a p-channel field effect transistor, in order to control the threshold voltage by the conductivity type of the separated single crystal semiconductor substrate (an impurity element imparting one conductivity type, which is contained in the substrate). The dose of impurity elements may be approximately $1 \times 10^{12}$ ions/cm$^2$ to $1 \times 10^{14}$ ions/cm$^2$.

Figure 6B:
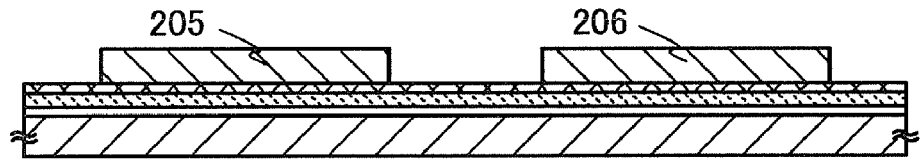

The single crystal semiconductor layer 1102 is etched to be separated into island shapes in accordance with the position of the semiconductor elements, so that single crystal semiconductor layers 205 and 206 are formed (see FIG. 6B).

An oxide film over the single crystal semiconductor layer is removed, and a gate insulating layer 207 which covers the single crystal semiconductor layers 205 and 206 is formed. The single crystal semiconductor layers 205 and 206 in this embodiment mode have high planarity. Accordingly, even if the gate insulating layer formed over the single crystal semiconductor layers 205 and 206 is thin, the gate insulating layer can cover the single crystal semiconductor layers 205 and 206 with favorable coverage. Thus, defective characteristics due to coverage defects with the gate insulating layer can be prevented, and a semiconductor device with high reliability can be manufactured with high yield. Reduction in thickness of the gate insulating layer 207 is effective in operating a thin film transistor with low voltage at high speed.

The gate insulating layer 207 may be formed of silicon oxide or with a stacked-layer structure of silicon oxide and silicon nitride. The gate insulating layer 207 may be formed by depositing an insulating film by a plasma CVD method or a low pressure CVD method, or may be formed by solid phase oxidation or solid phase nitridation by plasma treatment. This is because a gate insulating layer formed by oxidizing or nitriding a single crystal semiconductor layer by plasma treatment is dense, has high withstand voltage, and is excellent in reliability. For example, dinitrogen monoxide (N$_2$O) is diluted with Ar by 1 to 3 times (flow rate) and a microwave (2.45 GHz) with a power of 3 kW to 5 kW is applied at a pressure of 10 Pa to 30 Pa to oxidize or nitride surfaces of the single crystal semiconductor layers 205 and 206. By this processing, an insulating film with a thickness of 1 nm to 10 nm (preferably 2 nm to 6 nm) is formed. Further, dinitrogen monoxide (N$_2$O) and silane (SiH$_4$) are introduced, and a microwave (2.45 GHz) with a power of 3 kW to 5 kW is applied at a pressure of 10 Pa to 30 Pa to form a silicon oxynitride film by a vapor deposition method, whereby the gate insulating layer is formed. The combination of the solid phase reaction and the reaction by the vapor deposition method can form a gate insulating layer with a low interface state density and excellent withstand voltage.

Alternatively, as the gate insulating layer 207, a high dielectric constant material such as zirconium dioxide, hafnium oxide, titanium dioxide, or tantalum pentoxide may be used. When the high dielectric constant material is used for the gate insulating layer 207, gate leakage current can be reduced.

Figure 6C:
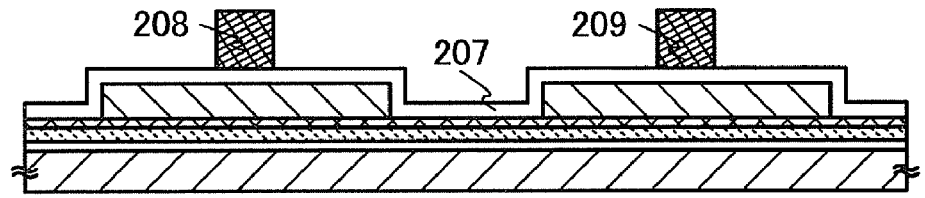
Figure 6D:
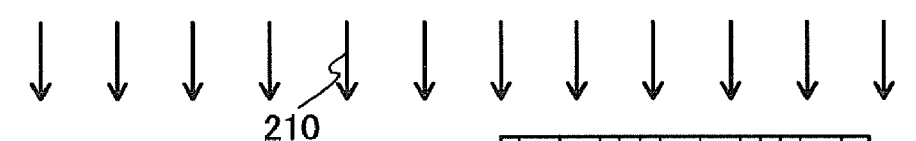
Figure 6D:
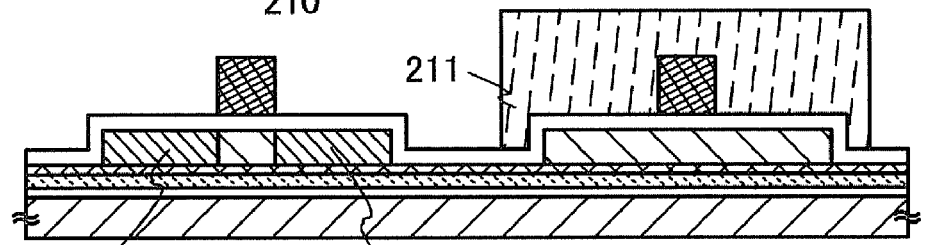
Figure 6E:
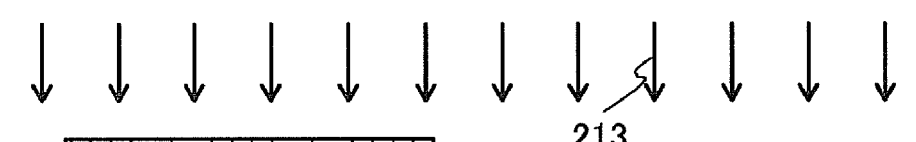
Figure 6E:
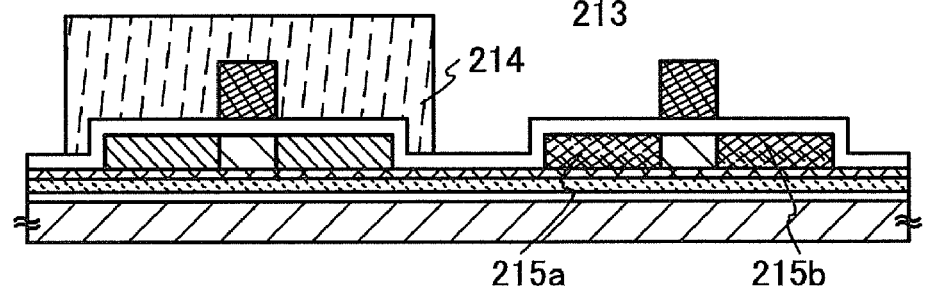

Gate electrode layers 208 and 209 are formed over the gate insulating layer 207 (see FIG. 6C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of these elements as its main component. Alternatively, as the gate electrode layers 208 and 209, a semiconductor film typified by a polycrystalline silicon film doped with an impurity element such as phosphorus, or an AgPdCu alloy may be used.

A mask 211 which covers the single crystal semiconductor layer 206 is formed. By using the mask 211 and the gate electrode layer 208 as masks, an impurity element 210 imparting n-type conductivity is added to form first n-type impurity regions 212a and 212b (see FIG. 6D). In this embodiment mode, phosphine (PH$_3$) is used as a doping gas containing an impurity element. Here, the impurity element imparting n-type conductivity is added so as to be contained in the first n-type impurity regions 212a and 212b at a concentration of approximately $1 \times 10^{17}$ atoms/cm$^3$ to $5 \times 10^{18}$ atoms/cm$^3$. In this embodiment mode, phosphorus (P) is used as the impurity element imparting n-type conductivity.

Next, a mask 214 which covers the single crystal semiconductor layer 205 is formed. By using the mask 214 and the gate electrode layer 209 as masks, an impurity element 213 imparting p-type conductivity is added to form first p-type impurity regions 215a and 215b (see FIG. 6E). In this embodiment mode, diborane (B$_2$H$_6$) or the like is used as a doping gas containing an impurity element in order to use boron (B) as an impurity element.

The mask 214 is removed. Then, sidewall insulating layers 216a to 216d with a sidewall structure are formed on side surfaces of the gate electrode layers 208 and 209, and gate insulating layers 233a and 233b are formed (see FIG. 7A). The sidewall insulating layers 216a to 216d with a sidewall structure may be formed on the side surfaces of the gate electrode layers 208 and 209 in a self-aligning manner as follows: an insulating layer which covers the gate electrode layers 208 and 209 is formed and then processed by anisotropic etching using an RIE (reactive ion etching) method. Here, there is no particular limitation on the insulating layers. The insulating layer is preferably formed using silicon oxide with favorable step coverage, which is formed by reacting TEOS (tetraethyl orthosilicate), silane, or the like with oxygen, dinitrogen monoxide, or the like. The insulating layer can be formed by a thermal CVD method, a plasma CVD method, an atmospheric pressure CVD method, a bias ECR CVD method, a sputtering method, or the like. The gate insulating layers 233a and 233b can be formed by etching the gate insulating layer 207 using the gate electrode layers 208 and 209 and the sidewall insulating layers 216a to 216d as masks.

In this embodiment mode, in etching the insulating layer, the insulating layer over the gate electrode layers is removed to expose the gate electrode layers. Alternatively, the sidewall insulating layers 216a to 216d may be formed to have such a shape to leave the insulating layer over the gate electrode layers. Moreover, a protective film may be formed over the gate electrode layers in a later step. By protecting the gate electrode layers in such a manner, film reduction of the gate electrode layers can be prevented in etching treatment. Further, when silicide is formed in a source region and a drain region, a metal film deposited in forming the silicide is not in contact with the gate electrode layers. Accordingly, even when the metal film and the gate electrode layers are formed of materials which easily react with each other, defects such as chemical reaction and diffusion can be prevented. An etching method may be dry or wet and can employ a variety of etching methods. In this embodiment mode, a dry etching method is used. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate.

Next, a mask 218 which covers the single crystal semiconductor layer 206 is formed. By using the mask 218, the gate electrode layer 208, and the sidewall insulating layers 216a and 216b as masks, an impurity element 217 imparting n-type conductivity is added to form second n-type impurity regions 219a and 219b and third n-type impurity regions 220a and 220b. In this embodiment mode, $PH_3$ is used as a doping gas containing an impurity element. Here, the impurity element imparting n-type conductivity is added so as to be contained in the second n-type impurity regions 219a and 219b at a concentration of approximately $5\times10^{19}$ atoms/cm$^3$ to $5\times10^{20}$ atoms/cm$^3$. Moreover, a channel formation region 221 is formed in the single crystal semiconductor layer 205 (see FIG. 7B).

The second n-type impurity regions 219a and 219b are high-concentration n-type impurity regions and function as a source and a drain. On the other hand, the third n-type impurity regions 220a and 220b are low-concentration impurity regions, or LDD (lightly doped drain) regions. Since the third n-type impurity regions 220a and 220b are formed in Loff regions, which are not covered with the gate electrode layer 208, off current can be reduced. Thus, a semiconductor device with higher reliability and lower power consumption can be manufactured.

The mask 218 is removed, and a mask 223 which covers the semiconductor layer 205 is formed. By using the mask 223, the gate electrode layer 209, and the sidewall insulating layers 216c and 216d as masks, an impurity element 222 imparting p-type conductivity is added to form second p-type impurity regions 224a and 224b and third p-type impurity regions 225a and 225b.

The impurity element imparting p-type conductivity is added so as to be contained in the second p-type impurity regions 224a and 224b at a concentration of approximately $1\times10^{20}$ atoms/cm$^3$ to $5\times10^{21}$ atoms/cm$^3$. In this embodiment mode, the third p-type impurity regions 225a and 225b are formed in a self-aligning manner by the sidewall insulating layers 216c and 216d so as to have a lower concentration than the second p-type impurity regions 224a and 224b. Moreover, a channel formation region 226 is formed in the single crystal semiconductor layer 206 (see FIG. 7C).

The second p-type impurity regions 224a and 224b are high-concentration p-type impurity regions and function as a source and a drain. On the other hand, the third p-type impurity regions 225a and 225b are low-concentration impurity regions, or LDD (lightly doped drain) regions. Since the third p-type impurity regions 225a and 225b are formed in Loff regions, which are not covered with the gate electrode layer 209, off current can be reduced. Thus, a semiconductor device with higher reliability and lower power consumption can be manufactured.

The mask 223 is removed, and heat treatment, strong light irradiation, or laser light irradiation may be performed in order to activate the impurity element. At the same time as the activation, plasma damage to the gate insulating layer and plasma damage to an interface between the gate insulating layer and the single crystal semiconductor layer can be repaired.

Then, an interlayer insulating layer which covers the gate electrode layer and the gate insulating layer is formed. In this embodiment mode, a stacked-layer structure of an insulating film 227 which contains hydrogen and serves as a protective film and an insulating layer 228 is employed. Each of the insulating film 227 and the insulating layer 228 may be a silicon nitride film, a silicon nitride oxide film, a silicon oxynitride film, or a silicon oxide film formed by a sputtering method or a plasma CVD method. Alternatively, a single-layer structure or a stacked-layer structure of three or more layers including another insulating film which contains silicon may be employed.

Further, a step in which heat treatment is performed at 300° C. to 550° C. in a nitrogen atmosphere for 1 to 12 hours to hydrogenate the single crystal semiconductor layer is performed. Preferably, heat treatment is performed at 400° C. to 500° C. This step is a step for terminating dangling bonds in the single crystal semiconductor layer by hydrogen contained in the insulating film 227, which is an interlayer insulating layer. In this embodiment mode, heat treatment is performed at 410° C. for 1 hour.

Alternatively, each of the insulating film 227 and the insulating layer 228 can be formed using a material selected from aluminum nitride (AlN), aluminum oxynitride (AlON), aluminum nitride oxide (AlNO) containing more nitrogen than oxygen, aluminum oxide, diamond-like carbon (DLC), nitrogen-containing carbon (CN), polysilazane, or other inorganic insulating materials. Further alternatively, a siloxane resin may be used. Note that the siloxane resin corresponds to a resin having Si—O—Si bonds. Siloxane has a skeleton structure with a bond of silicon (Si) and oxygen (O). As a substituent, an organic group (e.g., an alkyl group or an aryl group) or a fluoro group may be used. The organic group may include a fluoro group. Moreover, an organic insulating material such as polyimide, acrylic, polyamide, polyimide amide, resist, or benzocyclobutene may be used. A coating film with high planarity, which is formed by a coating method, may be used as well.

Each of the insulating film 227 and the insulating layer 228 can be formed by dipping, spray coating, a doctor knife, a roll coater, a curtain coater, a knife coater, a CVD method, an evaporation method, or the like. Alternatively, each of the insulating film 227 and the insulating layer 228 may be formed by a droplet discharging method. When a droplet discharging method is used, a material liquid can be saved. Further, a method for transferring or drawing a pattern like a droplet discharging method, for example, a printing method (a method for forming a pattern, such as screen printing or offset printing) or the like can be used.

Next, contact holes (openings) which reach the single crystal semiconductor layers are formed in the insulating film 227 and the insulating layer 228 by using a resist mask. Etching may be performed once or a plurality of times depending on the selectivity of a material to be used. The insulating film 227 and the insulating layer 228 are partly removed by etching to form the openings which reach the second n-type impurity regions 219a and 219b and the second p-type impurity regions 224a and 224b, which are source regions and drain regions. As the etching, one or both of wet etching and dry etching may be employed. As an etchant for wet etching, a hydrofluoric acid-based solution such as a mixture solution of ammonium hydrogen fluoride and ammonium fluoride may be used. As the etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate. Further, an inert gas may be added to the etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b functioning as source electrode layers and drain electrode layers which are electrically connected to parts of the source regions and drain regions. The wiring layers can be formed by forming the conductive film by a PVD method, a CVD method, an evaporation method, or the like, and then, etching the conductive film into a desired shape. Alternatively, a conductive layer can be selectively formed in a predetermined position by a droplet discharging method, a printing method, an electrolytic plating method, or the like. Further, a reflow method or a damascene method may be used as well. As a material for the wiring layers, a metal such as Ag, Au, Cu, Ni, Pt, Pd, Ir, Rh, W, Al, Ta, Mo, Cd, Zn, Fe, Ti, Zr, or Ba; Si or Ge; or an alloy or nitride of the above element is used. Alternatively, a stacked-layer structure of these layers may be used.

Figure 7A:
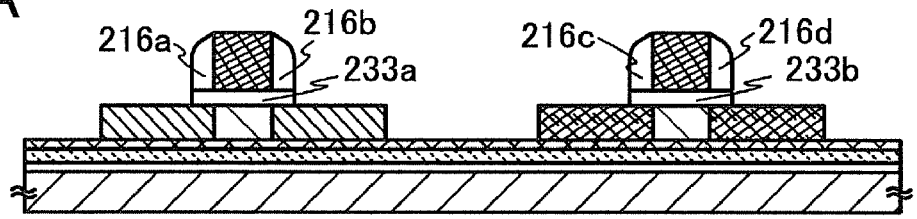
FIGS. 7A to 7D illustrate the method for manufacturing the semiconductor integrated circuit of the present invention.
Figure 7B:
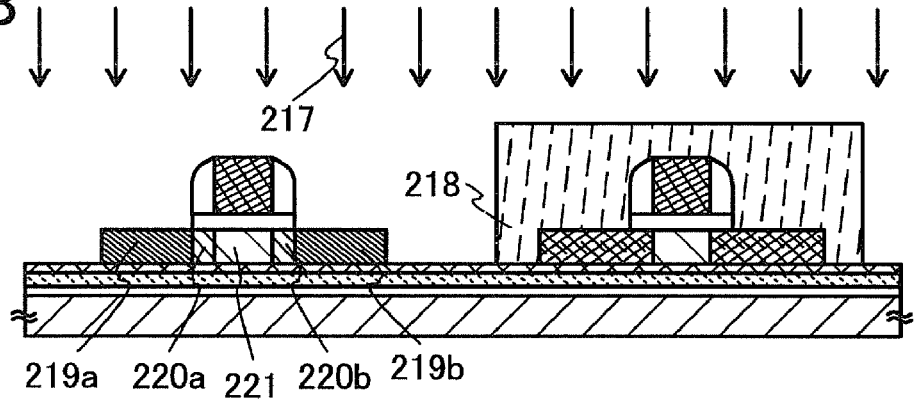
Figure 7C:
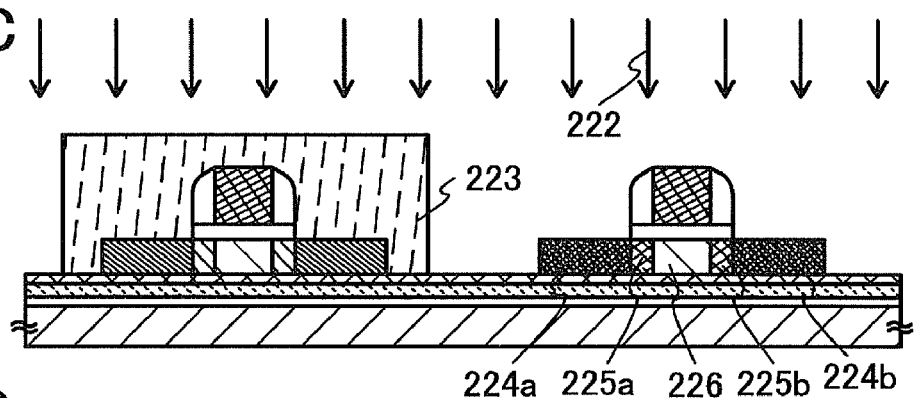
Figure 7D:
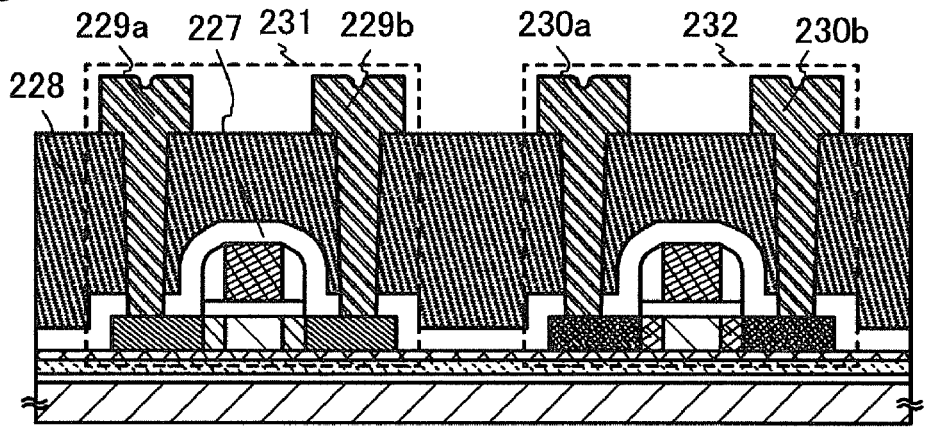

Through the above steps, a semiconductor device with a CMOS structure, which includes a transistor 231 which is an n-channel thin film transistor and a transistor 232 which is a p-channel thin film transistor, can be formed (see FIG. 7D). Although not illustrated, since a CMOS structure is described in this embodiment mode, the transistor 231 and the transistor 232 are electrically connected to each other.

Without being limited to this embodiment mode, a transistor may have a single gate structure where one channel formation region is formed, a double gate structure where two channel formation regions are formed, or a triple gate structure where three channel formation regions are formed.

As described above, a semiconductor substrate including a single crystal semiconductor layer which is transferred from a single crystal semiconductor substrate to a supporting substrate is used. Accordingly, the single crystal semiconductor layer has reduced crystal defects, high crystallinity, and high planarity.

Thus, a semiconductor device which is thin and have high-performance can be manufactured with high yield.

This embodiment mode can be combined with Embodiment Modes 1 to 4 as appropriate.

Embodiment Mode 6

Next, a structure of a display panel, which is one mode of the semiconductor device of the present invention, is described below. In this embodiment mode, a liquid crystal display panel (also referred to as a liquid crystal panel), which is one mode of a semiconductor device including a liquid crystal element as a display element, is described.

Figure 8A:
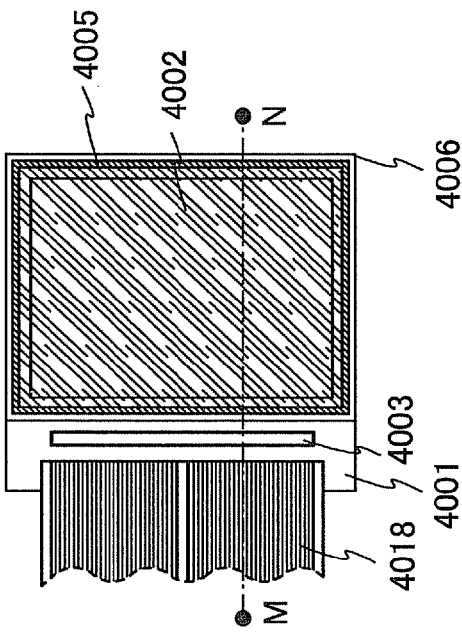
FIGS. 8A and 8B illustrate a semiconductor device of the present invention.
Figure 8B:
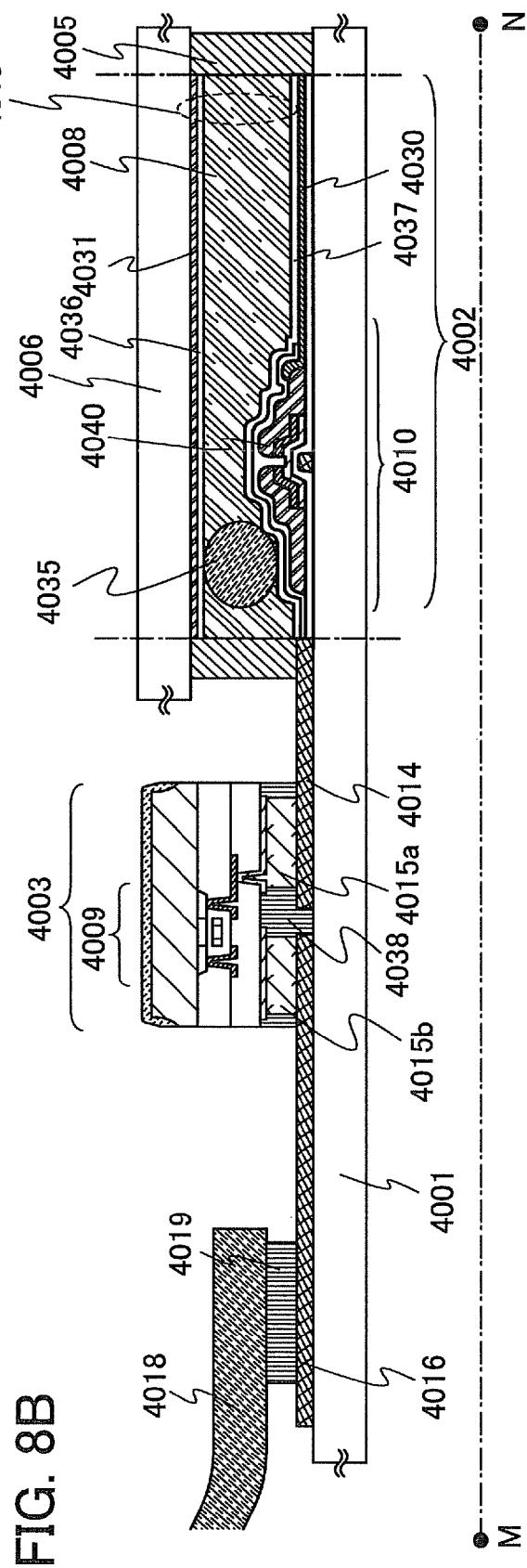

The appearance and a cross section of a liquid crystal display panel, which is one mode of the semiconductor device of the present invention, is described with reference to FIGS. 8A and 8B. FIG. 8A is a top view of a panel in which a transistor 4010 and a liquid crystal element 4013 which are formed over a first substrate 4001 are sealed between the first substrate 4001 and a second substrate 4006 with a sealing material 4005. FIG. 8B corresponds to a cross-sectional view along the line M-N in FIG. 8A.

The sealing material 4005 is provided so as to surround a pixel portion 4002 provided over the first substrate 4001. Moreover, the second substrate 4006 is provided over the pixel portion 4002. Accordingly, the pixel portion 4002 is sealed together with liquid crystal 4008 by the first substrate 4001, the sealing material 4005, and the second substrate 4006.

Further, a semiconductor integrated circuit 4003 which is formed using a single crystal semiconductor layer over a substrate which is prepared separately is mounted in a region which is different from the region surrounded by the sealing material 4005 over the first substrate 4001. The semiconductor integrated circuit 4003 is a peripheral driver circuit (a driver) functioning as a scan line driver circuit and a signal line driver circuit. The semiconductor integrated circuit 4003 is manufactured as in Embodiment Mode 1, and a single crystal semiconductor layer separated from a single crystal semiconductor substrate is used in a transistor 4009 illustrated. Moreover, the substrate which is formed into a thin shape and provided with the semiconductor integrated circuit is covered with a resin layer, so that it is easily treated in a manufacturing process, and defects such as breakage hardly occur. Accordingly, a thinner and higher-performance semiconductor device can be manufactured with high yield.

Note that part of the peripheral driver circuit, for example, the scan line driver circuit may be formed directly on the first substrate together with the pixel portion. In this case, a sealing material may be formed so as to surround the pixel portion and the scan line driver circuit and sealing may be performed using the second substrate.

The pixel portion 4002 provided over the first substrate 4001 includes a plurality of transistors. FIG. 8B illustrates the transistor 4010 included in the pixel portion 4002. In the semiconductor device of FIGS. 8A and 8B, a channel-etched inverted-staggered thin film transistor including an amorphous semiconductor film is used as the transistor 4010. As the inverted-staggered thin film transistor, a channel protective thin film transistor can also be used.

A pixel electrode 4030 included in the liquid crystal element 4013 is electrically connected to the transistor 4010 through a wiring 4040. A counter electrode 4031 of the liquid crystal element 4013 is formed on the second substrate 4006. The liquid crystal element 4013 corresponds to a region where the pixel electrode 4030, the counter electrode 4031, and the liquid crystal 4008 overlap with each other. Note that an alignment film 4037 and an alignment film 4036 are formed in contact with the pixel electrode 4030 and the counter electrode 4031, respectively.

Note that for each of the first substrate 4001 and the second substrate 4006, glass, metal (typically, stainless steel), ceramic, or plastic can be used. As the plastic, a fiberglass-reinforced plastics (FRP) plate, a polyvinyl fluoride (PVF) film, a polyester film, or an acrylic resin film can be used. Alternatively, a sheet with a structure in which aluminum foil is interposed between PVF films or polyester films can be used. In a transmissive liquid crystal display device, light-transmitting substrates need to be used as both the first substrate 4001 and the second substrate 4006. In a reflective liquid crystal display device, a light-transmitting substrate is used at least as a substrate through which light is transmitted.

A spherical spacer 4035 is provided so as to control a distance (a cell gap) between the pixel electrode 4030 and the counter electrode 4031. Note that a spacer obtained by selective etching of an insulating film may be used.

A variety of signals and potentials applied to the semiconductor integrated circuit 4003 which is the peripheral driver circuit separately formed or the pixel portion 4002 are supplied from an FPC 4018 through a connection terminal 4016 and an anisotropic conductive film 4019.

As a structure of a connection portion of the semiconductor integrated circuit and a wiring which is electrically connected to an element provided in the pixel portion, the wiring over the substrate and a bump which is a conductive projection provided for an electrode in the semiconductor integrated circuit may be made in contact with each other, and the substrate and the semiconductor integrated circuit may be fixed with a resin. Alternatively, it is possible that a resin in which conductive particles are dispersed is provided between the wiring over the substrate and an electrode terminal of the semiconductor integrated circuit; and the semiconductor integrated circuit and the wiring over the substrate are electrically connected to each other with the conductive particles and are bonded and fixed to each other with an organic resin in which conductive particles are dispersed. As the resin used for bonding, a light curable resin, a thermosetting resin, a resin which is naturally cured, or the like can be used. In this embodiment mode, the semiconductor integrated circuit 4003 is electrically connected to a wiring 4014 connected to the pixel portion 4002 through a bump 4015a (e.g., a gold bump is used in this embodiment mode) and an anisotropic conductive film 4038.

In this embodiment mode, the connection terminal 4016 and the wiring 4014 are formed using the same conductive film as a gate electrode layer of the transistor 4010.

Moreover, in this embodiment mode, the semiconductor integrated circuit 4003 is electrically connected to the FPC 4018 through the connection terminal 4016, a bump 4015b (e.g., a gold bump is used in this embodiment mode), and the anisotropic conductive film 4038.

Note that although not illustrated, the semiconductor device illustrated in this embodiment mode includes a polarizer, and may also include a color filter or a shielding film.

In addition, FIGS. 8A and 8B illustrate an example in which the semiconductor integrated circuit 4003 is separately formed as the signal line driver circuit and the scan line driver circuit and mounted on the first substrate 4001; however, this embodiment mode is not limited to this structure. Only the signal line driver circuit or the scan line driver circuit may be separately formed as the semiconductor integrated circuit and mounted. Alternatively, only part of the signal line driver circuit or part of the scan line driver circuit may be separately formed as a semiconductor integrated circuit and mounted.

In the present invention, a semiconductor device having a display function, on which the semiconductor integrated circuit is mounted as a driver circuit (a driver), may be a passive matrix device or an active matrix device. Moreover, the semiconductor driver circuit may be mounted as a driver circuit of a memory element, so that a semiconductor device having a memory function can be manufactured.

Further, in the present invention, as a material forming a semiconductor layer in the transistor which is formed directly on the substrate provided with the pixel portion, an amorphous semiconductor formed using a semiconductor material gas typified by silane or germane by a vapor deposition method or a sputtering method; a microcrystalline semiconductor; a polycrystalline semiconductor obtained by crystallizing an amorphous semiconductor using light energy or thermal energy; or the like can be used.

For the semiconductor layer which is formed directly on the substrate provided with the pixel portion, hydrogenated amorphous silicon is typically used as the amorphous semiconductor, and polysilicon is typically used as the crystalline semiconductor. Examples of polysilicon (polycrystalline silicon) are so-called high-temperature polysilicon in which polysilicon formed at a process temperature of 800° C. or more is used as its main component, so-called low-temperature polysilicon in which polysilicon formed at a process temperature of 600° C. or less is used as its main component, and polysilicon obtained by crystallizing amorphous silicon using an element which promotes crystallization.

When a crystalline semiconductor layer is used as the semiconductor layer which is formed directly on the substrate provided with the pixel portion, the crystalline semiconductor layer may be formed by a variety of methods (e.g., a laser crystallization method, a thermal crystallization method, or a thermal crystallization method using an element which promotes crystallization, such as nickel).

Alternatively, as a semiconductor material for the semiconductor layer which is formed directly on the substrate provided with the pixel portion, an organic semiconductor material such as pentacene, an oxide semiconductor material, or the like may be used.

The transistor which is provided in the pixel portion or is formed directly on the substrate provided with the pixel portion may have a single gate structure where one channel formation region is formed, a double gate structure where two channel formation regions are formed, or a triple gate structure where three channel formation regions are formed.

Further, the transistor which is provided in the pixel portion or is formed directly on the substrate provided with the pixel portion may have a top-gate structure (e.g., a staggered structure or a coplanar structure), a bottom-gate structure (e.g., an inverted-staggered structure or an inverted-coplanar structure), a dual-gate structure including two gate electrode layers which are provided above and below a channel region each with a gate insulating film interposed therebetween, or other structures.

This embodiment mode can be implemented in combination with the structure disclosed in other embodiment modes as appropriate.

Embodiment Mode 7

Next, a structure of a display panel, which is one mode of the semiconductor device of the present invention, is described below. In this embodiment mode, a light-emitting display panel (also referred to as a light-emitting panel), which is one mode of a semiconductor device including a light-emitting element as a display element, is described.

Figure 9A:
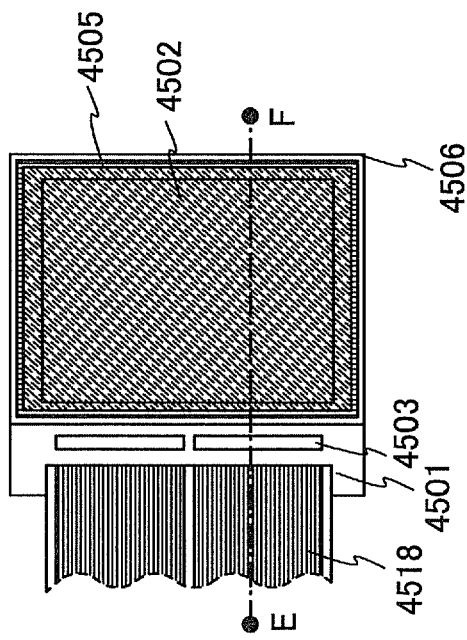
FIGS. 9A and 9B illustrate a semiconductor device of the present invention.
Figure 9B:
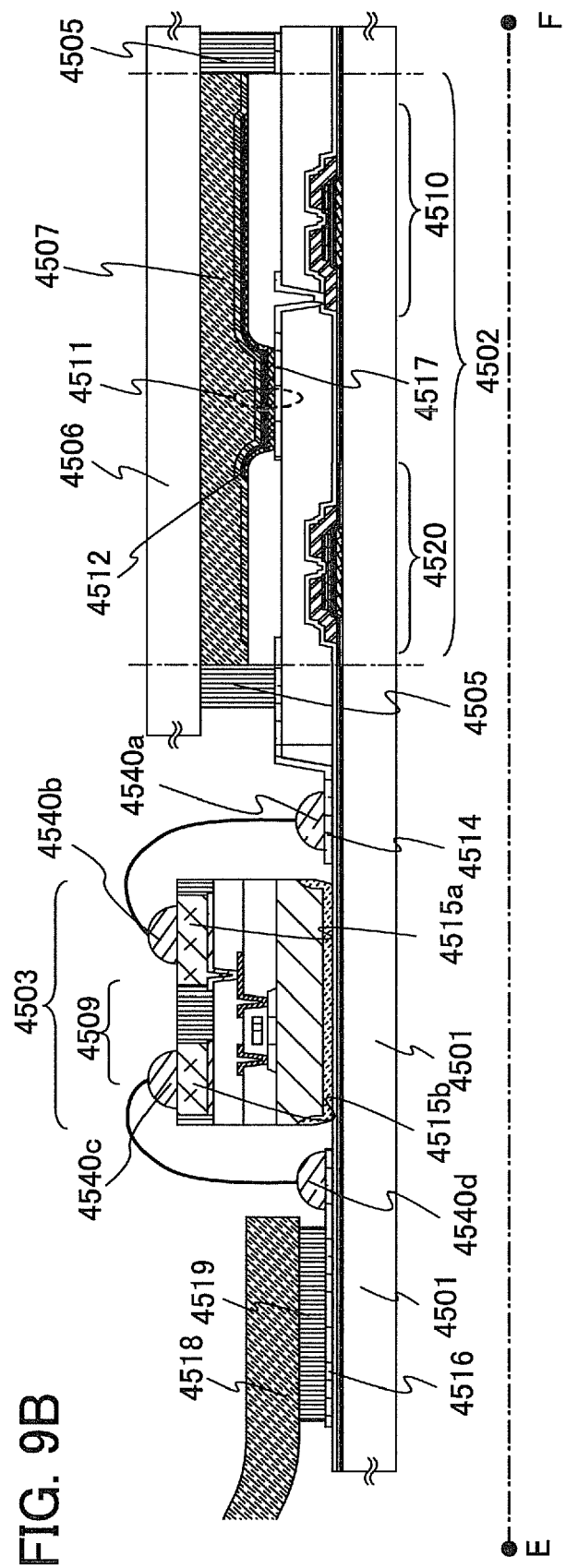

The appearance and a cross section of a light-emitting display panel, which is one mode of the semiconductor device of the present invention, is described with reference to FIGS. 9A and 9B. FIG. 9A is a top view of a display panel on which a semiconductor integrated circuit formed using the present invention is mounted and in which a transistor and a light-emitting element which are formed over a first substrate are sealed between the first substrate and a second substrate with a sealing material. FIG. 9B corresponds to a cross-sectional view along the line E-F in FIG. 9A.

As a light-emitting element included in the display panel, a light-emitting element using electroluminescence can be used here. Light-emitting elements using electroluminescence are classified according to whether a light-emitting material is an organic compound or an inorganic compound. In general, the former is referred to as an organic EL element and the latter is referred to as an inorganic EL element.

In an organic EL element, by applying voltage to the light-emitting element, electrons and holes are separately injected from a pair of electrodes into a layer containing a light-emitting organic compound, and current flows. Then, the electrons and holes (i.e., carriers) are recombined, whereby the light-emitting organic compound is placed in an excited state. The light-emitting organic compound emits light in returning from the excited state to a ground state. Owing to such a mechanism, such a light-emitting element is referred to as a current-excitation light-emitting element.

Inorganic EL elements are classified according to their element structures into a dispersion type inorganic EL element and a thin-film type inorganic EL element. A dispersion type inorganic EL element includes a light-emitting layer where particles of a light-emitting material are dispersed in a binder, and its light emission mechanism is donor-acceptor recombination type light emission which utilizes a donor level and an acceptor level. A thin-film type inorganic EL element has a structure where a light-emitting layer is interposed between dielectric layers, which are further interposed between electrodes. Its light emission mechanism is localized type light emission which utilizes inner-shell electron transition of metal ions.

A sealing material 4505 is provided so as to surround a pixel portion 4502 provided over a first substrate 4501. Moreover, a second substrate 4506 is provided over the pixel portion 4502. Accordingly, the pixel portion 4502 is tightly sealed together with a filler 4507 by the first substrate 4501, the sealing material 4505, and the second substrate 4506.

Further, a semiconductor integrated circuit 4503 which is formed using a single crystal semiconductor layer over a substrate which is prepared separately is mounted in a region which is different from the region surrounded by the sealing material 4505 over the first substrate 4501. The semiconductor integrated circuit 4503 is a peripheral driver circuit (a driver) functioning as a scan line driver circuit and a signal line driver circuit. The semiconductor integrated circuit 4503 is manufactured as in Embodiment Mode 1, and a single crystal semiconductor layer separated from a single crystal semiconductor substrate is used in a transistor 4509 illustrated. Moreover, the substrate which is formed into a thin shape and provided with the semiconductor integrated circuit is covered with a resin layer, so that it is easily treated in a manufacturing process, and defects such as breakage hardly occur. Accordingly, a thinner and higher-performance semiconductor device can be manufactured with high yield.

Note that part of the peripheral driver circuit, for example, the scan line driver circuit may be formed directly on the first substrate together with the pixel portion. In this case, a sealing material may be formed so as to surround the pixel portion and the scan line driver circuit and sealing may be performed using the second substrate.

The pixel portion 4502 provided over the first substrate 4501 includes a plurality of thin film transistors. FIG. 9B illustrates transistors 4510 and 4520 included in the pixel portion 4502. Note that in this embodiment mode, the transistor 4510 is assumed to be a driving TFT; however, the transistor 4510 may be a current-control TFT or an erasing TFT. This embodiment mode shows an example in which a thin film transistor using a microcrystalline semiconductor film is used as the transistors 4510 and 4520.

Each of the transistors 4510 and 4520 includes a gate electrode layer, a gate insulating layer, a semiconductor layer which is the microcrystalline semiconductor film, a buffer layer, a source region and a drain region, and wirings functioning as a source electrode and a drain electrode. The buffer layer is formed between the semiconductor layer, and the source region and the drain region.

Since the buffer layer is provided over the semiconductor layer, damage to the semiconductor layer (reduction in thickness due to radical by plasma or an etchant in etching, oxidation, or the like) in a process can be prevented. Accordingly, reliability of the transistors 4510 and 4520 can be improved.

The microcrystalline semiconductor film is a film including a semiconductor having an intermediate structure between amorphous and crystalline (including single-crystal and polycrystalline) structures. This semiconductor is a semiconductor which has a third state that is stable in terms of free energy. The semiconductor is a crystalline semiconductor which has short-range order and lattice distortion, and column-like or needle-like crystals with a grain size, seen from the film surface, of 0.5 nm to 20 nm grown in the direction of a normal line with respect to the surface of the substrate. Moreover, a microcrystalline semiconductor and an amorphous semiconductor are mixed. Microcrystalline silicon, which is a typical example of a microcrystalline semiconductor, has a Raman spectrum which is shifted to a wave number side lower than 521 $cm^{-1}$, which represents single crystal silicon. That is, the peak of a Raman spectrum of microcrystalline silicon is within the range from 480 $cm^{-1}$ to 521 $cm^{-1}$, which represent amorphous silicon and single crystal silicon respectively. The semiconductor includes hydrogen or halogen of at least 1 at. % to terminate dangling bonds. Moreover, a rare gas element such as helium, argon, krypton, or neon may be included to further promote lattice distortion, so that stability is enhanced and a favorable microcrystalline semiconductor film can be obtained.

The buffer layer can be formed by a plasma CVD method using a silicon gas (a silicon hydride gas or a silicon halide gas) such as $SiH_4$, $Si_2H_6$, $SiH_2Cl_2$, $SiHCl_3$, $SiCl_4$, or $SiF_4$. Alternatively, an amorphous semiconductor film can be formed by diluting silane with one or plural kinds of rare gas elements selected from helium, argon, krypton, or neon. For example, an amorphous silicon oxide film may be used as the buffer layer.

Reference numeral 4511 denotes a light-emitting element. A pixel electrode included in the light-emitting element 4511 is electrically connected to a source electrode or a drain electrode of the transistor 4510 through a wiring 4517. In this embodiment mode, a common electrode of the light-emitting element 4511 and a light-transmitting conductive film 4512 are electrically connected to each other. Note that a structure of the light-emitting element 4511 is not limited to that described in this embodiment mode. The structure of the light-emitting element 4511 can be changed as appropriate depending on a direction in which light is extracted from the light-emitting element 4511, the polarity of the transistor 4510, or the like.

Although not illustrated in the cross-sectional view of FIG. 9B, a variety of signals and potentials applied to the semiconductor integrated circuit 4503 which is the peripheral driver circuit separately formed or the pixel portion 4502 are supplied from an FPC 4518 through a connection terminal 4516.

As a structure of a connection portion of the semiconductor integrated circuit and a wiring which is electrically connected to an element provided in the pixel portion, the wiring over the substrate and a bump which is a conductive projection provided for an electrode in the semiconductor integrated circuit may be made in contact with each other, and the substrate and the semiconductor integrated circuit may be fixed with a resin. Alternatively, it is possible that a resin in which conductive particles are dispersed is provided between the wiring over the substrate and an electrode terminal of the semiconductor integrated circuit; and the semiconductor integrated circuit and the wiring over the substrate are electrically connected to each other with the conductive particles and are bonded and fixed to each other with an organic resin in which conductive particles are dispersed. As the resin used for bonding, a light curable resin, a thermosetting resin, a resin which is naturally cured, or the like can be used.

As a mounting method, a wire bonding method may be used. This embodiment mode shows an example where the semiconductor integrated circuit 4503 is mounted so that a resin layer of the semiconductor integrated circuit 4503 is in contact with the first substrate 4501 provided with the pixel portion. The semiconductor integrated circuit 4503 is electrically connected to the wiring 4514, which is electrically connected to the pixel portion 4502, through conductive materials 4540a, 4540b, and 4515a by a wire bonding method.

In this embodiment mode, a connection terminal 4516 and the wiring 4514 are formed using the same conductive film as the pixel electrode included in the light-emitting element 4511.

Moreover, the semiconductor integrated circuit 4503 is electrically connected to the FPC 4518 through an anisotropic conductive film 4519, the connection terminal 4516, and conductive materials 4540c, 4540d, and 4515b by a wire bonding method.

The semiconductor integrated circuit 4503 can adhere to the first substrate 4501 by an adhesive layer.

In order to extract light emitted from the light-emitting element, it is acceptable as long as at least one of a pair of electrodes is transparent. There are light-emitting elements with a top emission structure in which light is extracted from a surface on the side opposite to an element substrate where a transistor and a light-emitting element are formed (i.e., the counter substrate side), with a bottom emission structure where light is extracted from a surface on the element substrate side, and with a dual emission structure where light is extracted from both the surface on the element substrate side and the surface on the side opposite to the element substrate (i.e., the counter substrate side). The present invention can be applied to a light-emitting element with any of the above structures.

For a reflective electrode of the light-emitting element, a variety of materials can be used as long as it can form a conductive film which reflects light. For example, Ca, Al, CaF, MgAg, AlLi, or the like is preferably used. A light-transmitting electrode of the light-emitting element is formed using a light-transmitting conductive material which transmits light in at least a visible light region. For example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Note that in the present invention, a light-transmitting property is a property of transmitting light at least in a visible light region.

A light-emitting layer interposed between a pair of electrodes may be a single layer or a stacked layer including a plurality of layers. Moreover, a functional layer may be provided between the light-emitting layer and the electrode. As the functional layer, an electron injection layer, an electron transport layer, a hole transport layer, a hole injection layer, or the like can be used.

The substrate located in the direction in which light is extracted from the light-emitting element 4511 needs to be transparent. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

In addition, if needed, optical films such as a polarizer, a circular polarizer (including an elliptical polarizer), a retardation plate (a quarter-wave plate or a half-wave plate), or a color filter may be provided as appropriate on a light emission surface of the light-emitting element. Further, the polarizer or the circular polarizer may be provided with an anti-reflection film. For example, anti-glare treatment can be performed by which reflected light can be diffused with unevenness of the surface and glare can be reduced.

Note that FIGS. 9A and 9B illustrate an example in which the semiconductor integrated circuit 4503 is separately formed as a scan line driver circuit and a signal line driver circuit and mounted on the first substrate 4501; however, this embodiment mode is not limited to this structure. A semiconductor integrated circuit functioning as the scan line driver circuit may be separately formed and mounted. Alternatively, only part of the signal line driver circuit or part of the scan line driver circuit may be separately formed as a semiconductor integrated circuit and mounted.

In the present invention, a semiconductor device having a display function, on which the semiconductor integrated circuit is mounted as a driver circuit (a driver), may be a passive matrix device or an active matrix device. Moreover, the semiconductor driver circuit may be mounted as a driver circuit of a memory element, so that a semiconductor device having a memory function can be manufactured.

Further, in the present invention, for a semiconductor layer in a transistor which is formed directly on the substrate provided with the pixel portion, an amorphous semiconductor, a microcrystalline semiconductor, a polycrystalline semiconductor, or the like can be used.

Further, a transistor which is provided in the pixel portion or is formed directly on the substrate provided with the pixel portion may have a top-gate structure (e.g., a staggered structure or a coplanar structure), a bottom-gate structure (e.g., an inverted-staggered structure or an inverted-coplanar structure), a dual-gate structure including two gate electrode layers which are provided above and below a channel region each with a gate insulating film interposed therebetween, or other structures.

This embodiment mode can be implemented in combination with the structure disclosed in other embodiment modes as appropriate.

Embodiment Mode 8

A semiconductor device or the like obtained by the present invention can be used in display modules (passive-matrix EL modules and liquid crystal modules, and active-matrix EL modules and liquid crystal modules). That is, the present invention can be applied to all electronic devices incorporating such display modules in display portions.

Examples of such electronic devices are cameras such as video cameras and digital cameras, head mount displays (goggle-type displays), car navigation systems, projectors, car stereos, personal computers, and portable information terminals (e.g., mobile computers, cellular phones, and e-book readers). FIGS. 11A to 11D illustrate examples of such electronic devices.

Figure 11A:
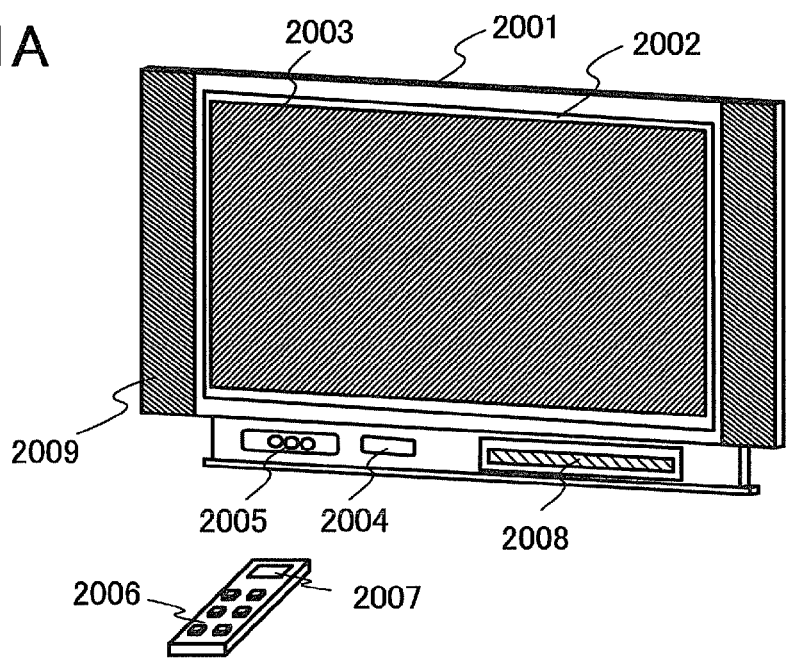
FIGS. 11A to 11D illustrate electronic devices to which the present invention is applied.

FIG. 11A illustrates a television device. The television device can be completed by incorporating a display module into a housing as illustrated in FIG. 11A. A display panel with an FPC attached is also referred to as a display module. A main screen 2003 is formed using a display module and the television device is provided with a speaker portion 2009, operating switches, and the like as accessories. In such a manner, the television device can be completed.

As illustrated in FIG. 11A, a display panel 2002 using a display element is incorporated into a housing 2001. The television device can receive general TV broadcast by a receiver 2005, and can be connected to a wired or wireless communication network via a modem 2004 so that one-way (from a sender to a receiver) or two-way (between a sender and a receiver or between receivers) information communication can be performed. The television device can be operated by using a switch built in the housing or a remote control unit 2006. Moreover, the remote control unit may be provided with a display portion 2007 for displaying output information.

Further, the television device may include a sub screen 2008 formed using a second display panel for displaying channels, volume, and the like, in addition to the main screen 2003. In this structure, the main screen 2003 may be formed using a light-emitting display panel with an excellent viewing angle, and the sub-screen 2008 may be formed using a liquid crystal display panel by which display at low power consumption is possible. Alternatively, in order to prioritize lower power consumption, a structure may be employed in which the main screen 2003 is formed using a liquid crystal display panel, and the sub-screen 2008 is formed using a light-emitting display panel and can be turned on and off.

Figure 10:
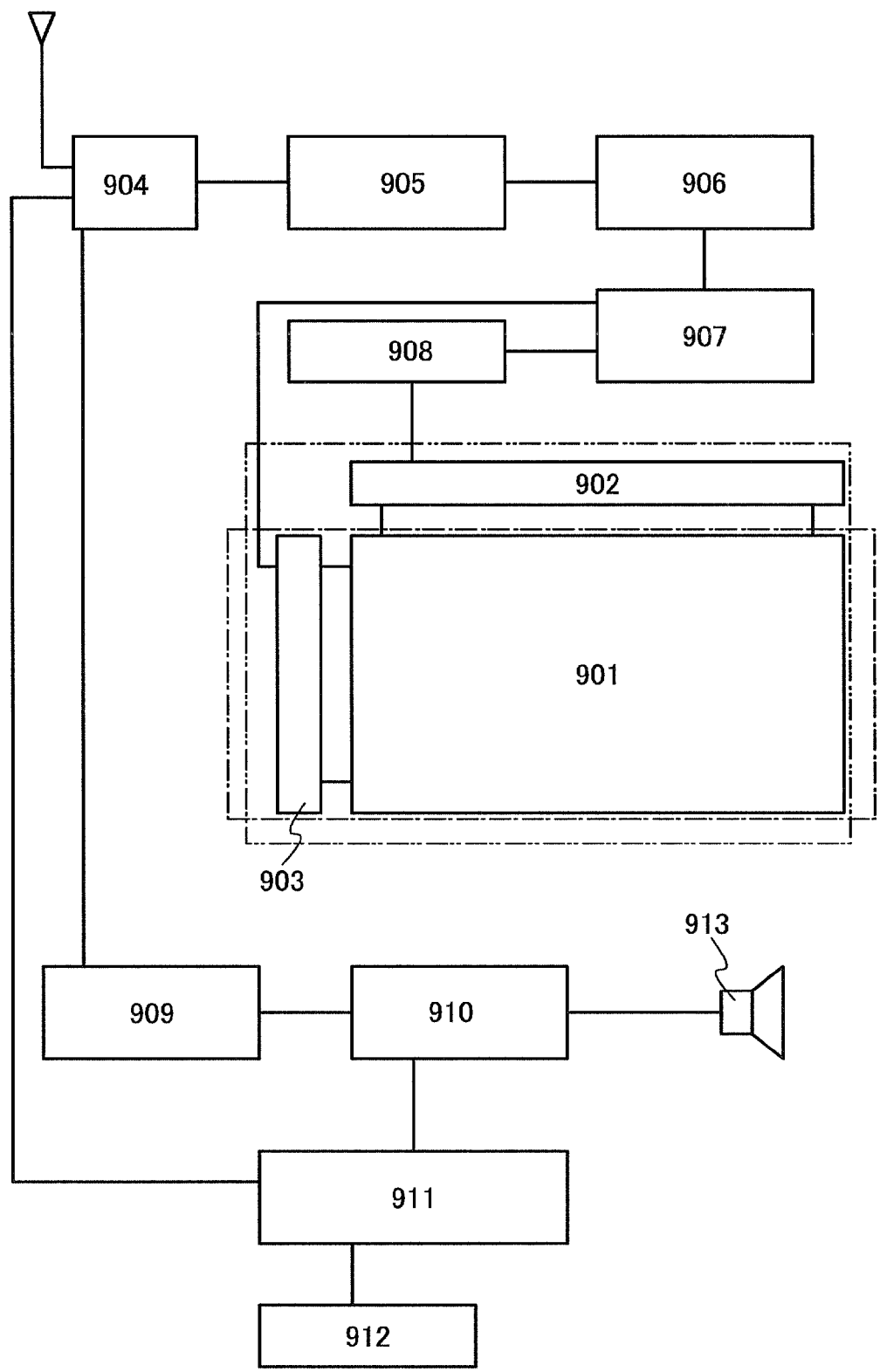
FIG. 10 is a block diagram illustrating a main structure of an electronic device to which the present invention is applied.

FIG. 10 is a block diagram illustrating a main structure of a television device. A display panel is provided with a pixel portion 901. A signal line driver circuit 902 and a scan line driver circuit 903 are formed by mounting the semiconductor integrated circuit of the present invention by a COG method.

As other external circuits, a video signal amplifier circuit 905 which amplifies a video signal among signals received by a tuner 904; a video signal processing circuit 906 which converts the signal output from the video signal amplifier circuit 905 into a color signal corresponding to each color of red, green, and blue; a control circuit 907 which converts the video signal into an input specification of a driver IC; and the like are provided on the video signal input side. The control circuit 907 outputs signals to both the scan line side and the signal line side. When digital driving is performed, a signal dividing circuit 908 may be provided on the signal line side and an input digital signal may be divided into m pieces to be supplied.

Among the signals received by the tuner 904, an audio signal is transmitted to an audio signal amplifier circuit 909, and an output thereof is supplied to a speaker 913 through an audio signal processing circuit 910. A control circuit 911 receives control information of a receiving station (reception frequency) or sound volume from an input portion 912 and transmits signals to the tuner 904 or the audio signal processing circuit 910.

It is needless to say that the present invention is not limited to the television device and can be applied to a variety of uses such as a monitor of a personal computer and a large display medium such as an information display board at the train station, the airport, and the like, and an advertisement display board on the street.

Figure 11B:
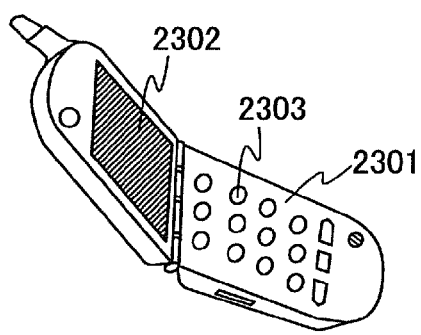

FIG. 11B illustrates an example of a cellular phone 2301. The cellular phone 2301 includes a display portion 2302, an operation portion 2303, and the like. By using the semiconductor device described in the above embodiment modes for the display portion 2302, reliability and mass productivity of the cellular phone can be improved.

Figure 11C:
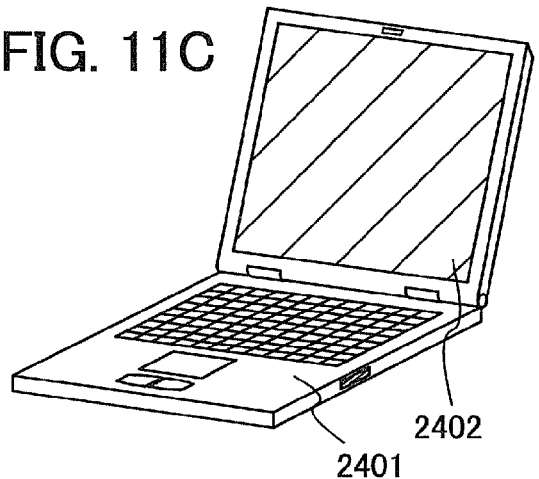

In addition, a portable computer illustrated in FIG. 11C includes a main body 2401, a display portion 2402, and the like. By using the semiconductor device described in the above embodiment modes for the display portion 2402, reliability and mass productivity of the portable computer can be improved.

Figure 11D:
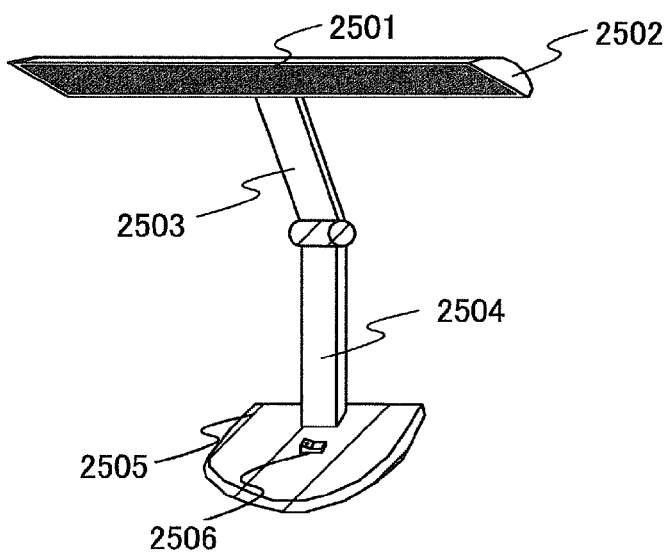

FIG. 11D illustrates a desk lamp including a lighting portion 2501, a shade 2502, an adjustable arm 2503, a support 2504, a base 2505, and a power supply switch 2506. The desk lamp is formed by using the semiconductor device of the present invention for the lighting portion 2501. Note that a lamp includes a ceiling light, a wall light, and the like in its category. By using the semiconductor device described in the above embodiment modes, reliability and mass productivity of the portable computer can be improved.

This application is based on Japanese Patent Application Serial No. 2007-339385 filed with Japan Patent Office on Dec. 28, 2007, the entire contents of which are hereby incorporated by reference.

What is claimed is:

1. A method for manufacturing a plurality of semiconductor integrated circuits, comprising the steps of:
    adding an ion to a single crystal semiconductor substrate to form an embrittlement layer at a predetermined depth from a surface of the single crystal semiconductor substrate;
    providing a supporting substrate;
    forming an insulating layer over one of the single crystal semiconductor substrate and the supporting substrate;
    performing heat treatment for generating a crack in the embrittlement layer and separating the single crystal semiconductor substrate at the embrittlement layer in a state where the single crystal semiconductor substrate and the supporting substrate overlap with each other with the insulating layer interposed therebetween so as to form a single crystal semiconductor layer over the supporting substrate from the single crystal semiconductor substrate;
    forming a plurality of semiconductor element layers including the single crystal semiconductor layer over the supporting substrate;
    reducing a thickness of the supporting substrate;
    forming a groove between the plurality of semiconductor element layers in the supporting substrate;
    forming a resin layer over the supporting substrate in which the groove is formed; and
    cutting the supporting substrate and the resin layer in the groove.

2. The method for manufacturing the plurality of semiconductor integrated circuits according to claim 1, wherein at least one of the plurality of semiconductor integrated circuits is mounted on a substrate having an insulating surface.

3. The method for manufacturing the plurality of semiconductor integrated circuits according to claim 2, wherein a glass substrate is used as the substrate having the insulating surface.

4. The method for manufacturing the plurality of semiconductor integrated circuits according to claim 1, wherein at least one of the plurality of semiconductor integrated circuits is mounted on a substrate having an insulating surface and provided with a pixel portion.

5. The method for manufacturing the plurality of semiconductor integrated circuits according to claim 4, wherein a glass substrate is used as the substrate having the insulating surface.

6. The method for manufacturing the plurality of semiconductor integrated circuits according to claim 1, wherein a width of a cut surface where the supporting substrate and the resin layer in the groove are cut is narrower than a width of the groove.

7. The method for manufacturing the plurality of semiconductor integrated circuits according to claim 1, wherein the groove is formed by a dicer.

8. A method for manufacturing a semiconductor device, wherein one of the plurality of semiconductor integrated circuits according to claim 1 is mounted on the semiconductor device by a COG (chip on glass) method.

9. A method for manufacturing a semiconductor device, wherein one of the plurality of semiconductor integrated circuits according to claim 1 is mounted on the semiconductor device by a TAB (tape automated bonding) method.

10. The method for manufacturing the plurality of semiconductor integrated circuits according to claim 1, wherein a glass substrate is used as the supporting substrate.

11. A method for manufacturing a plurality of semiconductor integrated circuits, comprising the steps of:
   adding an ion to a single crystal semiconductor substrate to form an embrittlement layer at a predetermined depth from a surface of the single crystal semiconductor substrate;
   providing a supporting substrate;
   forming an insulating layer over one the single crystal semiconductor substrate and the supporting substrate;
   performing heat treatment for generating a crack in the embrittlement layer and separating the single crystal semiconductor substrate at the embrittlement layer in a state where the single crystal semiconductor substrate and the supporting substrate overlap with each other with the insulating layer interposed therebetween so as to form a single crystal semiconductor layer over the supporting substrate from the single crystal semiconductor substrate;
   forming a plurality of semiconductor element layers including the single crystal semiconductor layer over the supporting substrate;
   reducing a thickness of the supporting substrate;
   forming a groove between the plurality of semiconductor element layers in the supporting substrate;
   forming a resin layer over the supporting substrate in which the groove is formed; and
   cutting the supporting substrate and the resin layer in the groove from the supporting substrate side.

12. The method for manufacturing the plurality of semiconductor integrated circuits according to claim 11, wherein at least one of the plurality of semiconductor integrated circuits is mounted on a substrate having an insulating surface.

13. The method for manufacturing the plurality of semiconductor integrated circuits according to claim 12, wherein a glass substrate is used as the substrate having the insulating surface.

14. The method for manufacturing the plurality of semiconductor integrated circuits according to claim 11, wherein at least one of the plurality of semiconductor integrated circuits is mounted on a substrate having an insulating surface and provided with a pixel portion.

15. The method for manufacturing the plurality of semiconductor integrated circuits according to claim 14, wherein a glass substrate is used as the substrate having the insulating surface.

16. The method for manufacturing the plurality of semiconductor integrated circuits according to claim 11, wherein a width of a cut surface where the supporting substrate and the resin layer in the groove are cut is narrower than a width of the groove.

17. The method for manufacturing the plurality of semiconductor integrated circuits according to claim 11, wherein the groove is formed by a dicer.

18. A method for manufacturing a semiconductor device, wherein one of the plurality of semiconductor integrated circuits according to claim 11 is mounted on the semiconductor device by a COG (chip on glass) method.

19. A method for manufacturing a semiconductor device, wherein one of the plurality of semiconductor integrated circuits according to claim 11 is mounted on the semiconductor device by a TAB (tape automated bonding) method.

20. The method for manufacturing the plurality of semiconductor integrated circuits according to claim 11, wherein a glass substrate is used as the supporting substrate.

* * * * *

UNITED STATES PATENT AND TRADEMARK OFFICE
CERTIFICATE OF CORRECTION

| | | Page 1 of 1 |
|---|---|---|
| PATENT NO. | : 7,897,483 B2 | |
| APPLICATION NO. | : 12/339128 | |
| DATED | : March 1, 2011 | |
| INVENTOR(S) | : Yamazaki et al. | |

It is certified that error appears in the above-identified patent and that said Letters Patent is hereby corrected as shown below:

At column 14, line 18, "50 mm" should be -- 50 nm --;

At column 45, line 25, "one the single crystal" should be -- one of the single crystal --.

Signed and Sealed this
Twenty-eighth Day of June, 2011

David J. Kappos
*Director of the United States Patent and Trademark Office*